(12) United States Patent
Seo et al.

(10) Patent No.: US 8,283,055 B2
(45) Date of Patent: *Oct. 9, 2012

(54) MATERIAL FOR LIGHT-EMITTING ELEMENT, LIGHT-EMITTING ELEMENT, LIGHT-EMITTING DEVICE, ELECTRONIC DEVICE, AND LIGHTING DEVICE

(75) Inventors: Satoshi Seo, Kanagawa (JP); Sachiko Kawakami, Kanagawa (JP); Tsunenori Suzuki, Kanagawa (JP); Kaori Ogita, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 394 days.

This patent is subject to a terminal disclaimer.

(21) Appl. No.: 12/576,031

(22) Filed: Oct. 8, 2009

(65) Prior Publication Data

US 2010/0096981 A1 Apr. 22, 2010

(30) Foreign Application Priority Data

Oct. 17, 2008 (JP) ................................ 2008-269057

(51) Int. Cl.
*H01L 51/50* (2006.01)
(52) U.S. Cl. ........ 428/690; 428/917; 313/504; 313/505; 313/506; 257/40; 257/E51.05; 257/E51.032; 564/426; 564/434; 548/440
(58) Field of Classification Search .................. 428/690, 428/917; 313/504, 505, 506; 257/40, E51.05, 257/E51.032; 548/440; 564/426, 434
See application file for complete search history.

(56) References Cited

U.S. PATENT DOCUMENTS

2005/0260442 A1 11/2005 Yu et al.
2007/0075632 A1* 4/2007 Kawakami et al. ........... 313/504
(Continued)

FOREIGN PATENT DOCUMENTS

JP 09-310066 12/1997
(Continued)

OTHER PUBLICATIONS

Office Action (U.S. Appl. No. 12/576,016; US11923/12168 (U15096)) dated Jul. 30, 2010.

(Continued)

*Primary Examiner* — Jennifer Chriss
*Assistant Examiner* — Gregory Clark
(74) *Attorney, Agent, or Firm* — Nixon Peabody LLP; Jeffrey L. Costellia

(57) ABSTRACT

A material for a light-emitting element is represented by a general formula (G1). In the general formula (G1), $Ar^1$ represents a substituted or unsubstituted aryl group having 6 to 13 carbon atoms, $Ar^2$, $Ar^3$, and $Ar^4$ each independently represent a substituted or unsubstituted arylene group having 6 to 13 carbon atoms, $R^1$ to $R^8$ independently represent hydrogen or an alkyl group having 1 to 4 carbon atoms, $R^{11}$ represents an alkyl group having 1 to 4 carbon atoms or a substituted or unsubstituted aryl group having 6 to 13 carbon atoms, and $R^{12}$ represents an alkyl group having 1 to 4 carbon atoms or a substituted or unsubstituted aryl group having 6 to 13 carbon atoms.

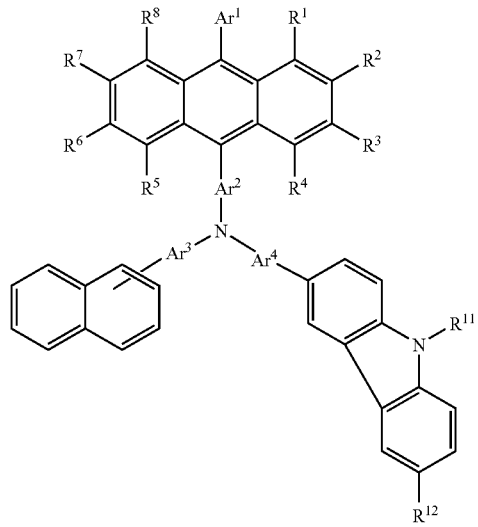

8 Claims, 40 Drawing Sheets

U.S. PATENT DOCUMENTS

| | | |
|---|---|---|
| 2007/0152572 A1 | 7/2007 | Kawakami et al. |
| 2007/0267969 A1 | 11/2007 | Nakashima et al. |
| 2008/0268284 A1 | 10/2008 | Kawakami et al. |
| 2009/0102366 A1* | 4/2009 | Ushikubo et al. ............. 313/504 |

FOREIGN PATENT DOCUMENTS

| | | |
|---|---|---|
| WO | WO 2006/104221 | 10/2006 |
| WO | WO 2007/013537 | 2/2007 |

OTHER PUBLICATIONS

Shi et al., "Anthracene Derivatives for Stable Blue-Emitting Organic Electroluminescence Devices", Appl. Phys. Lett. (Applied Physics Letters), Apr. 29, 2002, vol. 80, No. 17, pp. 3201-3203.

* cited by examiner

MATERIAL FOR LIGHT-EMITTING ELEMENT, LIGHT-EMITTING ELEMENT, LIGHT-EMITTING DEVICE, ELECTRONIC DEVICE, AND LIGHTING DEVICE

BACKGROUND OF THE INVENTION

1. Field of the Invention

The present invention relates to materials for a light-emitting element, light-emitting elements, light-emitting devices, electronic devices, and lighting devices.

2. Description of the Related Art

A light-emitting element utilizing a light-emitting organic compound has a structure in which a layer containing the organic compound is interposed between a pair of electrodes. Such a light-emitting element is characterized in that a thin and lightweight light-emitting element can be fabricated, that light is emitted by application of direct current, and that response is fast compared to liquid crystal displays, and the like. Moreover, light-emitting devices in which such light-emitting elements are arranged in matrix form, i.e., passive matrix type light-emitting devices and active matrix type light-emitting devices, are superior to conventional liquid crystal displays in terms of wide viewing angle and excellent visibility. From these reasons, the light-emitting elements are expected to be applied to next-generation flat panel displays. Note that in some cases, these light-emitting elements are referred to as electroluminescent elements or EL elements.

In a light-emitting element, electrons are injected from a cathode into a layer containing an organic compound interposed between a pair of electrodes, and at the same time, holes are injected from an anode into the layer containing the organic compound; thus, the light-emitting element is driven. Electrons injected from the cathode and holes injected from the anode recombine with each other in the layer containing the organic compound to form molecular excitons. The molecular excitons release energy in relaxing to a ground state. Energy at this time may be released as visible light, which can be observed as light emission. Excited states of organic compounds include a singlet excited state and a triplet excited state, and light can be emitted from both of the excited states.

An emission wavelength of a light-emitting element is determined by the energy gap between the ground state and the excited state formed by the recombination, i.e., a band gap. Therefore, light of any color can be obtained by appropriate selection or modification of the molecular structure involved in light emission. Thus, by using tight-emitting elements capable of emitting light of three primary colors of light: red, blue, and green, a full color light-emitting device can be manufactured.

In order to manufacture a high performance full-color light-emitting device, light-emitting elements with long lifetime, high emission efficiency, and excellent color purity which emit red, green, and blue are required. As a result of the recent development of materials, excellent properties of a light-emitting element that emits red light and a light-emitting element that emits green light have been attainable. In contrast, a light-emitting element that emits blue light with sufficient properties has not been obtained. For example, Non-Patent Document 1 reports a light-emitting element that emits blue light, which has a relatively long lifetime; however, sufficient emission efficiency and color purity are not realized.

[Reference]
[Non-Patent Document]
[Non-Patent Document 1] J. Shi et al., Applied Physics Letters, 2002, Vol. 80, No. 17, pp. 3201-3203

SUMMARY OF THE INVENTION

In view of the foregoing problems, an object of one embodiment of the present invention is to provide novel materials for a light-emitting element.

It is another object to provide a light-emitting element having long lifetime. It is still another object to provide a light-emitting element having high emission efficiency. Further, another object is to provide a light-emitting element that emits blue light with high color purity.

Another object of one embodiment of the present invention is to provide a light-emitting device, an electronic device, and a lighting device with reduced power consumption.

Through detailed studies, the inventors have found that the problems can be solved with a material for a light-emitting element which is represented by a general formula (G1) given below. Thus, one embodiment of the present invention is a material for a light-emitting element which is represented by the following general formula (G1).

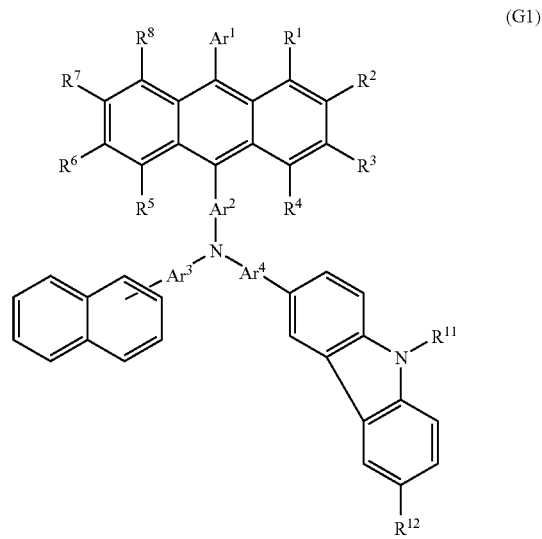

(G1)

In the above general formula (G1), $Ar^1$ represents a substituted or unsubstituted aryl group having 6 to 13 carbon atoms. When $Ar^1$ has substituents, they may be bonded to form a ring. Also, when one carbon atom of $Ar^1$ has two substituents, the substituents may be bonded to form a spiro ring. In the general formula (G1), $Ar^2$, $Ar^3$, and $Ar^4$ each independently represent a substituted or unsubstituted arylene group having 6 to 13 carbon atoms. When $Ar^2$, $Ar^3$, and $Ar^4$ each independently have substituents, the substituents may be bonded to form a ring. Also, when one carbon atom of any of $Ar^2$, $Ar^3$, and $Ar^4$ has two substituents, the substituents may be bonded to form a spiro ring. In the general formula (G1), $R^1$ to $R^8$ independently represent hydrogen or an alkyl group having 1 to 4 carbon atoms. In the general formula (G1), $R^{11}$ represents an alkyl group having 1 to 4 carbon atoms or a substituted or unsubstituted aryl group having 6 to 13 carbon atoms. When $R^{11}$ is a substituted aryl group, the substituents may be bonded to form a ring. Also, when one carbon atom of $R^{11}$ has two substituents, the substituents may be bonded to form a spiro ring. In the general formula (G1), $R^{12}$ represents an alkyl group having 1 to 4 carbon atoms or a substituted or unsubstituted aryl group having 6 to 13 carbon atoms. When $R^{12}$ is a substituted aryl group, the substituents may be bonded to form a ring. Also, when one carbon atom of $R^{12}$ has two substituents, the substituents may be bonded to form a spiro ring.

Further, one embodiment of the present invention is a material for a light-emitting element which is represented by the following general formula (G1-1).

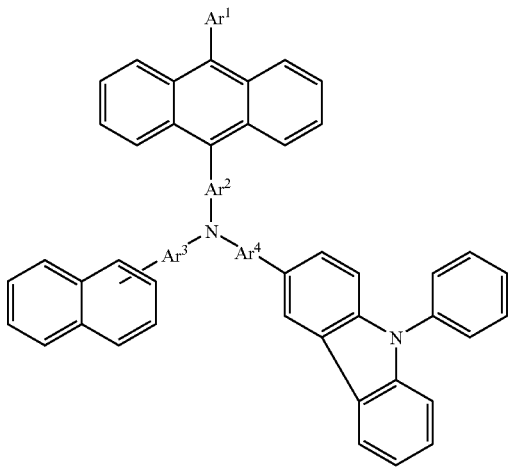

(G1-1)

In the above general formula (G1-1), $Ar^1$ represents a substituted or unsubstituted aryl group having 6 to 13 carbon atoms. When $Ar^1$ has substituents, they may be bonded to form a ring. Also, when one carbon atom of $Ar^1$ has two substituents, the substituents may be bonded to form a spiro ring. In the above general formula (G1-1), $Ar^2$, $Ar^3$, and $Ar^4$ each independently represent a para-phenylene group or a biphenyl-4,4'-diyl group.

Another embodiment of the present invention is a light-emitting element including any of the above materials for a light-emitting element. In other words, one embodiment of the present invention is a light-emitting element including any of the above materials for a light-emitting element between a pair of electrodes.

Since the above materials for a light-emitting element have high emission efficiency, it is preferred that any of the materials for a light-emitting element be used in a light-emitting layer. Thus, one embodiment of the present invention is a light-emitting element that includes a light-emitting layer between a pair of electrodes, where the light-emitting layer contains any of the above-described materials for a light-emitting element.

Since light-emitting element of the present invention which is obtained in this manner exhibits long lifetime, a light-emitting device (e.g., an image display device) in which such a light-emitting element is utilized also shows long lifetime. Thus, one embodiment of the present invention also includes a light-emitting device and an electronic device each of which uses the light-emitting element according to the present invention.

A light-emitting device of the embodiments of the present invention includes a light-emitting element including any of the above-described materials for a light-emitting element and a control circuit configured to control light emission from the light-emitting element. Note that the term light-emitting device in this specification includes a light-emitting device such as an image display device using a light-emitting element. Further, the category of the light-emitting device includes: a module including a light-emitting element to which a connector such as an anisotropic conductive film, TAB (tape automated bonding) tape, or a TCP (tape carrier package) is added; a module in which the top of a TAB tape or a TCP is provided with a printed wire board; a module in which an IC (integrated circuit) is directly mounted on a light-emitting element by a COG (chip on glass) technique; and the like. The above category also includes a light-emitting device used in a lighting device or the like.

Further, an electronic device using the light-emitting element of the embodiments of the invention in a display portion is included in the scope of the invention. Accordingly, one embodiment of the present invention is an electronic device which includes a display portion provided with the above-described light-emitting element and a control circuit which controls light emission of the light-emitting element.

The materials for a light-emitting element according to one embodiment of the present invention have high emission efficiency. Furthermore, the materials for a light-emitting element according to one embodiment of the present invention can emit blue light with high color purity. Moreover, the materials for a light-emitting element according to one embodiment of the present invention are electrochemically stable and highly tolerant to repetitive oxidation and reduction.

Also, by the use of any of the materials for a light-emitting element according to one embodiment of the present invention, a light-emitting element with high emission efficiency can be obtained. Further, a light-emitting element that emits blue light with high color purity can also be obtained. Moreover, a light-emitting element that emits blue light and has long lifetime can be obtained.

Further, by the use of the materials for a light-emitting element according to one embodiment of the present invention, a light-emitting device, an electronic device, and a lighting device with reduced power consumption can be obtained.

DETAILED DESCRIPTION OF THE INVENTION

Figure 1A:
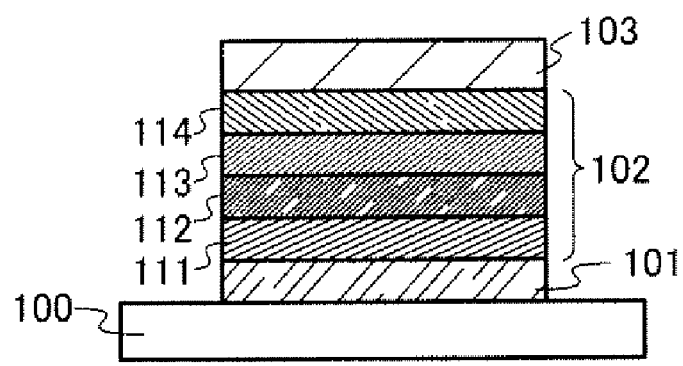
FIGS. 1A and 1B each illustrate a light-emitting element according to one embodiment of the present invention.

Hereinafter, the embodiments of the present invention will be described in detail with reference to the accompanying drawings. However, the present invention is not limited to description given below, and various changes and modifications for the modes and details thereof will be apparent to those skilled in the art unless such changes and modifications depart from the spirit and scope of the invention. Therefore, the present invention is not construed as being limited to the following description of the embodiments.

EMBODIMENT 1

In the present embodiment, explanation is given of a material for a light-emitting element according to one embodiment of the present invention.

The material for a light-emitting element which is described in the present embodiment is represented by the following general formula (G1).

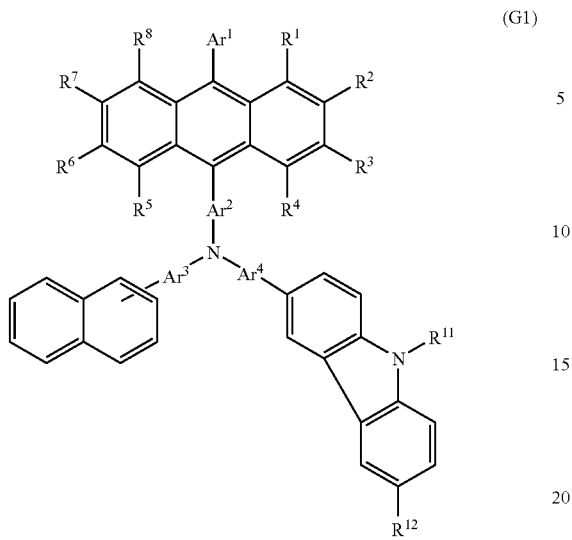

(G1)

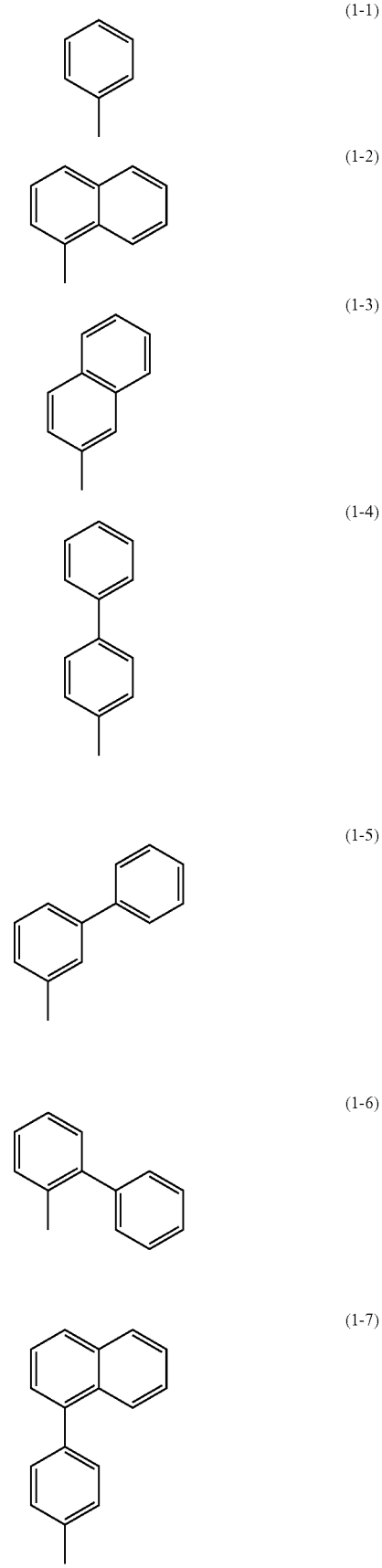

In the above general formula (G1), $Ar^1$ represents a substituted or unsubstituted aryl group having 6 to 13 carbon atoms. When $Ar^1$ has substituents, they may be bonded to form a ring. Also, when one carbon atom of $Ar^1$ has two substituents, the substituents may be bonded to form a Spiro ring. In the general formula (G1), $Ar^2$, $Ar^3$, and $Ar^4$ each independently represent a substituted or unsubstituted arylene group having 6 to 13 carbon atoms. When $Ar^2$, $Ar^3$, and $Ar^4$ each independently have substituents, the substituents may be bonded to form a ring. Also, when one carbon atom of any of $Ar^2$, $Ar^3$, and $Ar^4$ has two substituents, the substituents may be bonded to form a spiro ring. In the general formula (G1), $R^1$ to $R^8$ independently represent hydrogen or an alkyl group having 1 to 4 carbon atoms. In the general formula (G1), $R^{11}$ represents an alkyl group having 1 to 4 carbon atoms or a substituted or unsubstituted aryl group having 6 to 13 carbon atoms. When $R^{11}$ is a substituted aryl group, the substituents may be bonded to form a ring. Also, when one carbon atom of $R^{11}$ has two substituents, the substituents may be bonded to form a spiro ring. In the general formula (G1), $R^{12}$ represents an alkyl group having 1 to 4 carbon atoms or a substituted or unsubstituted aryl group having 6 to 13 carbon atoms. When $R^{12}$ is a substituted aryl group, the substituents may be bonded to form a ring. Also, when one carbon atom of $R^{12}$ has two substituents, the substituents may be bonded to form a spiro ring.

The material for a light-emitting element which is shown by the general formula (G1) in this embodiment is characterized by having a naphthyl group at a terminal of an amine skeleton. Specifically, the material for a light-emitting element is characterized by having the naphthyl group which is directly bonded to $Ar^3$. Introduction of the naphthyl group at the terminal of the amine skeleton allows the material for a light-emitting element which is represented by the general formula (G1) to efficiently emit light and exhibit high electrochemical stability.

As the aryl group designated as $Ar^1$ in the above-described general formula (G1), structures represented by structural formulae (1-1) to (1-20) are provided as examples.

(1-8) 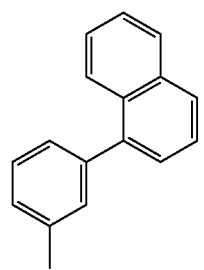
(1-9) 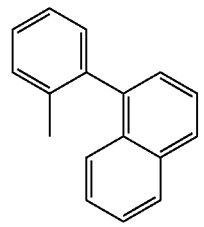
(1-10) 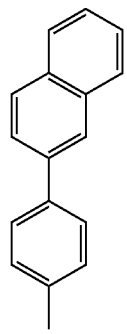
(1-11) 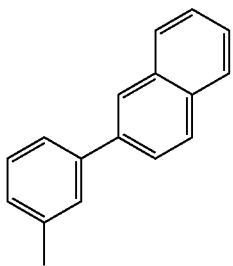
(1-12) 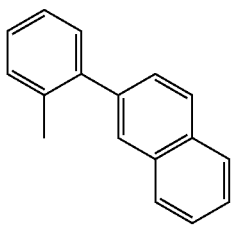
(1-13) 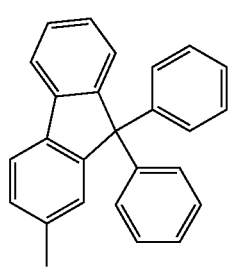
(1-14) 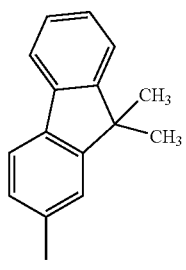
(1-15) 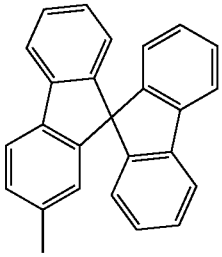
(1-16) 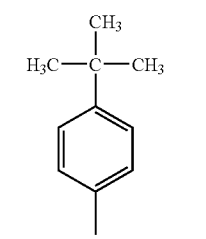
(1-17) 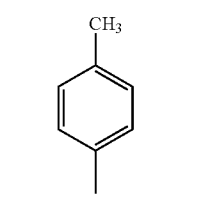
(1-18) 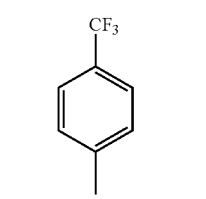
(1-19) 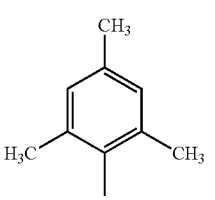
(1-20) 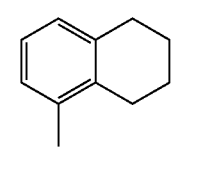
Further, as the arylene group designated as $Ar^2$, $Ar^3$, or $Ar^4$ in the above general formula (G1), there are structures represented by structural formulae (2-1) to (2-11), for example.

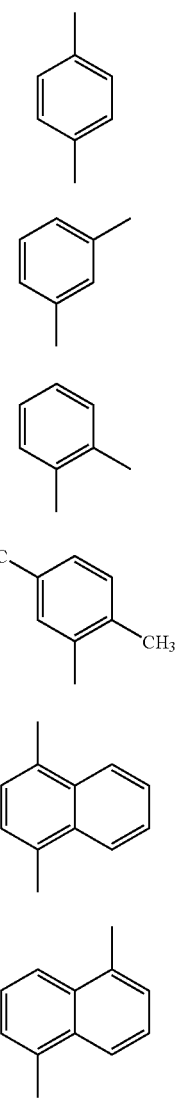
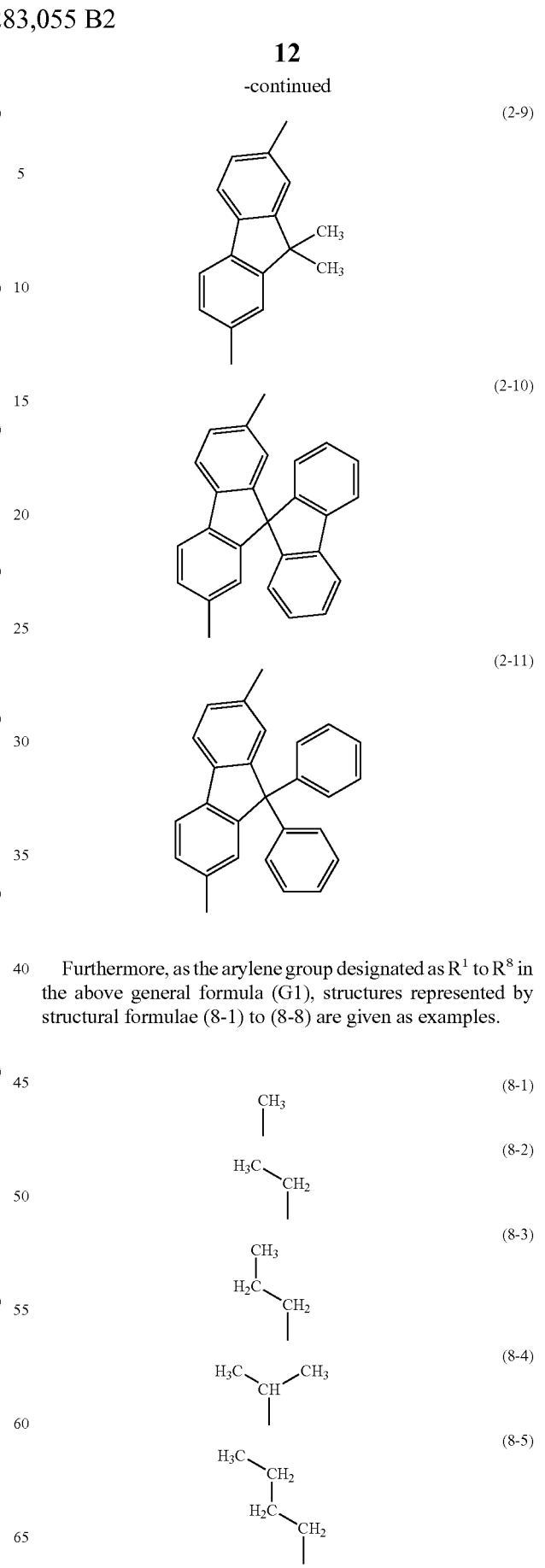
Furthermore, as the arylene group designated as $R^1$ to $R^8$ in the above general formula (G1), structures represented by structural formulae (8-1) to (8-8) are given as examples.

(8-6) 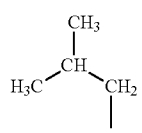
(8-7) 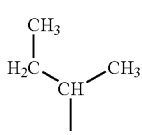
(8-8) 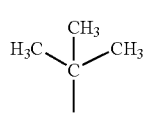
In addition, as the arylene group designated as $R^{11}$ in the above general formula (G1), there are structures represented by structural formulae (3-1) to (3-28), for example.
(3-1) 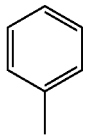
(3-2) 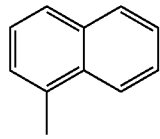
(3-3) 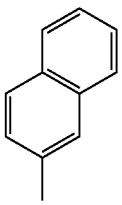
(3-4) 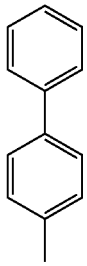
(3-5) 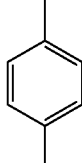
(3-6) 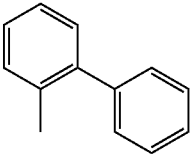
(3-7) 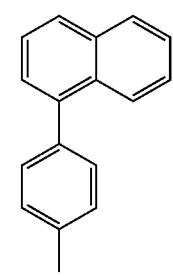
(3-8) 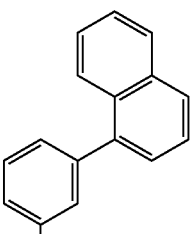
(3-9) 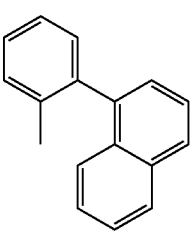
(3-10) 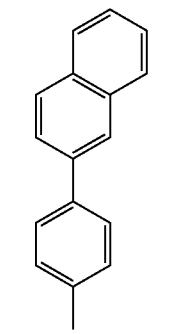
(3-11) 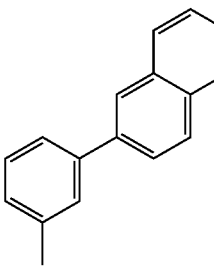

(3-12) 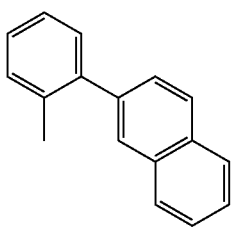
(3-13) 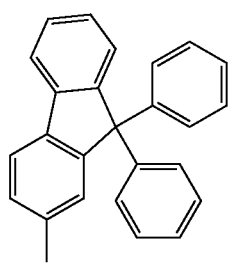
(3-14) 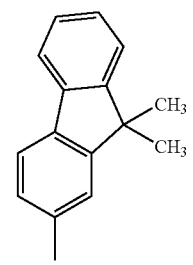
(3-15) 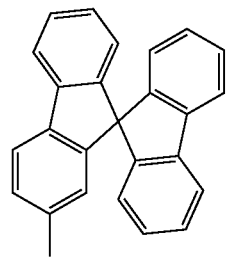
(3-16) 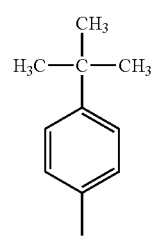
(3-17) 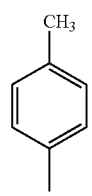
(3-18) 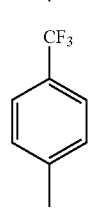
(3-19) 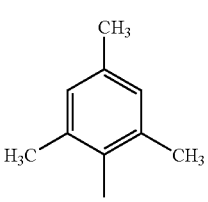
(3-20) 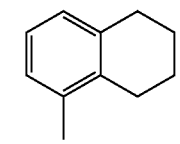
(3-21) $CH_3$
(3-22) 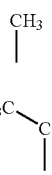
(3-23) 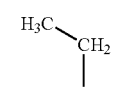
(3-24) 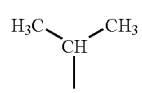
(3-25) 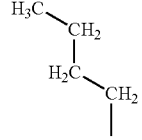
(3-26) 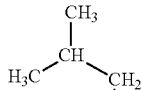
(3-27) 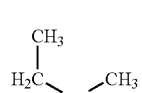
(3-28) 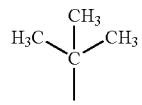
Furthermore, as the arylene group designated as $R^{12}$ in the above general formula (G1), structures represented by structural formulae (4-0) to (4-28) are given as examples.
(4-0) H

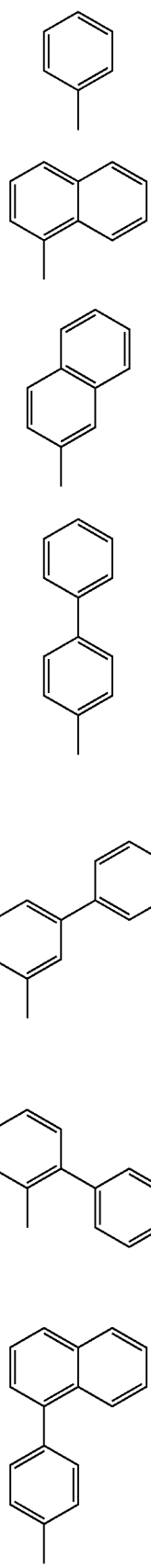
(4-1)
(4-2)
(4-3)
(4-4)
(4-5)
(4-6)
(4-7)
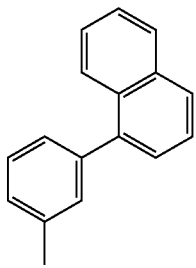
(4-8)
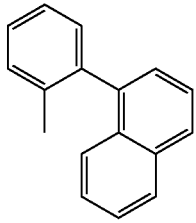
(4-9)
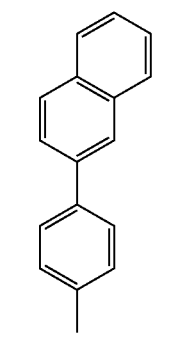
(4-10)
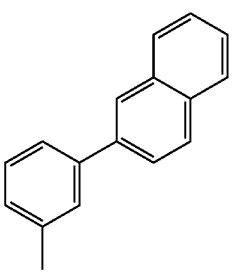
(4-11)
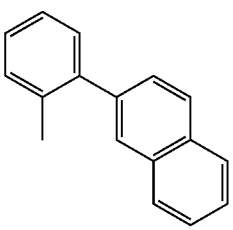
(4-12)
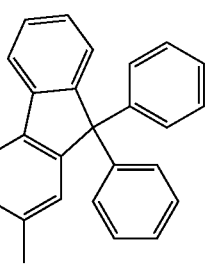
(4-13)

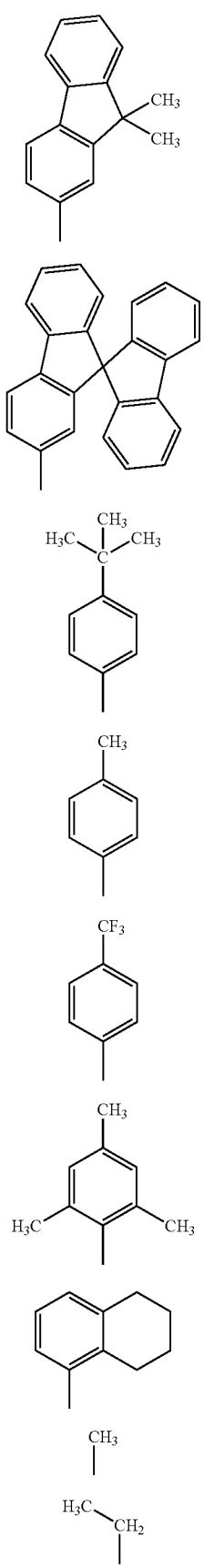

As $Ar^2$, $Ar^3$, or $Ar^4$ in the anthracene derivative represented by the above general formula (G1), a para-phenylene group is preferred to facilitate the synthesis. Further, it is preferred that $Ar^2$, $Ar^3$, or $Ar^4$ be a biphenyl-4,4'-diyl group in which two para-phenylene groups are bonded to each other be preferred to facilitate the synthesis. In other words, an anthracene derivative represented by the general formula (G1-1) is preferable.

In the above general formula (G1-1), $Ar^1$ represents a substituted or unsubstituted aryl group having 6 to 13 carbon atoms. In addition, Ar$^2$, Ar$^3$, and Ar$^4$ each independently represent a para-phenylene group or a biphenyl-4,4'-diyl group.

The material for a light-emitting element of the present embodiment which is represented by the general formula (G1) has a naphthyl group at a terminal of an amine skeleton. Accordingly, the material for a light-emitting element which is represented by the general formula (G1) efficiently emits light and is an electrochemically stable compound. Therefore, the material for a light-emitting element which is represented by the general formula (G1) can be suitably used for a light-emitting element.

Additionally, since the material for a light-emitting element which is represented by the general formula (G1) exhibits blue emission with excellent color purity, it can be suitably used for a light-emitting layer of a light-emitting element.

EMBODIMENT 2

In this embodiment, an embodiment of a light-emitting element using the material for a light-emitting element which is described in Embodiment 1 is described with reference to FIG. 1A.

A light-emitting element described in the present embodiment has a plurality of layers between a pair of electrodes. The plurality of layers are formed by stacking layers including a substance having a high carrier-inject property or a substance having a high carrier-transport property so that a light-emitting region is formed away from the electrodes, that is, so that carriers recombine in an area away from the electrodes.

In this embodiment, the light-emitting element illustrated in FIG. 1A includes a first electrode 101, a second electrode 103, and a layer 102 including an organic compound which is formed between the first electrode 101 and the second electrode 103. Note that in this embodiment, explanation is given below assuming that the first electrode 101 serves as an anode and the second electrode 103 serves as a cathode. In other words, it is assumed hereinafter that light emission can be obtained when a voltage is applied to the first electrode 101 and the second electrode 103 so that the potential of the first electrode 101 is higher than that of the second electrode 103.

A substrate 100 is used as a support of the light-emitting element. As the substrate 100, for example, a glass substrate, a plastic substrate, or the like can be used. Note that the substrate 100 may alternatively be formed using any other material as long as the material can support the light-emitting element during the manufacturing process.

It is preferred that the first electrode 101 be formed using any of metals, alloys, and conductive compounds with a high work function (specifically, 4.0 eV or higher), a mixture thereof, or the like. Specifically, indium oxide-tin oxide (ITO: indium tin oxide), indium oxide-tin oxide containing silicon or silicon oxide, indium oxide-zinc oxide (IZO: indium zinc oxide), indium oxide containing tungsten oxide and zinc oxide (IWZO), or the like can be used. These conductive metal oxide films are generally formed by sputtering; however, the films may be formed by applying a sol-gel method. For example, a film of indium oxide-zinc oxide (IZO) can be formed by a sputtering method using indium oxide, to which zinc oxide is added at 1 to 20 wt %, as a target. A film of indium oxide containing tungsten oxide and zinc oxide (IWZO) can be formed by a sputtering method using a target in which tungsten oxide and zinc oxide are mixed at 0.5 to 5 wt % and 0.1 to 1 wt %, respectively, with indium oxide. In addition, gold (Au), platinum (Pt), nickel (Ni), tungsten (W), chromium (Cr), molybdenum (Mo), iron (Fe), cobalt (Co), copper (Cu), palladium (Pd), a nitride of a metal (such as titanium nitride), and the like are given.

When a layer including a composite material which is described later is used as a layer that is in contact with the first electrode 101, the first electrode 101 can be formed using any of a variety of metals, an alloy, a conductive compound, a mixture of them, or the like regardless of their work functions. For example, aluminum (Al), silver (Ag), an aluminum alloy (e.g., AlSi), or the like can be used. Further, a metal of an element belonging to Group 1 or Group 2 in the periodic table, which is a low-work function material, that is, an alkali metal such as lithium (Li) or cesium (Cs), an alkaline earth metal such as magnesium (Mg), calcium (Ca), or strontium (Sr), an alloy including these metals (such as an MgAg alloy or an AlLi alloy), a rare earth metal such as europium (Eu) or ytterbium (Yb), an alloy including such rare earth metals, or the like can be used. A film of an alkali metal, an alkaline earth metal, or an alloy including these metals can be formed by a vacuum evaporation method. In addition, an alloy including an alkali metal or an alkaline earth metal can be formed by a sputtering method. Further, a silver paste or the like can be applied by an inkjet method to form the first electrode 101.

There is no particular limitation on the stack structure of the layer 102 including an organic compound. The layer 102 including an organic compound may have a structure in which one or more of layers including a substance having a high electron-transport property, a substance having a high hole-transport property, a substance having a high electron-inject property, a substance having a high hole-inject property, a bipolar substance (a substance having a high electron-transport property and a high hole-transport property), etc. is combined with the light-emitting layer described in this embodiment, as appropriate. For example, it is possible to combine a hole-inject layer, a hole-transport layer, an electron-transport layer, an electron-inject layer, and the like with the light-emitting layer described in this embodiment to form the layer 102 including an organic compound. In the present embodiment, explanation is given of a structure in which the layer 102 including an organic compound comprises a hole-inject layer 111, a hole-transport layer 112, a light-emitting layer 113, and an electron-transport layer 114 stacked in that order over the first electrode 101. Specific materials used to form each of the layers will be given below.

The hole-inject layer 111 is a layer including a substance having a high hole-inject property. Molybdenum oxide, vanadium oxide, ruthenium oxide, tungsten oxide, manganese oxide, and the like can be used for the hole-inject layer. Alternatively, the hole-inject layer 111 can be formed using any of the following materials: phthalocyanine based compounds such as phthalocyanine (abbreviated to H$_2$PC) and copper phthalocyanine (abbreviated to CuPe); aromatic amine compounds such as 4,4'-bis[N-(4-diphenylaminophenyl)-N-phenylamino]biphenyl (abbreviated to DPAB) and 4,4'-bis(N-{4-[N-(3-methylphenyl)-N-phenylamino]phenyl}-N-phenylamino)biphenyl (abbreviated to DNTPD); high molecular compounds such as poly(ethylenedioxythiophene)/poly(styrenesulfonic acid) (abbreviated to PEDOT/PSS); and the like.

As a further alternative, a composite material formed by mixing an acceptor substance into a substance having a high hole-transport property can also be used for the hole-inject layer 111. Note that, by using a composite containing the substance having a high hole-transport property and an acceptor substance, a material used to form an electrode may be selected regardless of its work function. That is, not only a high-work function material, but also a low-work function material can be used for the first electrode 101. As the acceptor substance, 7,7,8,8-tetracyano-2,3,5,6-tetrafluoroquinodimethane (abbreviated to $F_4$-TCNQ), chloranil, and the like can be given. In addition, transition metal oxides are given. Furthermore, oxides of metals of Group 4 to Group 8 in the periodic table can be given. Specifically, vanadium oxide, niobium oxide, tantalum oxide, chromium oxide, molybdenum oxide, tungsten oxide, manganese oxide, and rhenium oxide are preferable because of a high electron accepting property. Among these metal oxides, molybdenum oxide is especially preferable since it is stable in air and its hygroscopic property is low so that it can be easily treated.

As a substance having a high hole-transport property which is used for the composite material, any of a variety of compounds such as aromatic amine compounds, carbazole derivatives, aromatic hydrocarbons, and high molecular compounds (such as oligomers, dendrimers, or polymers) can be used. Note that the substance having a hole mobility of $10^{-6}$ cm$^2$/Vs or more is preferably used as the substance having a high hole-transport property which is used for the composite material. However, any other substance may be used as long as it has a hole-transport property higher than an electron-transport property. The organic compound that can be used for the composite material is specifically given below.

Examples of the aromatic amine compounds that can be used for the composite material include 4,4'-bis[N-(1-naphthyl)-N-phenylamino]biphenyl (abbreviated to NPB), N,N'-bis(4-methylphenyl)(p-tolyl)-N,N'-diphenyl-p-phenylenediamine (abbreviated to DTDPPA), 4,4'-bis[N-(4-diphenylaminophenyl)-N-phenylamino]biphenyl (abbreviated to DPAB), 4,4'-bis(N-{4-[N,N-bis(3-methylphenyl)amino]phenyl}-N-phenylamino)biphenyl (abbreviated to DNTPD), 1,3,5-tris[N-(4-diphenylaminophenyl)-N-phenylamino]benzene (abbreviated to DPA3B), and the like.

Specific examples of the carbazole derivatives that can be used for the composite material include 3-[N-(9-phenylcarbazol-3-yl)-N-phenylamino]-9-phenylcarbazole (abbreviated to PCzPCA1), 3,6-bis[N-(9-phenylcarbazol-3-yl)-N-phenylamino]-9-phenylcarbazole (abbreviated to PCzPCA2), 3-[N-(1-naphthyl)-N-(9-phenylcarbazol-3-yl)amino]-9-phenylcarbazole (abbreviated to PCzPCN1), 4,4'-di(N-carbazolyl)biphenyl (abbreviated to CBP), 1,3,5-tris[4-(N-carbazolyl)phenyl]benzene (abbreviated to TCPB), 9-[4-(10-phenyl-9-anthracenyl)phenyl]-9H-carbazole (abbreviated to CzPA), 1,4-bis[4-(N-carbazolyl)phenyl]-2,3,5,6-tetraphenylbenzene, and the like.

As the aromatic hydrocarbons which can be used for the composite material, the following can be given, for example: 2-tert-butyl-9,10-di(2-naphthyl)anthracene (abbreviated to t-BuDNA); 2-tert-butyl-9,10-di(1-naphthyl)anthracene, 9,10-bis(3,5-diphenylphenyl)anthracene (abbreviated to DPPA); 2-tert-butyl-9,10-bis(4-phenylphenyl)anthracene (abbreviated to t-BuDBA); 9,10-di(2-naphthyl)anthracene (abbreviated to DNA); 9,10-diphenylanthracene (abbreviated to DPAnth); 2-tert-butylanthracene (abbreviated to t-BuAnth); 9,10-bis(4-methyl-1-naphthyl)anthracene (abbreviated to DMNA); 9,10-bis[2-(1-naphthyl)phenyl]-2-tert-butyl-anthracene; 9,10-bis [2-(1-naphthyl)phenyl]anthracene; 2,3,6,7-tetramethyl-9,10-di(2-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like. In addition, pentacene, coronene, or the like can also be used. In particular, the aromatic hydrocarbon which has a hole mobility of $1\times10^{-6}$ cm$^2$/Vs or higher and which has 14 to 42 carbon atoms is particularly preferable.

The aromatic hydrocarbons that can be used for the composite material may have a vinyl skeleton. As an aromatic hydrocarbon having a vinyl group, for example, 4,4'-bis(2,2-diphenylvinyl)biphenyl (abbreviated to DPVBi), 9,10-bis[4-(2,2-diphenylvinyl)phenyl]anthracene (abbreviated to DPVPA), and the like are given.

For the hole-inject layer 111, a high molecular compound (e.g., an oligomer, a dendrimer, or a polymer) can be used. For example, the following high molecular compounds can be used: poly(N-vinylcarbazole) (abbreviated to PVK); poly(4-vinyltriphenylamine) (abbreviated to PVTPA); poly[N-(4-{N'-[4-(4-diphenylamino)phenyl]phenyl-N'-phenylamino}phenyl)methacrylamide] (abbreviated to PTPDMA); poly[N,N'-bis(4-butylphenyl)-N,N'-bis(phenyl)benzidine] (abbreviated to Poly-TPD); and the like. In addition, high molecular compounds doped with acid such as poly(3,4-ethylenedioxythiophene)/poly(styrenesulfonic acid) (PEDOT/PSS), polyaniline/poly(styrenesulfonic acid) (PAni/PSS), and the like can be used.

Note that the hole-inject layer 111 can be formed using a composite material of the above-described high molecular compound, such as PVK, PVTPA, PTPDMA, or Poly-TPD, and the above-described acceptor substance.

The hole-transport layer 112 is a layer that contains a substance having a high hole-transport property. As the substance having a high hole-transport property, for example, an aromatic amine compound such as 4,4'-bis[N-(1-naphthyl)-N-phenylamino]biphenyl (abbreviated to NPB), N,N'-bis(3-methylphenyl)-N,N'-diphenyl-[1,1-biphenyl]-4,4'-diamine (abbreviated to TPD), 4,4',4''-tris(N,N-diphenylamino)triphenylamine (abbreviated to TDATA), 4,4',4''-tris[N-(3-methylphenyl)-N-phenylamino]triphenylamine (abbreviated to MTDATA), or 4,4'-bis[N-(spiro-9,9'-bifluoren-2-yl)-N-phenylamino]biphenyl (abbreviated to BSPB) can be used. The materials described here are mainly materials having hole mobility of $10^{-6}$ cm$^2$/Vs or more. However, any other substance may be used as long as it has a hole-transport property higher than an electron-transport property. Note that the layer containing a substance having a high hole-transport property is not limited to a single layer, and two or more layers containing the aforementioned substances may be stacked.

For the hole-transport layer 112, a high molecular compound such as PVK, PVTPA, PTPDMA, or Poly-TPD can be used alternatively.

The light-emitting layer 113 is a layer including a substance having a high light-emitting property. In the light-emitting element of this embodiment, the light-emitting layer 113 is formed using any of the materials for a light-emitting element which are described in Embodiment 1. The materials for a light-emitting element which are described in Embodiment 1 are suitable for the use in a light-emitting element as a substance having a high light-emitting property because they exhibit high emission efficiency.

The electron-transport layer 114 is a layer including a substance having a high electron-transport property. For example, it is possible to employ a metal complex or the like having a quinoline or benzoquinoline skeleton, such as tris (8-quinolinolato)aluminum (abbreviated to Alq), tris(4-methyl-8-quinolinolato)aluminum (abbreviated to Almq$_3$), bis (10-hydroxybenzo[h]quinolinato)beryllium (abbreviated to BeBq$_2$), or bis(2-methyl-8-quinolinolato)(4-phenylphenolato)aluminum (abbreviated to BAlq) for the electron-transport layer 114. Alternatively, a metal complex having an oxazole-based or thiazole-based ligand, such as bis[2-(2-hydroxyphenyl)benzoxazolato]zinc (abbreviated to Zn(BOX)$_2$)

or bis[2-(2-hydroxyphenyl)benzothiazolato]zinc (abbreviated to Zn(BTZ)$_2$) can be used. Besides the metal complexes, 2-(4-biphenylyl)-5-(4-tert-butylphenyl)-1,3,4-oxadiazole (abbreviated to PBD), 1,3-bis[5-(p-tert-butylphenyl)-1,3,4-oxadiazole-2-yl]benzene (abbreviated to OXD-7), 3-(4-biphenylyl)-4-phenyl-5-(4-tert-butylphenyl)-1,2,4-triazole (abbreviated to TAZ), bathophenanthroline (abbreviated to BPhen), bathocuproine (abbreviated to BCP), or the like can also be used. The substances described here are mainly substances having electron mobility of $10^{-6}$ cm$^2$/Vs or more. Note that a substance other than the above substances may be used as long as it has a higher electron-transport property than a hole-transport property. Further, the electron-transport layer is not limited to a single layer and may be a stack of two or more layers containing the aforementioned substances.

For the electron-transport layer 114, a high molecular compound can be used. For example, poly[(9,9-dihexylfluorene-2,7-diyl)-co-(pyridine-3,5-diyl)] (abbreviated to PF—Py), poly[(9,9-dioctylfluorene-2,7-diyl)-co-(2,2'-bipyridine-6,6'-diyl)] (abbreviated to PF—BPy), or the like can be used.

An electron-inject layer may be provided between the electron-transport layer 114 and the second electrode 103. The electron-inject layer can be formed using an alkali metal compound or an alkaline earth metal compound such as lithium fluoride (LiF), cesium fluoride (CsF), or calcium fluoride (CaF$_2$). Furthermore, a layer, in which a substance having an electron-transport property is combined with an alkali metal or an alkaline earth metal, can be employed. For instance, a layer comprising Alq to which magnesium (Mg) is added can be used. It is more preferable to use the layer, in which a substance having an electron-transport property is combined with an alkali metal or an alkaline earth metal, as the electron-inject layer, in which case electron injection from the second electrode 103 efficiently proceeds.

The second electrode 103 can be formed using a metal, an alloy, or a conductive compound with a low work function (specifically, 3.8 eV or lower), a mixture of them, or the like. Specific examples of such cathode materials include elements belonging to Group 1 and 2 of the periodic table, i.e., alkali metals such as lithium (Li) and cesium (Cs) and alkaline earth metals such as magnesium (Mg), calcium (Ca), and strontium (Sr); alloys of them (e.g., MgAg and AlLi); rare earth metals such as europium (Eu) and ytterbium (Yb), alloys of them; and the like. A film of an alkali metal, an alkaline earth metal, or an alloy including these metals can be formed by a vacuum evaporation method. In addition, an alloy including an alkali metal or an alkaline earth metal can be formed by a sputtering method. Further, a silver paste or the like can be applied by an inkjet method to form the second electrode 103.

When the electron-inject layer is provided between the second electrode 103 and the electron-transport layer 114, any of a variety of conductive materials such as Al, Ag, ITO, and indium oxide-tin oxide containing silicon or silicon oxide can be used for the second electrode 103 regardless of its work function. Films of such conductive materials can be formed by a sputtering method, an inkjet method, a spin coating method, or the like.

In the light-emitting element shown in this embodiment which has the above-mentioned structure, a current flows by application of a voltage between the first electrode 101 and the second electrode 103. Then, holes and electrons recombine in the light-emitting layer 113 that is a layer containing a substance having a high light-emitting property. That is, the light-emitting element has a structure in which a light-emitting region is formed in the light-emitting layer 113.

Light is extracted outside through one or both of the first electrode 101 and the second electrode 103. Thus, one or both of the first electrode 101 and the second electrode 103 are light-transmitting electrodes. When only the first electrode 101 is a light-transmitting electrode, light is extracted from the substrate 100 side through the first electrode 101. In contrast, when only the second electrode 103 is a light-transmitting electrode, light is extracted from a side opposite to the substrate 100 side through the second electrode 103. When both the first electrode 101 and the second electrode 103 are light-transmitting electrodes, light is extracted from both the substrate 100 side and the side opposite to the substrate 100 side through the first electrode 101 and the second electrode 103.

Although FIG. 1A shows a structure in which the first electrode 101 that functions as an anode is provided on the substrate 100 side, the second electrode 103 that functions as a cathode may be provided on the substrate 100 side.

Any of a variety of methods can be employed for forming the layer 102 including an organic compound regardless of whether it is a dry process or a wet process. Moreover, a different forming method may be used for each electrode or each layer. A vacuum evaporation method, a sputtering method, or the like can be employed as a dry process. An inkjet method, a spin-coating method, or the like can be employed as a wet process.

Further, the electrodes may be formed by a sol-gel method, which is a wet process, or may also be formed by a wet process using a paste of a metal material. Furthermore, the electrode may be formed by a dry process such as a sputtering method or a vacuum evaporation method.

Hereinafter, specific methods of forming a light-emitting element are described. When the light-emitting element shown in this embodiment is applied to a display device and a light-emitting layer for each color is formed, the light-emitting layer is preferably formed by a wet process. The use of a wet process such as an inkjet method makes it easier to form a light-emitting layer for each color even if a large substrate is employed, whereby productivity is improved.

For example, the structure described in this embodiment may be formed in the following manner: the first electrode 101 is formed by a sputtering method which is a dry process; the hole-inject layer 111 is formed by an inkjet method or a spin coating method which is a wet process; the hole-transport layer 112 is formed by a vacuum evaporation method which is a dry process; the light-emitting layer 113 is formed by an inkjet method which is a wet process; the electron-transport layer 114 is formed by a co-deposition method which is a dry process; and the second electrode 103 is formed by an inkjet method or a spin coating method which is a wet process. The structure may alternatively be formed in the following manner: the first electrode 101 is formed by an inkjet method which is a wet process; the hole-inject layer 111 is formed by a vacuum evaporation method which is a dry process; the hole-transport layer 112 is formed by an inkjet method or a spin coating method which is a wet process; the light-emitting layer 113 is formed by an inkjet method which is a wet process; the electron-transport layer 114 is formed by an inkjet method or a spin coating method which is a wet process; and the second electrode 103 is formed by an inkjet method or a spin coating method which is a wet process. The method for forming the light-emitting element is not particularly limited to the above methods, and a wet process and a dry process may be combined as appropriate.

Another example of the formation may be as follows: the first electrode 101 is formed by a sputtering method which is a dry process; the hole-inject layer 111 and the hole-transport layer 112 is formed by an inkjet method or a spin coating method which is a wet process; the light-emitting layer 113 is formed by an inkjet method which is a wet process; the electron-transport layer 114 is formed by a vacuum evaporation method which is a dry process; and the second electrode 103 is formed by a vacuum evaporation method which is a dry process. That is, it is possible to form the hole-inject layer 111 to the light-emitting layer 113 by wet processes and to form the electron-transport layer 114 to the second electrode 103 by dry processes over the substrate 100 over which the first electrode 101 is formed to have a desired shape. Such a method make it possible to form the hole-inject layer 111 to the light-emitting layer 113 at atmospheric pressure, and easier to form the light-emitting layer 113 for each color. In addition, the electron-transport layer 114 to the second electrode 103 can be formed in vacuum consistently. Therefore, the processes can be simplified, and productivity can be improved.

When the light-emitting layer 113 is formed by a wet process, a liquid composition in which any of the materials for a light-emitting element which are described in Embodiment 1 are dissolved in a solvent can be used. In this case, the liquid composition comprising any of the materials for a light-emitting element which are described in Embodiment 1 and a solution is applied to a region where the light-emitting layer 113 is to be formed, the solvent is then removed by heat treatment or the like, and the material for a light-emitting element which is described in Embodiment 1 is solidified, whereby a thin film of the light-emitting layer 113 is formed.

As to the light-emitting element with the above-mentioned structure shown in the present embodiment, a current flows when a potential difference is given between the first electrode 101 and the second electrode 103, and then holes and electrons recombine in the light-emitting layer 113, which is the layer including a substance having a high light-emitting property, resulting in emission of light. That is, the light-emitting element has a structure in which a light-emitting region is formed in the light-emitting layer 113.

Note that a structure of the layers provided between the first electrode 101 and the second electrode 103 is not limited to the structure described above. Any other structure can be employed as long as a light-emitting region in which holes and electrons recombine is provided away from the first electrode 101 and the second electrode 103 in order to prevent quenching of emitted light which is caused by the approach of the light-emitting region to a metal.

The materials for a light-emitting element which are described in Embodiment 1 have high emission efficiency; therefore, as described in this embodiment, they can be used for a light-emitting layer without addition of any other light-emitting substance. Furthermore, since the materials for a light-emitting element which are described in Embodiment 1 have high emission efficiency, a light-emitting element with high emission efficiency can be obtained.

Since the materials for a light-emitting element which are described in Embodiment 1 emit blue light with excellent color purity, a light-emitting element which exhibits blue light emission with excellent color purity can be obtained.

Additionally, since the materials for a light-emitting element which are described in Embodiment 1 are able to emit blue light with excellent color purity at high efficiency, a light-emitting element which can emit blue light with high luminous efficiency can be obtained.

Furthermore, since the materials for a light-emitting element which are described in Embodiment 1 are electrochemically stable, a light-emitting element that emits blue light which has long lifetime can be obtained.

Further, since a light-emitting element that uses any of the materials for a light-emitting element which are described in Embodiment 1 can emit blue light at high efficiency, the light-emitting element is suitable for use in a full-color display. Moreover, the light-emitting element can emit blue light for a long period of time; therefore, the light-emitting element is suitable for use in a full-color display. In particular, light-emitting elements that emit blue light are less developed in terms of lifetime and efficiency than light-emitting elements that emit green light and light-emitting elements that emit red light; therefore, high performance light-emitting elements that emit blue light have been desired. A light-emitting element using any of the materials for a light-emitting element which are described in Embodiment 1 are capable of emitting blue light at high efficiency and exhibiting long lifetime and thus is, suitable for a full-color display.

EMBODIMENT 3

In this embodiment, description is made of a light-emitting element having a different structure from that described in Embodiment 2.

The light-emitting layer 113 shown in Embodiment 2 is formed by dispersing the material for a light-emitting element which is described in Embodiment 1 into another substance, whereby light emission can be obtained from the material for a light-emitting element which is described in Embodiment 1. Since the material for a light-emitting element which is described in Embodiment 1 emits blue light, a light-emitting element that emits blue light can be provided.

As the substance in which the material for a light-emitting element which is described in Embodiment 1 is dispersed, it is possible to use various materials such as 4,4'-bis(N-carbazolyl)-biphenyl (abbreviated to CBP), 2,2',2"-(1,3,5-benzenetri-yl)-tris[1-phenyl-1H-benzimidazole] (abbreviated to TPBI), 9,10-di(2-naphthyl)anthracene (abbreviated to DNA), 2-tert-butyl-9,10-di(2-naphthyl)anthracene (abbreviated to t-BuDNA), 9-[4-(N-carbazolyl)phenyl]-10-phenylanthracene (abbreviated to CzPA), and the like in addition to the substance having a high hole-transport property and the substance having a high electron-transport property which are given in Embodiment 2. Alternatively, as the substance in which the material for a light-emitting element which is described in Embodiment 1 is dispersed, a high molecular compound can be used. Examples thereof include poly(N-vinylcarbazole) (abbreviated to PVK), poly(4-vinyltriphenylamine) (abbreviated to PVTPA), poly[N-(4-{N'-[4-(4-diphenylamino)phenyl]phenyl-N'-phenylamino}phenyl) methacrylamide] (abbreviated to PTPDMA), poly[N,N'-bis(4-butylphenyl)-N,N'-bis(phenyl)benzidine] (abbreviated to Poly-TPD), poly[(9,9-dihexylfluorene-2,7-diyl)-co-(pyridine-3,5-diyl)] (abbreviated to PF-Py), poly[(9,9-dioctylfluorene-2,7-diyl)-co-(2,2'-bipyridine-6,6'-diyl)] (abbreviated to PF—BPy), and the like.

Since the materials for a light-emitting element which are described in Embodiment 1 have high emission efficiency, by using any of these materials, a light-emitting element with high emission efficiency can be obtained.

Since the materials for a light-emitting element which are described in Embodiment 1 emit blue light with high color purity, a light-emitting element that emits blue light with high color purity can be obtained.

Furthermore, the materials for a light-emitting element which are described in Embodiment 1 emit light at high efficiency, and accordingly a light-emitting element that can emit blue light with high luminous efficiency can be obtained.

Moreover, by the use of any of the materials for a light-emitting element which are described in Embodiment 1, a light-emitting element with long lifetime can be obtained.

Further, since the light-emitting element in which any of the materials for a light-emitting element which are described in Embodiment 1 is used can emit blue light with high color purity at high efficiency, this light-emitting element is suitable for use in a full-color display. Besides, since such a light-emitting element can emit blue light and exhibit long lifetime, the light-emitting element is suitable for the use in a full-color display.

Note that, regarding the layers other than the light-emitting layer 113, the structure described in Embodiment 2 can be used as appropriate.

EMBODIMENT 4

In this embodiment, description is made of a light-emitting element having a different structure from those described in Embodiments 2 and 3 with reference to FIG. 1A.

The light-emitting layer 113 shown in Embodiment 2 is formed by dispersing a light-emitting substance in the material for a light-emitting element which is described in Embodiment 1, whereby light emission from the light-emitting substance can be obtained.

When the material for a light-emitting element which is described in Embodiment 1 is used as a material in which another light-emitting substance is dispersed, the emission color resulting from the light-emitting substance can be obtained. Alternatively, light with mixed colors resulting from the material for a light-emitting element which is described in Embodiment 1 and from the light-emitting substance dispersed in the material for a light-emitting element which is described in Embodiment 1 can be emitted.

Here, a variety of materials can be used as the light-emitting substance dispersed in the material for a light-emitting element which is described in Embodiment 1. In specific, the following fluorescent substances which emit fluorescence can be used: N,N''-diphenylquinacridone (abbreviated to DPQd), coumarin 6, coumarin 545T, 4-(dicyanomethylene)-2-methyl-6-(p-dimethylaminostyryl)-4H-pyran (abbreviated to DCM1), 4-(dicyanomethylene)-2-methyl-6-(julolidin-4-yl-vinyl)-4H-pyran (abbreviated to DCM2), N,N''-dimethylquinacridone (abbreviated to DMQd), {2-(1,1-dimethylethyl)-6-[2-(2,3,6,7-tetrahydro-1,1,7,7-tetramethyl-1H,5H-benzo[ij]quinolizin-9-yl)ethenyl]-4H-pyran-4-ylidene}propanedinitrile (abbreviated to DCJTB), 5,12-diphenyltetracene (abbreviated to DPT), N,9-diphenyl-N-[4-(10-phenyl-9-anthryl)phenyl]-9H-carbazol-3-amine (abbreviated to PCAPA), N,N''-(2-tert-butyl-9,10-anthracenediyldi-4,1-phenylene)bis[N,N',N'-triphenyl-1,4-benzenediamine] (abbreviated to DPABPA), N,N'-diphenyl-N,N'-bis(9-phenyl-9H-carbazol-3-yl)stilbene-4,4'-diamine (abbreviated to PCA2S), 2,5,8,11-tetra(tert-butyl)perylene (abbreviated to TBP), perylene, rubrene, 1,3,6,8-tetraphenylpyrene, and the like. Further, phosphorescent substances which emit phosphorescence, such as (acetylacetonato)bis[2,3-bis(4-fluorophenyl)quinoxalinato]iridium(III) (abbreviated to Ir(Fdpq)$_2$(acac)), and 2,3,7,8,12,13,17,18-octaethyl-21H,23H-porphyrinplatinum(II) (abbreviated to PtOEP), can be used.

Note that, regarding the layers other than the light-emitting layer 113, the structure shown in Embodiment 2 can be used as appropriate.

EMBODIMENT 5

Figure 1B:
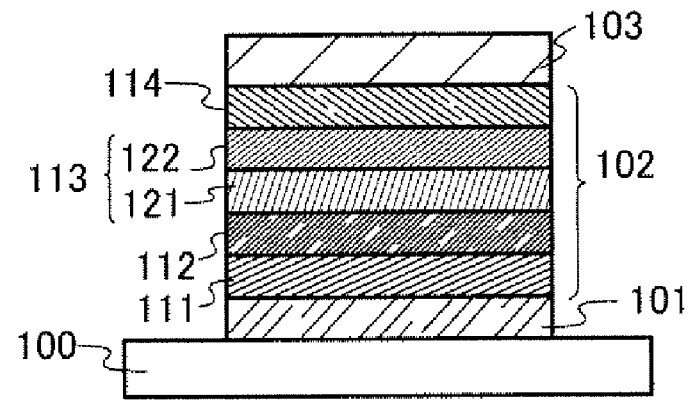

In this embodiment, description is provided of a light-emitting element having a structure different from those described in Embodiments 2 to 4, with reference to FIG. 1B.

The light-emitting element of this embodiment include a first layer 121 and a second layer 122 which are provided in the light-emitting layer 113 of the light-emitting element shown in Embodiment 2.

The light-emitting layer 113 is a layer that includes a substance having a high light-emitting property. In the light-emitting element shown in the present embodiment, the light-emitting layer 113 has the first layer 121 and the second layer 122. The first layer 121 includes a first organic compound and an organic compound having a hole-transport property, and the second layer 122 includes a second organic compound and an organic compound having an electron-transport property. The first layer 121 is provided in contact with the first electrode side of the second layer 122, that is, in contact with the anode side.

Each of the first organic compound and the second organic compound is a substance having a high light-emitting property. In the light-emitting element shown in this embodiment, the first organic compound or the second organic compound includes any of the materials for a light-emitting element which are described in Embodiment 1. Since the materials for a light-emitting element which are described in Embodiment 1 emit blue light with high color purity, the materials for a light-emitting element are each suitable for use as a substance having a high light-emitting property in the light-emitting element of this embodiment. Note that the first organic compound and the second organic compound may be the same or different from each another.

When any of the materials for a light-emitting clement which are described in Embodiment 1 is used as one of the first organic compound and the second organic compound, as the other one thereof, it is possible to use substances that emit blue light, such as 4-(9H-carbazol-9-yl)-4'-(10-phenyl-9-anthryl)triphenylamine (abbreviated to YGAPA), 4,4'(2-tert-butylanthracen-9,10-diyl)bis{N-[4-(9H-carbazol-9-yl)phenyl]-N-phenylaniline} (abbreviated to YGABPA), N,9-diphenyl-N-[4-(10-phenyl-9-anthryl)phenyl]-9H-carbazol-3-amine (abbreviated to PCAPA), N,N''-(2-tert-butylanthracene-9,10-diylidi-4,1-phenylene)bis[N,N',N'-triphenyl-1,4-phenylenediamine] (abbreviated to DPABPA), N,N'-bis[4-(9H-carbazol-9-yl)phenyl]-N,N-diphenylstilbene-4,4'-diamine (abbreviated to YGA2S), N-[4-(9H-carbazol-9-yl)phenyl]-N-phenylstilbene-4-amine (abbreviated to YGAS), N,N'-diphenyl-N,N'-bis(9-phenylcarbazol-3-yl)stilbene-4,4'-diamine (abbreviated to PCA2S), 4,4'-bis(2,2-diphenylvinyl)biphenyl(abbreviated to DPVBi), 2,5,8,11-tetra(tert-butyl)perylene (abbreviated to TBP), perylene, rubrene, and 1,3,6,8-tetraphenylpyrene. Since each of these substances exhibits light with color that is similar to that of the materials for a light-emitting element which are described in Embodiment 1, they are suitable for use in the light-emitting element of this embodiment.

The organic compound having a hole-transport property which is included in the first layer 121 is a substance having a hole-transport property higher than an electron-transport property. In contrast, the organic compound having an electron-transport property which is included in the second layer 122 is a substance having an electron-transport property higher than a hole-transport property.

The driving mechanism of the light-emitting element having the above-described structure is described using FIG. 1B.

In FIG. 1B, holes are injected from the first electrode 101 into the first layer 121 of the light-emitting layer 113 through the hole-inject layer 111 and the hole-transport layer 112. The holes injected into the first layer 121 are transported through the first layer 121 and further injected to the second layer 122. Here, the organic compound having an electron-transport property which is included in the second layer 122 is a substance that exhibits an electron-transport property higher than a hole-transport property, and therefore the holes injected into the second layer 122 are difficult to move. Consequently, a large number of holes are stored in the vicinity of the interface between the first layer 121 and the second layer 122. In addition, a phenomenon in which holes reach the electron-transport layer 114 without recombining with electrons can be suppressed.

Meanwhile, electrons are injected from the second electrode 103 into the second layer 122 of the light-emitting layer 113 through the electron-transport layer 114. The electrons injected into the second layer 122 are transported through the second layer 122 and further injected into the first layer 121. Here, the organic compound having a hole-transport property which is included in the first layer 121 is a substance that exhibits a hole-transport property higher than an electron-transport property, and therefore, the electrons injected into the first layer 121 are difficult to move. As a result, a phenomenon in which electrons reach the hole-transport layer 112 without recombining with holes can be inhibited.

Therefore, a large number of holes and electrons are present in a region in the vicinity of the interface between the first layer 121 and the second layer 122 of the light-emitting layer 113, so that the probability of recombination in the region in the vicinity of the interface can be increased. In other words, the light-emitting region is formed in the vicinity of the center of the light-emitting layer 113. As a result, the phenomenon in which holes reach the electron-transport layer 114 without recombining with electrons or in which electrons reach the hole-transport layer 112 without recombining with holes can be suppressed, whereby a reduction in the probability of recombination can be prevented. Thus, a reduction in carrier balance with time can be prevented, which leads to an increase in reliability.

It is preferred that the organic compound having a hole-transport property be an organic compound capable of being oxidized and reduced and that the highest occupied molecular orbital level (HOMO level) thereof is equal to or greater than −6.0 eV and equal to or less than −5.0 eV in order to allow holes and electrons to be injected into the first layer 121 of the light-emitting layer 113. In addition, the lowest unoccupied molecular orbital level (LUMO level) of the organic compound having a hole-transport property is preferably equal to or greater than −3.0 eV and equal to or less than −2.0 eV.

As such an organic compound that can be oxidized and reduced, the use of the materials for a light-emitting element which are described in Embodiment 1 is particularly preferable among tricyclic polyacene derivatives, tetracyclic polyacene derivatives, pentacyclic polyacene derivatives, and hexacyclic polyacene derivatives. Specific examples of the organic compound having an hole-transport property which is contained in the first layer 121 of the light-emitting layer 113 include 9,10-diphenylanthracene (abbreviated to DPAnth), N,N-diphenyl-9-[4-(10-phenyl-9-anthryl)phenyl]-9H-carbazol-3-amine (abbreviated to CzA1PA), 4-(10-phenyl-9-anthryl)triphenylamine (abbreviated to DPhPA), N,9-diphenyl-N-[4-(10-phenyl-9-anthryl)phenyl]-9H-carbazol-3-amine (abbreviated to PCAPA), N,9-diphenyl-N-{4-[4-(10-phenyl-9-anthryl)phenyl]phenyl}-9H-carbazol-3-amine (abbreviated to PCAPBA), and the like.

Similarly, it is preferred that the organic compound having an electron-transport property is an organic compound capable of being oxidized and reduced and that the HOMO level thereof is equal to or greater than −6.0 eV and equal to or less than −5.0 eV in order to allow holes and electrons to be injected into the second layer 122 of the light-emitting layer 113. In addition, the lowest unoccupied molecular orbital level (LUMO level) of the organic compound having an electron-transport property is preferably equal to or greater than −3.0 eV and equal to or less than −2.0 eV.

As such an organic compound which can be oxidized or reduced, a tricyclic polyacene derivative, a tetracyclic polyacene derivative, a pentacyclic polyacene derivative, or a hexacyclic polyacene derivative can be used. Specific examples include anthracene derivatives, phenanthrene derivatives, pyrene derivatives, chrysene derivatives, dibenzo[g,p]chrysene derivatives, and the like. For example, as a compound having an electron-transport property which can be used for the second layer 122 of the light-emitting layer 113, there are 9-[4-(10-phenyl-9-anthryl)phenyl]-9H-carbazole (abbreviated to CzPA), 3,6-diphenyl-9-[4-(10-phenyl-9-anthryl)phenyl]-9H-carbazole (abbreviated to DPCzPA), 9,10-bis(3,5-diphenylphenyl)anthracene (abbreviated to DPPA), 9,10-di(2-naphthyl)anthracene (abbreviated to DNA), 2-tert-butyl-9,10-di(2-naphthyl)anthracene (abbreviated to t-BuDNA), 9,9'-bianthryl (abbreviated to BANT), 9,9'-(stilbene-3,3'-diyl)diphenanthrene (abbreviated to DPNS), 9,9'-(stilbene-4,4'-diyl)diphenanthrene (abbreviated to DPNS2), 3,3',3"-(benzene-1,3,5-triyl)tripyrene (abbreviated to TPB3), and the like.

As described above using FIG. 1B, the light-emitting element of the present embodiment is formed so that holes can be injected from the first layer 121 into the second layer 122 of the light-emitting layer 113. Therefore, the difference in HOMO level between the organic compound having a hole-transport property and the organic compound having an electron-transport property is preferably small. The light-emitting element is also formed so that electrons can be injected from the second layer 122 into the first layer 121 of the light-emitting layer 113. Therefore, the difference in LUMO level between the organic compound having a hole-transport property and the organic compound having an electron-transport property is preferably small. If the difference in HOMO level between the organic compound having a hole-transport property and the organic compound having an electron-transport property is large, the injection of holes from the first layer 121 into the second layer 122 is difficult, which results in a shift of the light-emitting region toward the first layer 121 side. In a similar way, if the difference in LUMO level between the organic compound having a hole-transport property and the organic compound having an electron-transport property is large, the injection of electrons from the second layer 122 into the first layer 121 is difficult, which results in a shift of the light-emitting region toward the second layer 122 side. Therefore, it is preferred that the difference in HOMO level between the organic compound having a hole-transport property and the organic compound having an electron-transport property and the difference in LUMO level between the organic compound having a hole-transport property and the organic compound having an electron-transport property are equal to or less than 0.3 eV, and more preferably, 0.1 eV.

Since light is emitted from the light-emitting element by recombination of electrons and holes, it is preferable that the organic compound used for the light-emitting layer 113 is stable with respect to repetitive oxidation and reduction. In other words, it is preferred that the organic compound can undergo reversible oxidation and reduction. In particular, the organic compound having a hole-transport property and the organic compound having an electron-transport property are preferably stable even if the oxidation and reduction thereof are repeated. Stability to repetitive oxidation and reduction can be confirmed by cyclic voltammetry (CV) measurement.

Specifically, changes in an oxidation peak potential ($E_{pa}$) in the oxidation or a reduction peak potential ($E_{pc}$) in the reduction of the organic compound, changes in a CV curve, and the like are observed, by which whether the organic compounds are stable to the repetitive oxidation and reduction can be confirmed. As to the organic compound having a hole-transport property or the organic compound having an electron-transport property which is used in the light-emitting layer 113, it is preferred that changes in current at a peak potential of the oxidation and at a peak potential of the reduction are negligibly small even after the repetitive oxidation and reduction. In a similar way, it is preferred that the changes in peak potential in the oxidation and the peak potential in the reduction are negligibly small after the repetitive oxidation and reduction.

When the first organic compound contained in the first layer 121 and the second organic compound contained in the second layer 122 of the light-emitting layer 113 are different from each other, there is a possibility that light is emitted from only one of the first layer 121 and the second layer 122. However, if the light-emitting element is designed so that the first organic compound contained in the first layer 121 and the second organic compound contained in the second layer 122 are the same, light can be emitted in the vicinity of the center of the light-emitting layer 113. Therefore, it is preferred that the first organic compound contained in the first layer 121 and the second organic compound contained in the second layer 122 are the same compound selected from the materials for a light-emitting element which are described in Embodiment 1. Since the materials for a light-emitting element which are described in Embodiment 1 have high emission efficiency, application thereof to the structure described in this embodiment leads to the formation of a light-emitting element with high emission efficiency and long lifetime.

Moreover, since the materials for a light-emitting element which are described in Embodiment 1 are bipolar materials and also possess a hole-transport property, they can be used alone in the first layer 121 of the light-emitting layer 113 of the present embodiment. The second layer 122 has a structure in which any of the materials for a light-emitting element which are described in Embodiment 1 is dispersed as an emission center in a host material, which means that the light-emitting element has a structure in which the first layer 121 comprises the material functioning as the emission center of the second layer 122. Thus, even if only the materials for a light-emitting element which are described in Embodiment 1 are used in the first layer 121 of the light-emitting layer 113, emission from both the first layer 121 and the second layer 122 can be obtained because the first layer 121 of the light-emitting layer 113 has a hole-transport property. In this manner, light emission can be obtained from the first layer 121 which includes only the materials for a light-emitting element which are described in Embodiment 1.

As mentioned above, the structure in which the material for a light-emitting element which is described in Embodiment 1 is alone used in the first layer 121 of the light-emitting element improves emission efficiency. Additionally, this structure is able to realize a light-emitting element having both high emission efficiency and long lifetime. One of the reasons for the improvement in emission efficiency is likely to be the contribution of electrons which fail to undergo recombination in the second layer 122 to light emission in the first layer 121. This structure also allows electrons which fail to undergo recombination in the second layer 122 to be recombined in the first layer 121, which contributes to a decrease in the number of electrons that reach the hole-transport layer 112 and suppression of deterioration of the material included in the hole-transport layer 112. This is recognized as one of the reasons for the improved lifetime. The improvement in emission efficiency and the prolongation of the lifetime are realized by the structure in which the first layer 121 comprises the material for a light-emitting element of Embodiment 1 which functions as a material of an emission center of the second layer 122.

In the light-emitting element shown in this embodiment, the light-emitting region is not located at the interface between the light-emitting layer 113 and the hole-transport layer 112 or the interface between the light-emitting layer 113 and the electron-transport layer 114, but formed in the vicinity of the center of the light-emitting layer 113. Therefore, there are almost no influences of deterioration which is caused when the light-emitting region is adjacent to the hole-transport layer 112 or the electron-transport layer 114. Therefore, a light-emitting element having long lifetime and negligible deterioration can be obtained. Furthermore, since the light-emitting layer 113 in the light-emitting element of the present embodiment contains the compound that is stable in repetitive oxidation and reduction, the light-emitting layer 113 scarcely deteriorates even if light emission caused by recombination of holes and electrons is repeated. Therefore, a light-emitting element that has long lifetime can be obtained.

Since in the light-emitting element shown in the present embodiment, the organic compound included in the first layer 121 and the organic compound included in the second layer 122 of the light-emitting layer 113 emit light of similar colors, light with high color purity can be obtained even if not only the organic compound included in the first layer 121 but also the organic compound included in the second layer 122 emits light. Further, since each of the materials for a light-emitting element which are described in Embodiment 1 is a substance having a high light-emitting property which emits blue light, the element structure described in this embodiment is particularly effective for use in a light-emitting element that emits blue light and a light-emitting element that emits blue-green light. Blue color is essential for fabrication of a full-color display, and the deterioration can be suppressed by applying the present invention. The present invention can also be applied to a light-emitting element that emits green light and a light-emitting element that emits red light. This embodiment can be combined with any other embodiment as appropriate.

Moreover, as for the light-emitting element shown in the present embodiment, the first layer 121 and the second layer 122 of the light-emitting layer 113 may have a structure in which the material for a light-emitting element which is described in Embodiment 1 is dispersed in a host material and also may have a structure in which the material for a light-emitting element which is described in Embodiment 1 is not dispersed in a host material but is used alone.

EMBODIMENT 6

In this embodiment, a mode of a light-emitting element with a structure in which a plurality of light-emitting units according to the present invention are stacked (hereinafter referred to as a stacked element) will be described with reference to FIG. 2. This light-emitting element is a light-emitting element having a plurality of light-emitting units between a first electrode and a second electrode. Each light-emitting unit can have a structure similar to that of the layer 102 containing an organic compound which is described in Embodiment 2. In other words, the light-emitting element shown in Embodiment 2 is a light-emitting element having one light-emitting unit, whereas the light-emitting element described in this embodiment has a plurality of light-emitting units.

Figure 2:
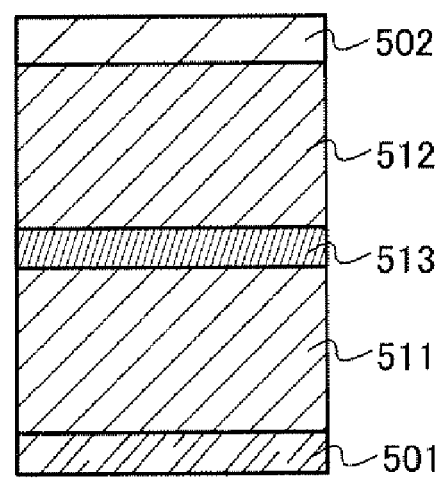
FIG. 2 illustrates a light-emitting element according to one embodiment of the present invention.

In FIG. 2, a first light-emitting unit 511 and a second light-emitting unit 512, which are stacked with a charge generation layer 513 interposed therebetween, are provided between a first electrode 501 and a second electrode 502. Materials similar to those in Embodiment 2 can be applied to the first electrode 501 and the second electrode 502. The first light-emitting unit 511 and the second light-emitting unit 512 may have the same structure or different structure, and the structure of the layer containing an organic compound shown in any of Embodiments 2 to 5 can be applied thereto.

A charge generation layer 513 includes a composite material of an organic compound and a metal oxide. This composite material of an organic compound and a metal oxide is that described in Embodiment 2 and contains an organic compound and a metal oxide such as vanadium oxide, molybdenum oxide, or tungsten oxide. As the organic compound, various compounds such as an aromatic amine compound, a carbazole derivative, an aromatic hydrocarbon, and a high molecular compound (an oligomer, a dendrimer, a polymer, or the like) can be used. An organic compound having a hole-transport property, which has a hole mobility of greater than or equal to $1 \times 10^{-6}$ cm$^2$/Vs, is preferably applied as the organic compound. However, other materials may also be used as long as the hole-transport property is higher than the electron-transport property. The composite material of an organic compound and metal oxide is superior in carrier-inject property and carrier-transport property, and accordingly, low-voltage driving and low-current driving can be realized.

Note that the charge generation layer 513 may be formed with a combination of a composite material of an organic compound and a metal oxide, and other materials. For example, the charge generation layer 513 may be formed with a combination of a layer including the composite material of an organic compound and a metal oxide and a layer including one compound selected from electron-donating substances and a compound having a high electron-transport property. Further, the charge generation layer 513 may be formed with a combination of a layer including the composite material of an organic compound and a metal oxide and a transparent conductive film.

In any case, the charge generation layer 513 sandwiched between the first light-emitting unit 511 and the second light-emitting unit 512 is acceptable as long as electrons are injected into one light-emitting unit and holes are injected into the other light-emitting unit when a voltage is applied between the first electrode 501 and the second electrode 502. For example, in FIG. 2, any layer can be employed as the charge generation layer 513 as long as the layer injects electrons into the first light-emitting unit 511 and holes into the second light-emitting unit 512 when a voltage is applied so that the potential of the first electrode 501 is higher than that of the second electrode 502.

In this embodiment, a light-emitting element having two light-emitting units is explained; however, the present embodiment can be similarly applied to a light-emitting element in which three or more light-emitting units are stacked. When the charge generation layer is provided between the pair of electrodes so as to partition the plural light-emitting units like the light-emitting element of this embodiment, it is possible to provide a light-emitting element which has long lifetime and is able to emit light at a high luminance at a low current density. Moreover, a light-emitting device with low power consumption, which can be driven at low voltage, can be obtained.

By enabling the light-emitting units to emit light of different colors, light emission of a desired color can be obtained from the whole light-emitting element. For example, in the case of a light-emitting element having two light-emitting units, if the emission colors of the first light-emitting unit and the second light-emitting unit are made complementary to each other, white light can be obtained from the whole of the light-emitting element. Note that complementary colors mean colors having the relationship in which they become an achromatic color by being mixed. That is, white light emission can be obtained by mixing light from substances whose emission colors are complementary colors. This technique can be similarly applied to a light-emitting element having three light-emitting units. For example, white light emission can be obtained from a light-emitting element when emission colors of the first, second, and third light-emitting units are red, green, and blue, respectively.

Note that this embodiment can be appropriately combined with other embodiments.

EMBODIMENT 7

In this embodiment, a light-emitting device manufactured using the material for a light-emitting element which is described in Embodiment 1 will be described.

Figure 3A:
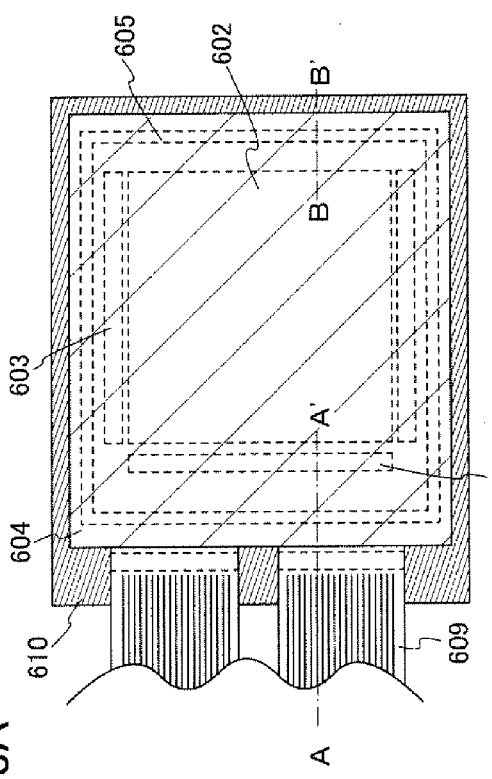
FIGS. 3A and 3B illustrate a light-emitting device according to one embodiment of the present invention.
Figure 3B:
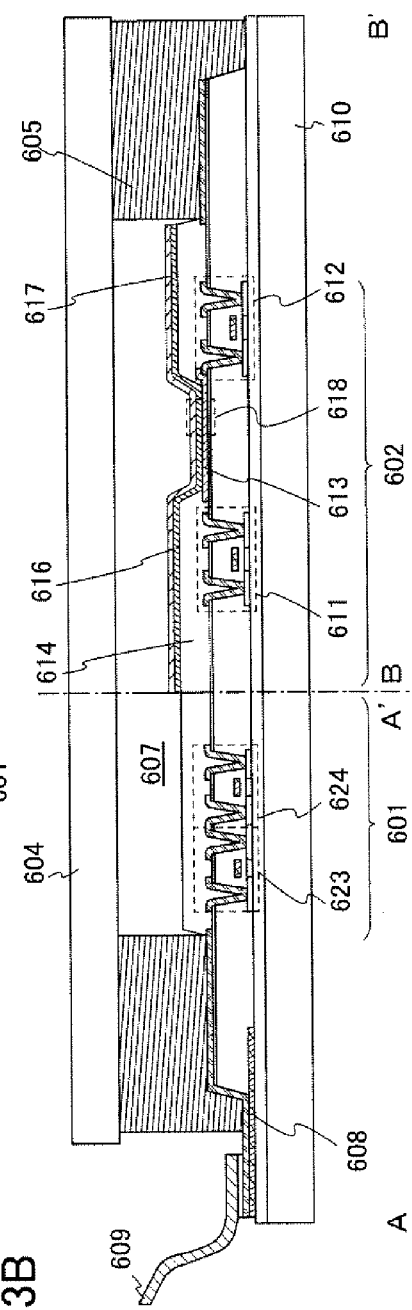

In this embodiment, a light-emitting device manufactured using the material for a light-emitting element which is described in Embodiment 1 will be described with reference to FIGS. 3A and 3B. FIG. 3A is a top view of the light-emitting device, and FIG. 3B is a cross sectional view taken along lines A-A' and B-B' of FIG. 3A. This light-emitting device includes a driver circuit portion (source side driver circuit) 601 and a driver circuit portion (gate side driver circuit) 603 which are configured to control the light emission of the light-emitting element located in a pixel portion 602. A reference numeral 604 represents a sealing substrate, a reference numeral 605 represents a sealant, and the inside surrounded by the sealant 605 is a space 607.

A lead wiring 608 is a wiring for transmitting signals that are to be inputted to the source side driver circuit 601 and the gate side driver circuit 603 and receives a video signal, a clock signal, a start signal, a reset signal, and the like from a flexible printed circuit (FPC) 609 which is an external input terminal. Although only the FPC is shown here, the FPC may be provided with a printed wiring board (PWB). The light-emitting device described in the specification includes not only a light-emitting device itself but also a state in which an FPC or a PWB is attached thereto.

Next, a sectional structure will be described using FIG. 3B. Although the driver circuit portion and the pixel portion are formed over an element substrate 610, the source side driver circuit 601, which is one of the driver circuit portions, and one pixel in the pixel portion 602 are illustrated here.

Note that as the source side driving circuit 601, a CMOS circuit in which an n-channel TFT 623 and a p-channel TFT 624 are combined is formed. The driver circuit may be formed of various CMOS circuits, PMOS circuits, or NMOS circuits. In this embodiment, although a driver-integrated type structure in which a driver circuit is formed over an element substrate 610 is described, a driver circuit is not necessarily formed over the element substrate 610 but can be formed externally from the element substrate 610.

The pixel portion 602 has a plurality of pixels, each of which includes a switching TFT 611, a current control TFT 612, and a first electrode 613 which is electrically connected to a drain of the current control TFT 612. An insulator 614 is formed to cover the edge of the first electrode 613. Here, the insulator 614 is formed using a positive photosensitive acrylic resin.

In order to favorably cover the edge of the first electrode 613, the insulator 614 is provided such that either an upper edge portion or a lower edge portion thereof has a curved surface with a curvature. For example, in the case of using a positive photosensitive acrylic as a material of the insulator 614, it is preferred that only the upper end portion of the insulator 614 has a curved surface with curvature (the radius of the curvature being 0.2 to 3 μm). Note that the insulator 614 can be formed using either a negative photoresist that becomes insoluble in an etchant after photo-irradiation or a positive photoresist that becomes insoluble in an etchant after photo-irradiation.

A layer containing an organic compound (EL layer) 616 and a second electrode 617 are formed over the first electrode 613. Here, a material having a high work function is preferably used as a material used for the first electrode 613 which serves as an anode. For example, in addition to a single-layer film such as an ITO film, an indium tin oxide film containing silicon, an indium oxide film containing zinc oxide at 2 to 20 wt %, a titanium nitride film, a chromium film, a tungsten film, a Zn film, a Pt film, or the like, a stacked film such as a stack of a titanium nitride film and a film containing aluminum as its main component or a stacked film having a three-layer structure of a titanium nitride film, a film containing aluminum as its main component, and another titanium nitride film can be used. With a stacked layer structure, the resistance as a wire is low, a good ohmic contact can be obtained, and further a function as an anode can be obtained.

The EL layer 616 is formed by various methods such as an evaporation method using an evaporation mask, an inkjet method, a spin coating method, or the like. The EL layer 616 includes any of the materials for a light-emitting element which are described in Embodiment 1. As another material included in the EL layer 616, a low molecular compound or a high molecular compound (including an oligomer or a dendrimer) may be used. Further, not only organic compounds but also inorganic compounds can be used for the material for forming the EL layer 616.

Further, as a material used for the second electrode 617 which is formed over the EL layer 616 and functions as a cathode, it is preferable to use a material with a low work function (e.g., Al, Mg, Li, Ca, or an alloy or a compound thereof such as MgAg, MgIn, AlLi, LiF, or $CaF_2$). When light generated in the EL layer 616 passes through the second electrode 617, the second electrode 617 is preferably formed by a stack of a thin metal film and a transparent conductive film (ITO, indium oxide including zinc oxide at 2 to 20 wt %, indium tin oxide including silicon or silicon oxide, zinc oxide, or the like).

The sealing substrate 604 is attached to the element substrate 610 with the sealant 605, whereby a light-emitting element 618 is provided in the space 607 surrounded by the element substrate 610, the sealing substrate 604, and the sealant 605. Note that the space 607 is filled with a filler and may be filled with the sealant 605 in addition to an inert gas (nitrogen, argon, and the like).

As a material for the sealant 605, an epoxy resin is preferably used. It is desirable to use a material that allows permeation of moisture or oxygen as little as possible. As the sealing substrate 604, a plastic substrate formed of FRP (fiberglass-reinforced plastics), PVF (poly(vinylfluoride)), a polyester, an acrylic, or the like can be used besides a glass substrate or a quartz substrate.

In this manner, the light-emitting device manufactured using the material for a light-emitting element which is described in Embodiment 1 can be obtained.

Since the material for a light-emitting element which is described in Embodiment 1 is used for the light-emitting device of the present embodiment, the light-emitting device with favorable characteristics can be obtained. Specifically, a light-emitting device having long lifetime can be obtained.

Also, since the materials for a light-emitting element which are described in Embodiment 1 have high emission efficiency, a light-emitting device with low power consumption can be provided.

Further, since the light-emitting element in which any of the materials for a light-emitting element which are described in Embodiment 1 is used can emit blue light with high color purity at high efficiency, the light-emitting element are suitable for use in full-color displays. Further, since the light-emitting element can emit blue light and has long lifetime, the light-emitting element is suitable for use in full-color displays.

Figure 4A:
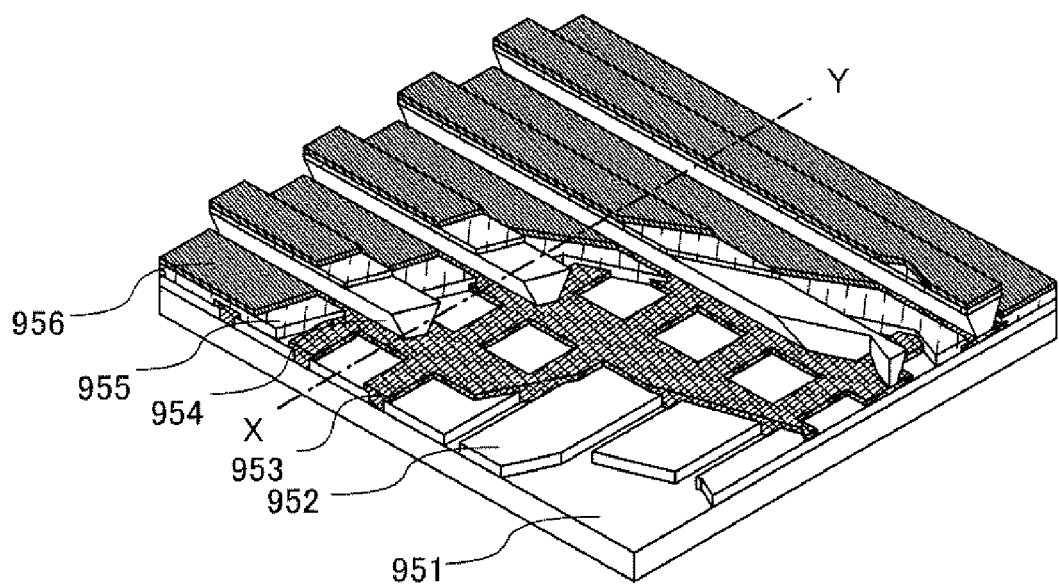
FIGS. 4A and 4B illustrate a light-emitting device according to one embodiment of the present invention.
Figure 4B:
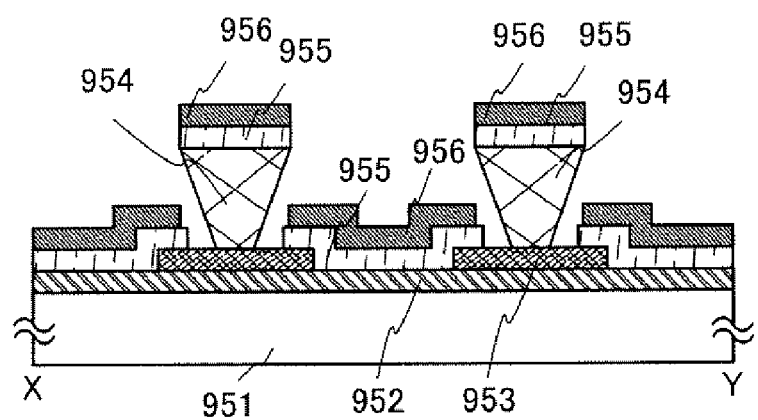

As described above, in this embodiment, an active matrix type light-emitting device in which operation of a light-emitting element is controlled by a transistor is described. Alternatively, a passive matrix type light-emitting device may also be used. FIGS. 4A and 4B illustrate a passive matrix type light-emitting device manufactured by applying the present invention. FIG. 4A is a perspective view of the light-emitting device, and FIG. 4B is a cross-sectional view taken along line X-Y in FIG. 4A. As shown in FIGS. 4A and 4B, an electrode 952 and an electrode 956 are provided over a substrate 951, and a layer (EL layer) 955 containing an organic compound is provided between the electrode 952 and the electrode 956. The edge of the electrode 952 is covered with an insulating layer 953. A partition wall layer 954 is provided on the insulating layer 953. The sidewalls of the partition wall layer 954 are aslope so that a distance between both sidewalls is gradually narrowed toward the surface of the substrate 951. In other words, a cross section in the direction of a narrow side of the partition wall layer 954 has a trapezoidal shape, and a lower side (which faces a surface of the insulating layer 953 and is in contact with the insulating layer 953) is shorter than an upper side (which faces the surface of the insulating layer 953 and is not in contact with the insulating layer 953). By providing the partition wall layer 954 in this manner, defects of the light-emitting element due to a cross talk and the like can be prevented. By using any of the materials for a light-emitting element which are described in Embodiment 1, a passive matrix type light-emitting device having long lifetime can be obtained. Further, a light-emitting device with low power consumption can be manufactured.

EMBODIMENT 8

In this embodiment, an electronic device according to the present invention which includes the light-emitting device described in Embodiment 7 in part thereof will be explained. The electronic device shown in this embodiment has a display portion with long lifetime which includes the material for a light-emitting element described in Embodiment 1. Further, the power consumption of the display portion is low.

Examples of electronic devices each manufactured using any of the materials for a light-emitting element which are described in Embodiment 1 include cameras such as video cameras and digital cameras, goggle type displays, navigation systems, audio playback devices (e.g., car audio systems and other audio systems), computers, game machines, portable information terminals (e.g., mobile computers, mobile phones, portable game machines, and electronic books), image playback devices provided with recording media (i.e., devices that are capable of playing back recording media such as digital versatile discs (DVDs) and equipped with display devices that can display the image), and the like. Specific examples for such electronic devices are illustrated in FIGS. 5A to 5D.

Figure 5A:
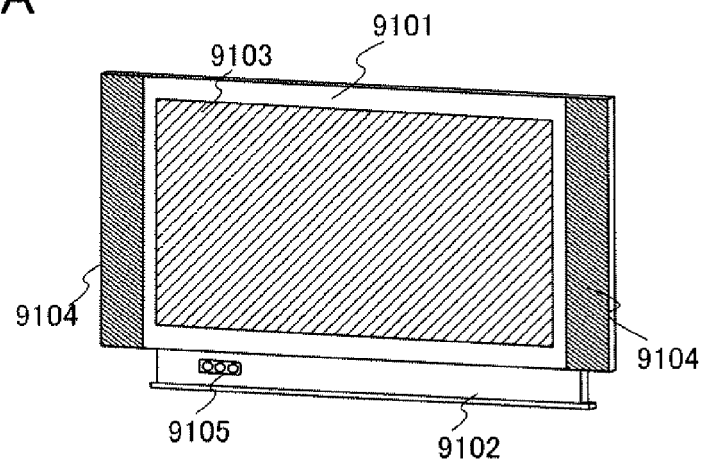
FIGS. 5A to 5D each illustrate an electronic device according to one embodiment of the present invention.

FIG. 5A illustrates a television set according to the present invention, which includes a housing 9101, a supporting base 9102, a display portion 9103, speaker portions 9104, a video input terminal 9105, and the like. In the display portion 9103 of this television set, light-emitting elements similar to those described in any of Embodiments 2 to 6 are arranged in matrix. The features of the light-emitting element are exemplified by high emission efficiency and long lifetime. The display portion 9103 which includes the light-emitting elements has similar features. Therefore, in the television device, image quality hardly deteriorates and low power consumption is attained. With such features, a deterioration compensation functional circuit and a power supply circuit can be significantly reduced or downsized in the television set; therefore, the housing 9101 and the supporting base 9102 can be lightened and downsized. Since the television set in accordance with the present invention can realize low power consumption, high image quality and a reduction in size and weight, products suitable for any residential environment can be provided. Also, since a light-emitting element utilizing any of the materials for a light-emitting element which are described in Embodiment 1 can emit blue light with high color purity, a television set having a display portion with long lifetime which can display full-color images can be obtained.

Figure 5B:
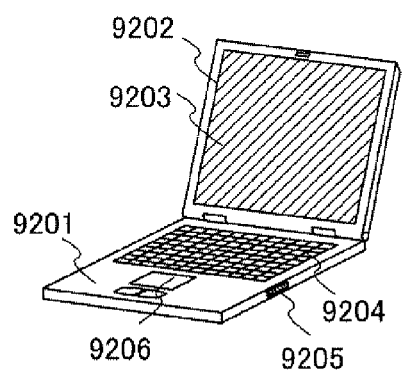

FIG. 5B illustrates a computer in accordance with the invention, which includes a main body 9201, a housing 9202, a display portion 9203, a keyboard 9204, an external connection port 9205, a pointing device 9206, and the like. In the display portion 9203 of this computer, light-emitting elements similar to those described in any of Embodiments 2 to 6 are arranged in matrix. The features of the light-emitting element are exemplified by high emission efficiency and long lifetime. The display portion 9203 which includes the light-emitting elements has similar features. Therefore, in the computer, image quality hardly deteriorates and low power consumption is attained. With such features, a deterioration compensation functional circuit and a power supply circuit can be significantly reduced or downsized in the computer; therefore, the main body 9201 and the housing 9202 can be lightened and downsized. Since the computer in accordance with the present invention can realize low power consumption, high image quality and a reduction in size and weight, products suitable for any residential environment can be provided. Also, since a light-emitting element utilizing any of the materials for a light-emitting element which are described in Embodiment 1 can emit blue light with high color purity, a computer having a display portion with long lifetime which can display full-color images can be obtained.

Figure 5C:
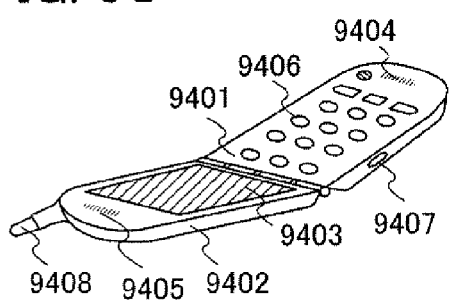

FIG. 5C illustrates a mobile phone according to the present invention, which includes a main body 9401, a housing 9402, a display portion 9403, an audio input portion 9404, an audio output portion 9405, an operation key 9406, an external connecting port 9407, an antenna 9408, and the like. In the display portion 9403 of this mobile phone, light-emitting elements similar to those described in any of Embodiments 2 to 6 are arranged in matrix. The features of the light-emitting element are exemplified by high emission efficiency and long lifetime. The display portion 9403 which includes the light-emitting elements has similar features. Therefore, in the mobile phone, image quality hardly deteriorates and low power consumption is attained. With such features, a deterioration compensation functional circuit and a power supply circuit can be significantly reduced or downsized in the mobile phone; therefore, the main body 9401 and the housing 9402 can be lightened and downsized. Since the mobile phone in accordance with the present invention can realize low power consumption, high image quality and a reduction in size and weight, products suitable for any residential environment can be provided. Also, since a light-emitting element utilizing any of the materials for a light-emitting element which are described in Embodiment 1 can emit blue light with high color purity, a mobile phone having a display portion with long lifetime which can display full-color images can be obtained.

Figure 5D:
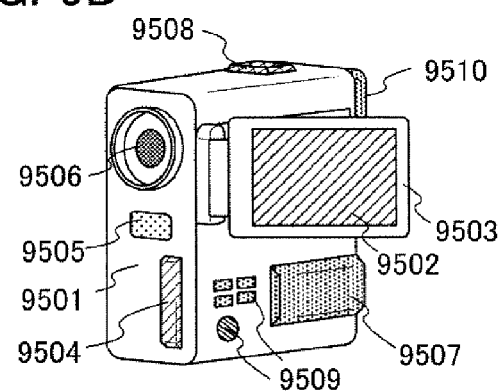

FIG. 5D illustrates a camera according to the present invention, which includes a main body 9501, a display portion 9502, a housing 9503, an external connecting port 9504, a remote controller receiving portion 9505, an image receiving portion 9506, a battery 9507, an audio input portion 9508, operation keys 9509, an eye piece portion 9510, and the like. In the display portion 9502 of this camera, light-emitting elements similar to those described in any of Embodiments 2 to 6 are arranged in matrix. The features of the light-emitting element are exemplified by high emission efficiency and long lifetime. The display portion 9502 which includes the light-emitting elements has similar features. Therefore, in the camera, image quality hardly deteriorates and low power consumption is attained. With such features, a deterioration compensation functional circuit and a power supply circuit can be significantly reduced or downsized in the camera; therefore, the main body 9501 can be lightened and downsized. Since the camera in accordance with the present invention can realize low power consumption, high image quality and a reduction in size and weight, products suitable for any residential environment can be provided. Also, since a light-emitting element utilizing any of the materials for a light-emitting element which are described in Embodiment 1 can emit blue light with high color purity, a camera having a display portion with long lifetime which can display full-color images can be obtained.

As described above, the range of application of a light-emitting device manufactured applying the invention is extremely wide, and the light-emitting device can be applied to electronic devices in all kinds of fields. By using any of the materials for a light-emitting element which are described in Embodiment 1, electronic devices which have display portions with long lifetime can be provided. Furthermore, by use of any of the materials for a light-emitting element which are described in Embodiment 1, an electronic device that has a display portion with low power consumption can be obtained.

In addition, the light-emitting device to which the present invention is applied can also be used as a lighting device. One mode using the light-emitting element to which the present invention is applied as the lighting device will be explained with reference to FIG. 6.

Figure 6:
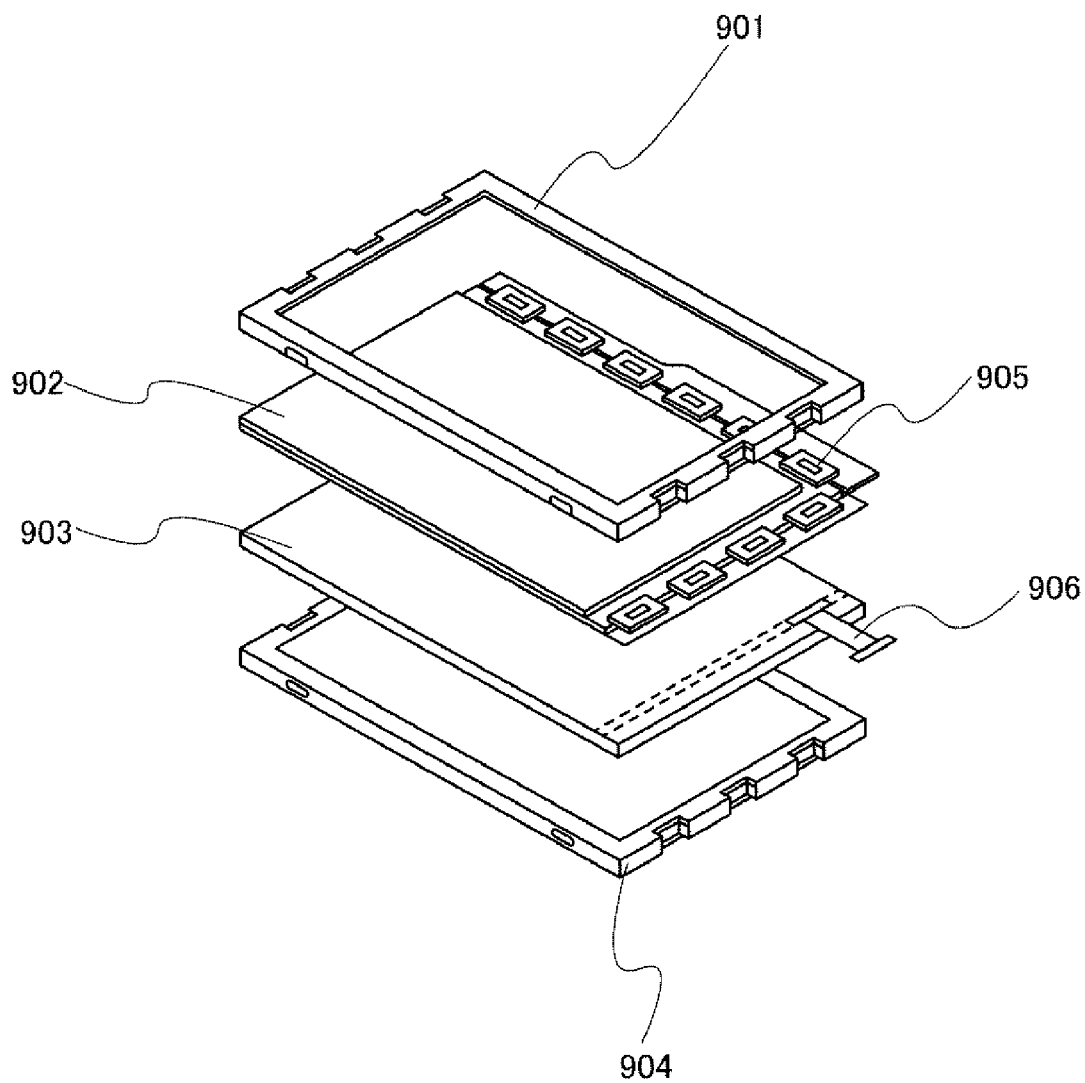
FIG. 6 illustrates a lighting device according to one embodiment of the present invention.

FIG. 6 illustrates an example of a liquid crystal display device using the light-emitting device to which the present invention is applied as a backlight. The liquid crystal display device illustrated in FIG. 6 includes a housing 901, a liquid crystal layer 902, a backlight 903 and a housing 904, and the liquid crystal layer 902 is connected to a driver IC 905. The light-emitting device to which the present invention is applied is used as the backlight 903, and current is supplied through a terminal 906.

By using the light-emitting device to which the present invention is applied as the backlight of the liquid crystal display device, a backlight with reduced power consumption and high emission efficiency can be obtained. The light-emitting device to which the present invention is applied is a lighting device with plane emission, and can have a large area. Therefore, the area of the backlight can be readily increased, which contributes to the increase in the area of the liquid crystal display device. Furthermore, the light-emitting device has a thin shape and exhibits low power consumption; therefore, a display device with low power consumption can be formed to have a thin shape. Since the light-emitting device to which the present invention is applied has long lifetime, a liquid crystal display device using the light-emitting device to which the present invention is applied also has long lifetime.

Figure 7:
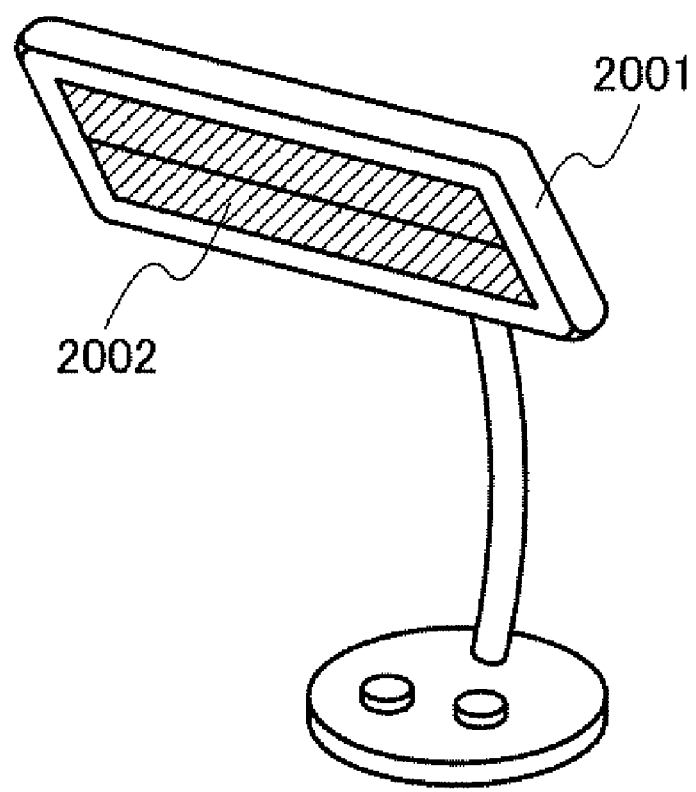
FIG. 7 illustrates a lighting device according to one embodiment of the present invention.

FIG. 7 illustrates an example in which the light-emitting device to which the present invention is applied is used as a desk lamp which is a lighting device. The desk lamp illustrated in FIG. 7 includes a housing 2001 and a light source 2002. The light-emitting device to which the present invention is applied is used as the light source 2002. The light-emitting device to which the present invention is applied has high emission efficiency and has long lifetime; therefore, a table lamp also has high emission efficiency and long lifetime.

Figure 8:
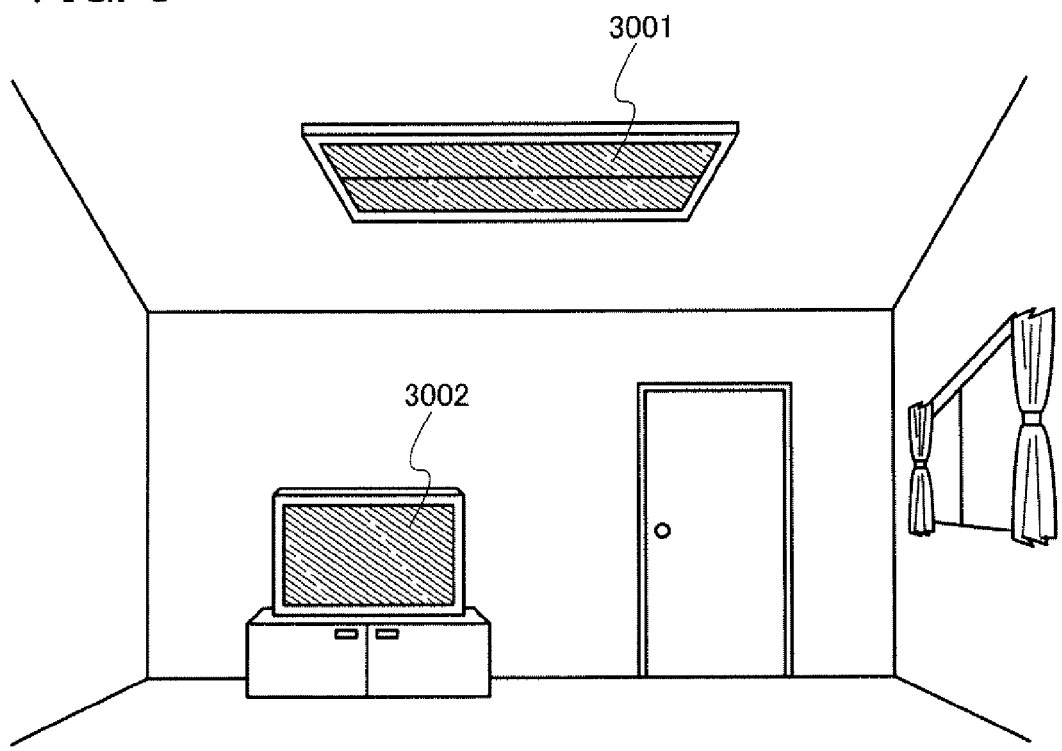
FIG. 8 illustrates a lighting device according to one embodiment of the present invention.

FIG. 8 illustrates an example in which the light-emitting device to which the present invention is applied is used for an indoor lighting device 3001. Since the light-emitting device to which the present invention is applied can also have a large area, it can be used as a lighting device having a large area. Further, the light-emitting device to which the present invention is applied has a thin shape and exhibits low power consumption; accordingly, is can be used as a lighting device having a thin shape and low power consumption. Thus, a television set 3002 according to the present invention similar to the television set described with reference to FIG. 5A can be installed in the room using the light-emitting device according to the present invention as the indoor lighting device 3001, so that pubic broadcasting and movies can be enjoyed. In such a case, since the power consumption of both devices is low, a powerful image can be watched in a bright room without concern about electricity charges.

EXAMPLE 1

In this example, specific explanation is given for the synthetic method of 4-(1-naphthyl)-4'-(10-phenyl-9-anthryl)-4''-(9-phenyl-9H-carbazol-3-yl)triphenylamine (abbreviated to PCBNAPA), which is a material for a light-emitting element according to one embodiment of the present invention.

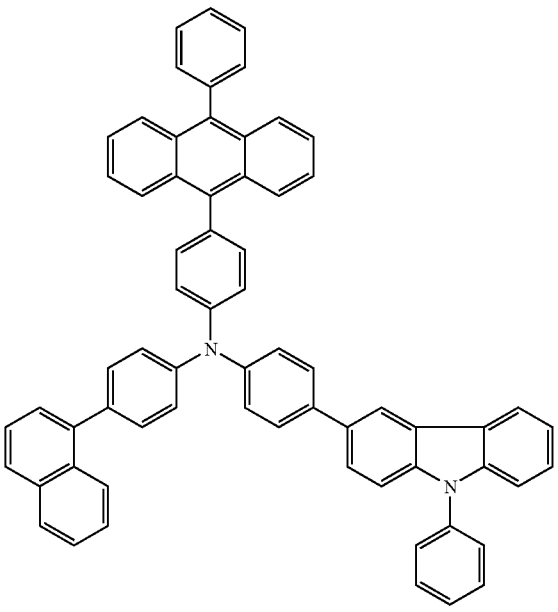

PCBNAPA

Step 1: Synthesis of 9-phenylanthracene

In a 200 mL three-neck flask were put 6.4 g (25 mmol) of 9-bromoanthracene, 3.0 g (25 mmol) of phenylboronic acid, 0.76 g (2.5 mmol) of tri(o-tolyl)phosphine, 60 mL of 1,2-dimethoxyethane (DME), and 25 mL of a 2.0 M aqueous solution of potassium carbonate. The mixture was degassed under reduced pressure with stirring, and the atmosphere in the flask was replaced with nitrogen. To the mixture was added 0.11 g (0.50 mmol) of palladium(II) acetate, and the mixture was stirred under a nitrogen stream at 80° C. for 3 hours. After a predetermined period, water was added to the mixture, and the aqueous layer and the organic layer were separated from each other. The aqueous layer was extracted with toluene. The extract and the organic layer were combined, washed with brine, and dried with magnesium sulfate. The mixture was subjected to suction filtration through Celite (produced by Wako Pure Chemical Industries, Ltd., Catalog No. 531-16855), Florisil (produced by Wako Pure Chemical Industries, Ltd., Catalog No. 540-00135), and alumina, and the filtrate was concentrated to give a solid. The solid was recrystallized with a mixed solvent of toluene and methanol to give 5.8 g of a white powder in a yield of 92%, which was the desired substance. The synthetic scheme of 9-phenylanthracene is shown below in (A-1).

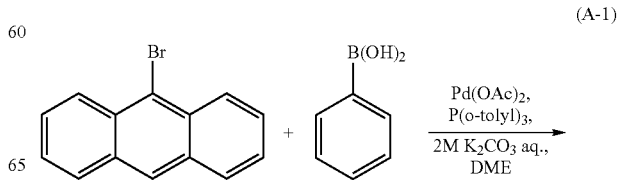

(A-1)

-continued

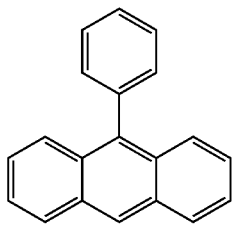

Step 2: Synthesis of 9-iodo-10-phenylanthracene

In a 500 mL Erlenmeyer flask was added 4.5 g (18 mmol) of 9-phenylanthracene. To the flask was added 200 mL of acetic acid, followed by heating at 70° C. to dissolve 9-phenylanthracene therein. To the resulting solution was added 5.2 g (13 mmol) of 1,3-diiodo-5,5-dimethylimidazolidine-2,4-dione (DIH), and the solution was stirred under air at 70° C. for 3 hours. After the reaction, ca. 100 mL of water and ca. 200 mL, of chloroform were added to this solution. The resulting mixture was washed with water twice, and the organic layer was separated from the aqueous layer. The aqueous layer was extracted with chloroform. The extract was combined with the organic layer and washed with brine, and then the combined organic layer was dried with magnesium sulfate. This mixture was gravity filtered, and the filtrate obtained was concentrated to give a brown solid. This solid was washed with hexane to give 5.8 g of a yellow solid in a yield of 86%, which was the desired substance. The synthetic scheme is shown in the following (A-2).

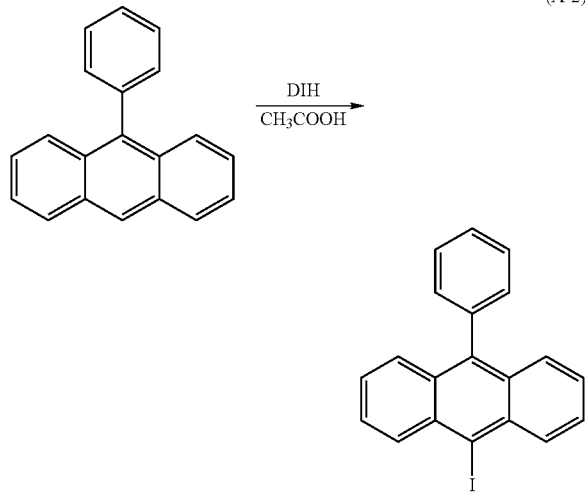

(A-2)

Step 3: Synthesis of 9-(4-bromophenyl)-10-phenylantracene

A mixture containing 1.0 g (2.6 mmol) of 9-iodine-10-phenylanthracene, 540 mg (2.7 mmol) of p-bromophenylboronic acid, 46 mg (30 μmol) of tetrakis(triphenylphosphine)palladium(0) (Pd(PPh$_3$)$_4$), 3.0 mL of an aqueous solution of potassium carbonate (2.0 mol/L), and 10 mL of toluene was stirred at 80° C. for 9 hours. After the reaction, toluene was added to the mixture, and the mixture was filtered through Florisil (produced by Wako Pure Chemical Industries, Ltd., Catalog No. 540-00135), Cate (produced by Wako Pure Chemical Industries, Ltd., Catalog No. 531-16855), and alumina. The filtrate obtained was washed with water and brine, followed by drying with magnesium sulfate. This mixture was gravity filtered, and the filtrate obtained was concentrated to give a solid, which was subjected to recrystallization with a mixed solvent of chloroform and hexane, resulting in 560 mg of a pale yellow solid which was the desired substance in 45% yield. The synthetic scheme of 9-(4-bromophenyl)-10-phenylanthracene is illustrated in (A-3)

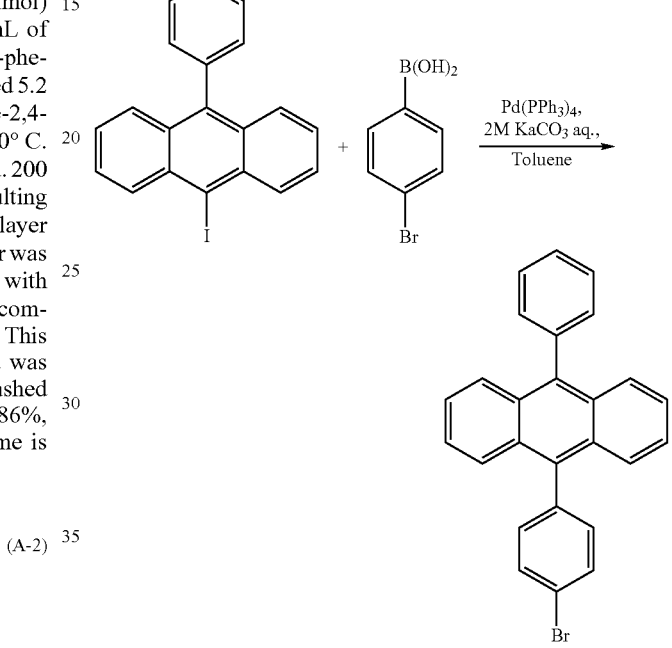

(A-3)

Step 4: Synthesis of 3-(4-bromophenyl)-9-phenyl-9H-carbazole

In a 200-mL three-neck flask were put 3.7 g (9.9 mmol) of 3-iodo-9-phenyl-9H-carbazole, 2.0 g (9.9 mmol) of 4-bromophenylboronic acid, and 0.61 g (2.0 mmol) of tri(o-tolyl)phosphine, which was followed by addition of 50 mL of 1,2-dimethoxyethane (abbreviated to DME) and 10 mL of an aqueous solution of potassium carbonate (2.0 mol/L). This mixture was degassed while being stirred under reduced pressure, and the atmosphere in the flask was substituted with nitrogen. Then, 0.11 g (0.50 mmol) of palladium(II) acetate was added to this mixture, which was then stirred at 80° C. for 9.5 hours. After the reaction, this mixture was cooled to room temperature and then washed twice with water. The organic layer was separated from the aqueous layer, and the resulting aqueous layer was extracted twice with toluene. Then, the extract was combined with the organic layer, followed by washing with brine. The combined organic layer was dried with magnesium sulfate, and subjected to the gravity filtration, and then the filtrate was concentrated. The resulting oily product was dissolved in ca. 20 mL of toluene, and the solution was subjected to suction filtration through Celite (produced by Wako Pure Chemical Industries, Ltd., Catalog No. 531-16855), alumina, and Florisil (produced by Wako Pure Chemical Industries, Ltd., Catalog No. 540-00135). The solid resulting from the concentration of the filtrate obtained was purified by silica gel column chromatography (the developing solvent, toluene:hexane=1:4) to obtain 1.9 g of a white powder which was the desired substance in a yield of 49%. The synthetic scheme of 3-(4-bromophenyl)-9-phenyl-9H-carbazole is shown in the following reaction scheme (A-4).

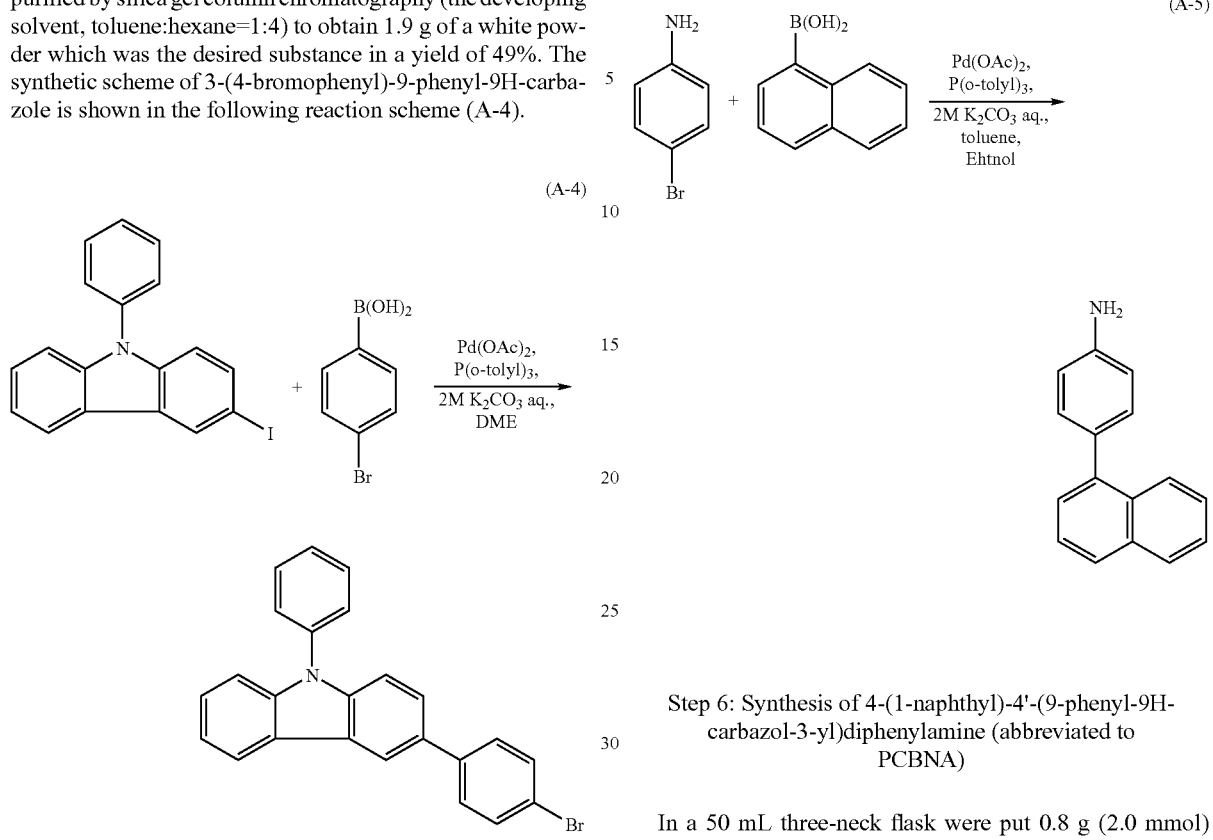

Step 5: Synthesis of 4-(1-naphthyl)aniline

In a 500-mL three-neck flask were put 5.0 g (29 mmol) of 4-bromoaniline, 5.0 g (29 mmol) of 1-naphthylboronic acid, and 0.45 g (1.5 mmol) of tri(o-tolyl)phosphine, and nitrogen substitution in the flask was carried out. To this mixture were added 100 mL of toluene, 50 mL of ethanol, and 31 mL of an aqueous solution of potassium carbonate (2 mol/L). The mixture was stirred and degassed under reduced pressure. Then, after the temperature of the mixture was raised to 60° C., 66.2 mg (0.29 mmol) of palladium(II) acetate was added into the mixture. The mixture was refluxed at 80° C. for 2.3 hours. After the reaction, toluene and water were added to the mixture, the organic layer was separated from the aqueous layer, and the aqueous layer was extracted twice with toluene. The extract and the organic layer were combined, washed with brine, and dried with magnesium sulfate. The mixture was gravity filtered to remove magnesium sulfate, and the filtrate was concentrated to give an oily product, which was subjected to suction filtration through Florisil (produced by Wako Pure Chemical Industries, Ltd., Catalog No. 540-00135), Celite (produced by Wako Pure Chemical Industries, Ltd., Catalog No. 531-16855), and alumina to result in the filtrate. The filtrate was concentrated to give 2.5 g of an oily product which was the desired substance in 40% yield. The synthetic scheme of 4-(1-naphthyl)aniline is shown in the following (A-5).

Step 6: Synthesis of 4-(1-naphthyl)-4'-(9-phenyl-9H-carbazol-3-yl)diphenylamine (abbreviated to PCBNA)

In a 50 mL three-neck flask were put 0.8 g (2.0 mmol) 3-(4-bromophenyl)-9-phenyl-9H-carbazole and 0.6 g (6.0 mmol) of sodium tert-butoxide, and nitrogen substitution in the flask was carried out. After 0.4 g (2.0 mmol) of 4-(1-naphthyl)aniline in 4 mL of toluene was added to the mixture, 1.8 mL of toluene and 0.1 mL of tri(tert-butyl)phosphine (a 10 wt % hexane solution) were added to the mixture. The temperature of the mixture was raised to 60° C., and then 37 mg (0.06 mmol) of bis(dibenzylideneacetone)palladium(0) was added. The mixture was stirred at 80° C. for 3 hours. After the reaction, toluene was added to the mixture, and a suction filtration through Celite (produced by Wako Pure Chemical Industries, Ltd., Catalog No. 531-16855) and alumina was carried out, resulting in a filtrate. The filtrate was concentrated to give a solid, which was purified by silica gel column chromatography (the developing solvent, hexane:toluene=3:2). The fractions obtained were concentrated to obtain 0.7 g of a brown solid which was the desired substance in 63% yield. The synthetic scheme of PCBNA is shown in the following (A-6).

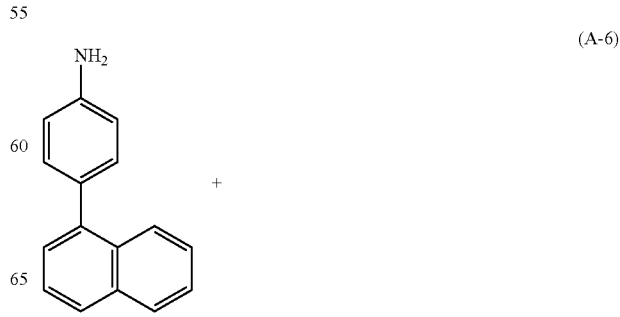

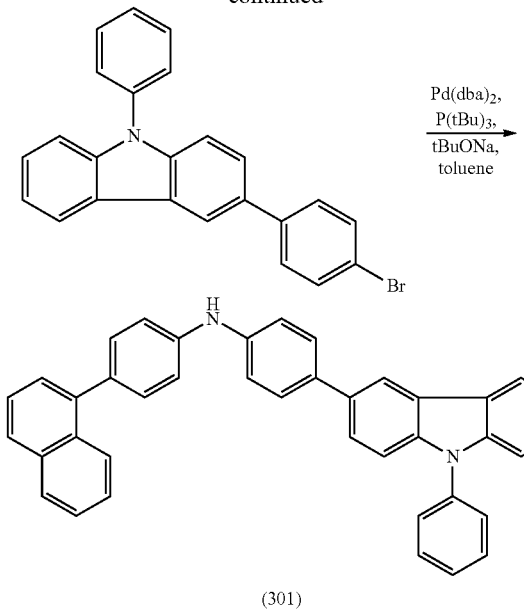

(301)

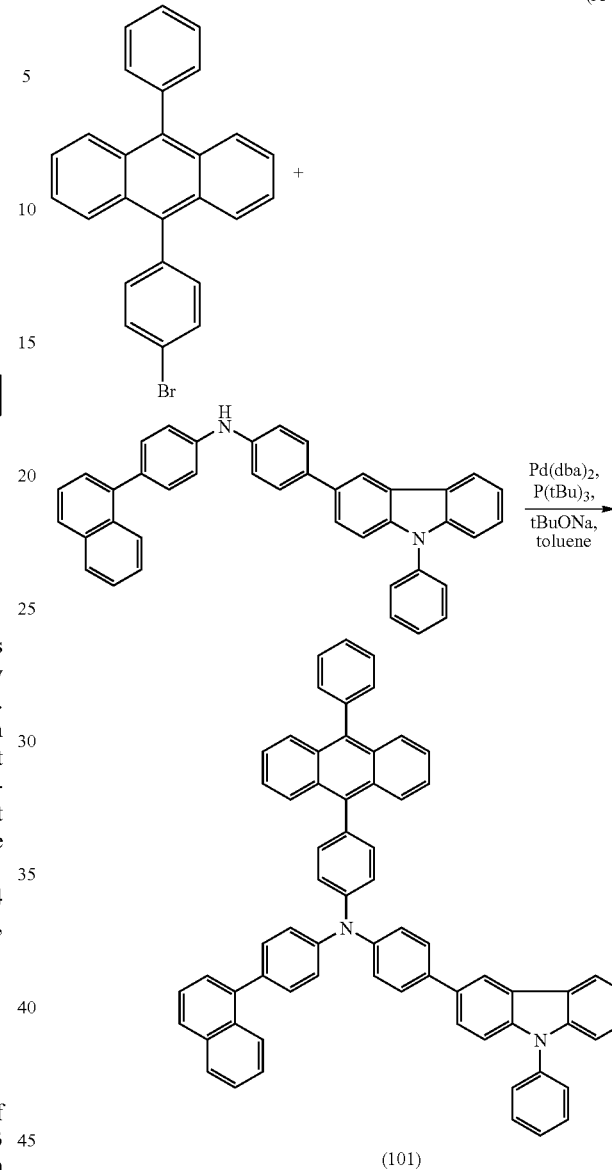

(A-7)

(101)

Figure 10A:
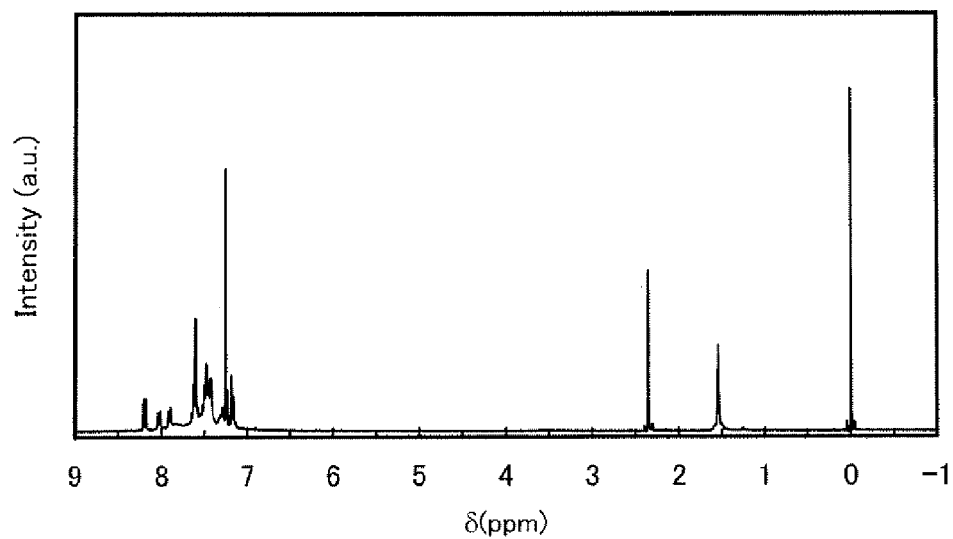
FIGS. 10A and 10B show $^1$H NMR charts of 4-(1-naphthyl)-4'-(9-phenyl-9H-carbazol-3-yl)diphenylamine (abbreviated to PCBNA).
Figure 10B:
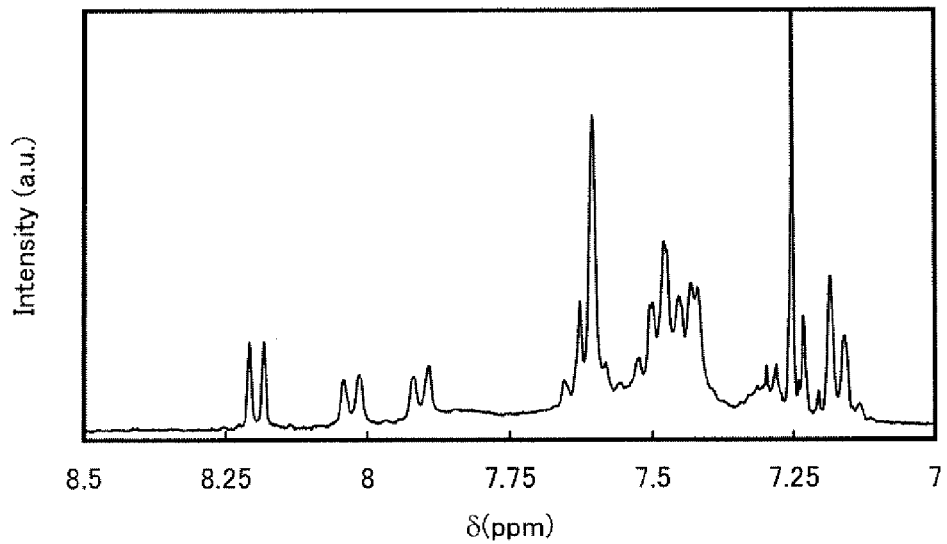

The solid obtained in the above Step 6 of Example 1 was analyzed by a nuclear magnetic resonance spectroscopy (NMR). The $^1$H NMR chart is shown in FIGS. 10A and 10B. FIG. 10B is a chart in which the range of 7.0 ppm to 8.5 ppm in FIG. 10A is expanded. The measurement results reveal that PCBNA which is a starting material of PCBNAPA, the material for a light-emitting element according to one embodiment of the present invention, was obtained. The $^1$H NMR data are shown blow.

$^1$H NMR (CDCl$_3$, 300 MHz): δ=7.25-7.70 (m, 23H), 7.84 (d, J=7.8 Hz, 1H), 7.91 (d, J=7.2 Hz, 1H), 8.03 (d, J=8.1 Hz, 1H), 8.12 (d, J=7.2 Hz, 1H), 8.34 (s, 1H).

Step 7: Synthesis of 4-(1-naphthyl)-4'-(10-phenyl-9-anthryl)-4''-(9-phenyl-9H-carbazol-3-yl)triphenylamine (abbreviated to PCBNAPA)

In a 50 mL three-neck flask were put 0.45 g (1.1 mmol) of 9-(4-bromophenyl)-10-phenylanthracene and 0.4 g (4.3 mmol) of sodium tert-butoxide, and the nitrogen substitution in the flask was carried out. After 0.8 g (1.4 mmol) of PCBNA in 10 mL of toluene was added to the mixture, 4.3 mL of toluene and 0.1 mL of tri(tert-butyl)phosphine (a 10 wt % of hexane solution) were added to the mixture. The temperature of the mixture was raised to 60° C., and then 23 mg (0.04 mmol) of bis(dibenzylideneacetone)palladium(0) was added thereto. The mixture was stirred at 80° C. for 2 hours. After the reaction, suction filtration through Florisil (produced by Wako Pure Chemical Industries, Ltd., Catalog No. 540-00135), Celite (produced by Wako Pure Chemical Industries, Ltd., Catalog No. 531-16855), and alumina was carried out to obtain a filtrate. The resulting filtrate was concentrated to give a solid, which was purified by silica gel column chromatograph (the developing solvent, hexane:toluene=3:7), and the fractions obtained were concentrated to result in a yellow solid which was the desired substance. The resulting solid was recrystallized with a mixed solvent of toluene and hexane, leading to the formation of 1.07 g of a pale yellow powder which was the desired substance in 85% yield. The synthetic scheme of PCBNAPA is shown in the following (A-7).

By a train sublimation method, 0.84 g of the obtained yellow solid was purified. For sublimation purification conditions, the pale yellow solid was heated at 380° C. under a pressure of 4.5 Pa with a flow rate of argon gas of 5 mL/min. After the sublimation purification, 0.76 g of a yellow prismatic crystal which was the desired substance was recovered in 91% yield.

Figure 11A:
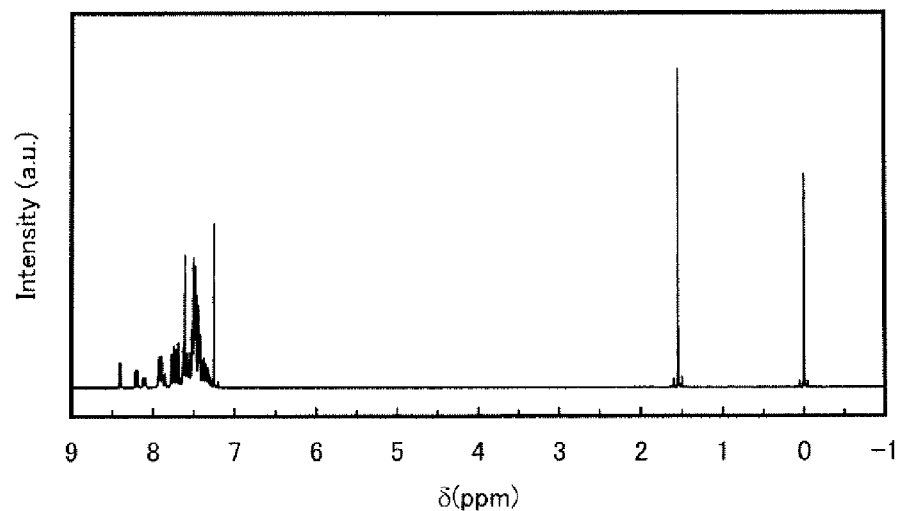
FIGS. 11A and 11B show $^1$H NMR charts of 4-(1-naphthyl)-4'-(10-phenyl-9-anthryl)-4''-(9-phenyl-9H-carbazol-3-yl)triphenylamine (abbreviated to PCBNAPA).
Figure 11B:
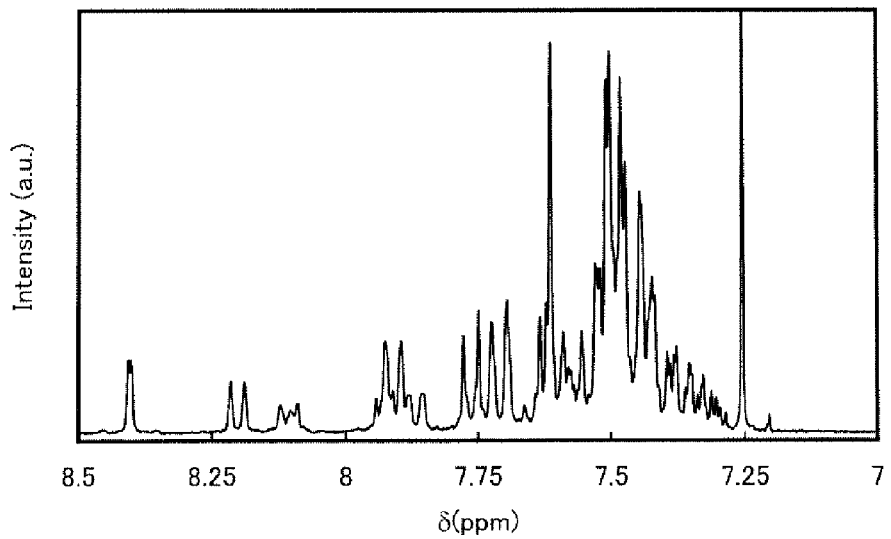

The solid obtained in the above Step 7 was analyzed by $^1$H NMR. The $^1$H NMR chart is shown in FIGS. 11A and 11B. FIG. 11B is a chart in which the range of 7.0 ppm to 8.5 ppm in FIG. 11A is expanded. From the measurement results, it is confirmed that PCBNAPA, the material for a light-emitting element which is one embodiment of the present invention, is obtained. The measurement data are shown below.

$^1$H NMR (CDCl$_3$, 300 MHz): δ=7.28-7.66 (m, 31H), 7.70-7.78 (m, 6H), 7.85-7.94 (m, 4H), 8.09-8.12 (m, 1H), 8.20 (d, J=7.8 Hz, 1H), 8.40 (d, J=1.2 Hz, 1H).

The thermogravimetry-differential thermal analysis (TG-DTA) of the obtained PCBNAPA was carried out. The measurement was conducted by using a high vacuum differential type differential thermal balance (manufactured by Bruker AXS K.K., TG/DTA 2410SA). The measurement was carried under a nitrogen stream (flow rate: 200 mL/min) and a normal pressure at a temperature rising rate of 10° C/min. From the relationship between the weight change and the temperature (thermogravimetry), it is understood that a 5% weight loss temperature is higher than 500° C., which is indicative of high thermal stability.

Figure 12:
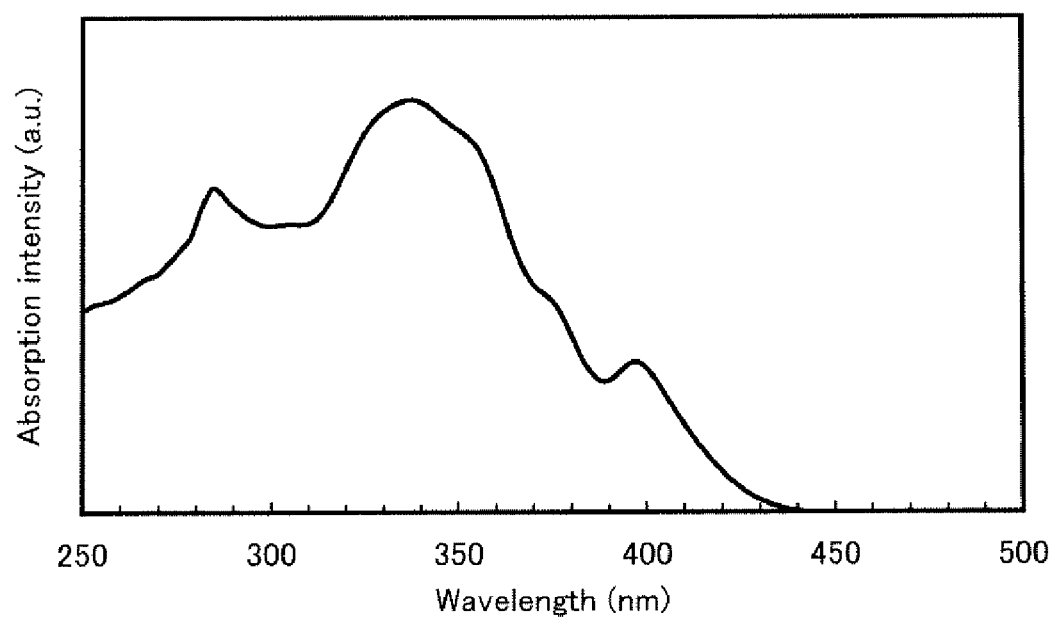
FIG. 12 shows an absorption spectrum of a toluene solution of 4-(1-naphthyl)-4'-(10-phenyl-9-anthryl)-4"-(9-phenyl-9H-carbazol-3-yl)triphenylamine (abbreviated to PCB-NAPA).
Figure 13:
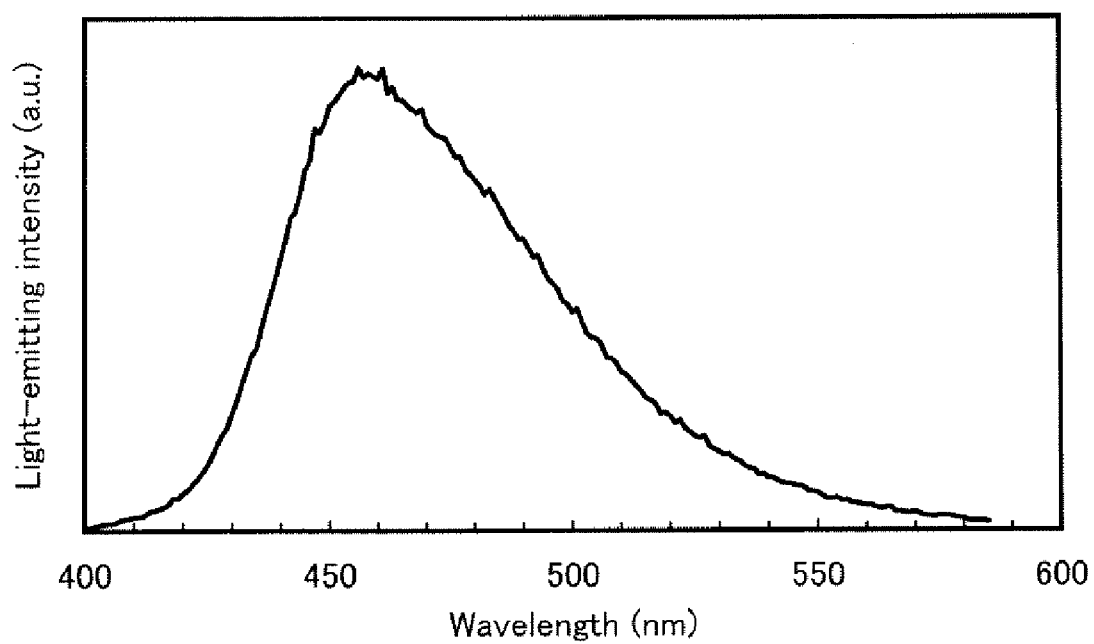
FIG. 13 shows an emission spectrum of a toluene solution of 4-(1-naphthyl)-4'-(10-phenyl-9-anthryl)-4"-(9-phenyl-9H-carbazol-3-yl)triphenylamine (abbreviated to PCB-NAPA).

The absorption spectrum and the emission spectrum of a toluene solution of PCBNAPA are shown in FIG. 12 and FIG. 13, respectively. An ultraviolet-visible spectrophotometer (V-550, by JASCO Corporation) was used for the measurement of the absorption spectrum of the toluene solution in a quartz cell. The absorption spectrum was obtained after subtracting an absorption spectrum of toluene in the quartz cell. In FIG. 12, the horizontal axis represents wavelength (nm) and the vertical axis represents absorption intensity (arbitrary unit). In FIG. 13, the horizontal axis represents wavelength (nm) and the vertical axis represents light emission intensity (arbitrary unit). Absorption is observed around 337 nm, 375 nm, and 397 nm for the toluene solution. The maximum emission wavelength of the solution was 457 nm (excitation wavelength: 370 nm).

Figure 14:
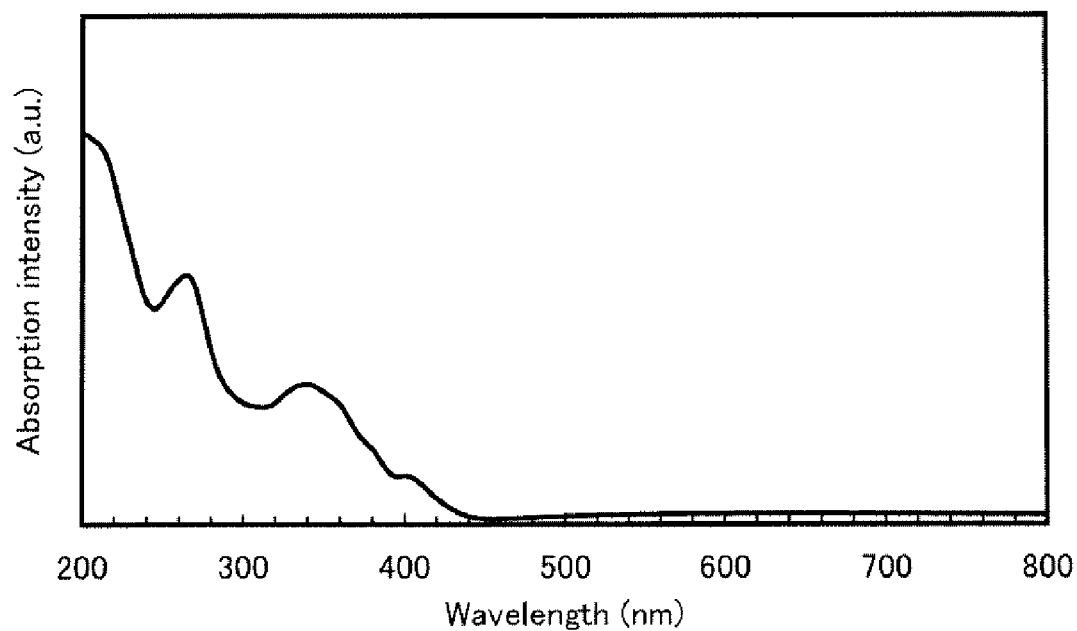
FIG. 14 shows an absorption spectrum of a thin film of 4-(1-naphthyl)-4'-(10-phenyl-9-anthryl)-4"-(9-phenyl-9H-carbazol-3-yl)triphenylamine (abbreviated to PCBNAPA).
Figure 15:
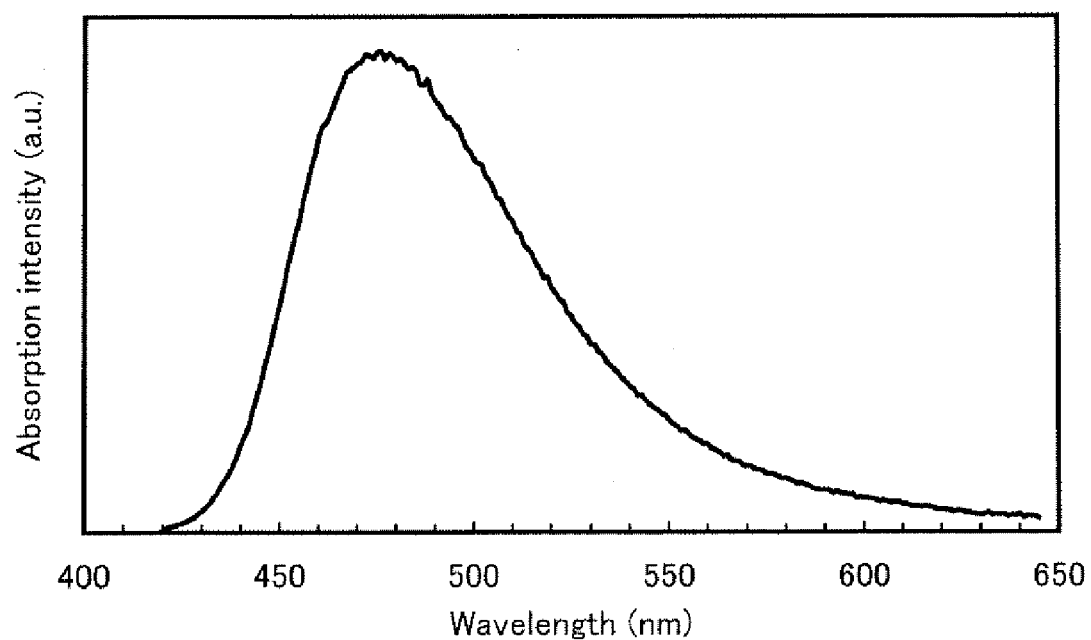
FIG. 15 shows an emission spectrum of a thin film of 4-(1-naphthyl)-4'-(10-phenyl-9-anthryl)-4"-(9-phenyl-9H-carbazol-3-yl)triphenylamine (abbreviated to PCBNAPA).

The absorption spectrum and the emission spectrum of a thin film of PCBNAPA are shown in FIG. 14 and FIG. 15, respectively. An ultraviolet-visible spectrophotometer (V-550, by JASCO Corporation) was used for the measurement of the absorption spectrum. The sample was prepared by evaporation on a quartz substrate for measurement. The absorption spectrum was obtained after subtracting an absorption spectrum of the quartz cell. In FIG. 14, the horizontal axis represents wavelength (nm) and the vertical axis represents absorption intensity (arbitrary unit). In FIG. 15, the horizontal axis represents wavelength (nm) and the vertical axis represents light emission intensity (arbitrary unit). In the case of the thin film, absorption was observed around 339 nm, 357 nm, 375 nm, and 401 nm. The maximum emission wavelength was 476 nm (excitation wavelength: 401 nm) in the case of the thin film.

As discussed above, the measurements reveal that PCBNAPA, the material for a light-emitting element which is represented by the structural formula (101) and is one embodiment of the present invention, exhibits blue light emission of a sufficiently short wavelength and with favorable chromaticity both in solution and in the thin film state.

The oxidation characteristic and reduction characteristic of PCBNAPA were evaluated. The oxidation characteristic and reduction characteristic were evaluated by cyclic voltammetry (CV) measurement. An electrochemical analyzer (ALS model 600A, BAS Inc.) was used for the measurement.

The solution for the CV measurement was prepared by using dehydrated N,N-dimethylformamide (DMF) (produced by Sigma-Aldrich Corp., 99.8%, catalog number: 22705-6) as a solvent, dissolving a supporting electrolyte of tetra-n-butylammonium perchlorate (n-Bu$_4$NClO$_4$) (produced by Tokyo Chemical Industry Co., Ltd., catalog number: T0836) at a concentration of 100 mmol/L, and dissolving the sample at a concentration of 1 mmol/L. A platinum electrode (a PTE platinum electrode, BAS Inc.) was used as a work electrode, a platinum electrode (a VC-3 Pt counter electrode (5 cm), BAS Inc.) was used as an auxiliary electrode, and an Ag/Ag$^-$ electrode (an RE5 non-aqueous solvent reference electrode, BAS Inc.) was used as a reference electrode. The measurement was carried out at room temperature. The scan speed at this CV measurement was set to 0.1 V/s.

The reduction characteristics of PCBNAPA were evaluated by 100 measurement cycles where the potential of the working electrode with respect to the reference electrode was scanned from −1.22 V to −2.40 V and then scanned from −2.40 V to −1.22 V in each of the cycles. Similarly, the oxidation characteristics were evaluated by 100 measurement cycles where the potential was scanned from 0.28 V to 0.60 V and then scanned from 0.60 V to 0.28 V in each of the cycles.

Figure 16A:
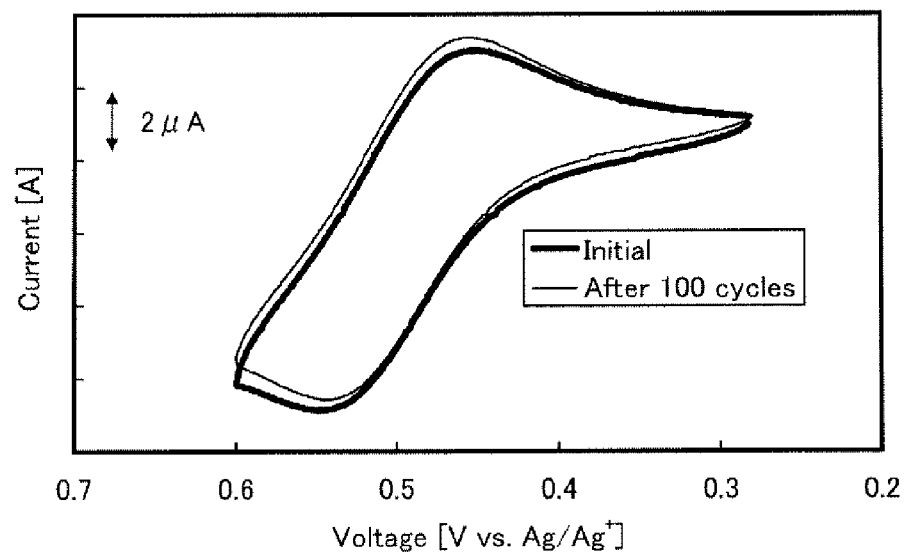
FIGS. 16A and 16B each show a CV chart of a DMF solution of 4-(1-naphthyl)-4'-(10-phenyl-9-anthryl)-4"-(9-phenyl-9H-carbazol-3-yl)triphenylamine (abbreviated to PCBNAPA).
Figure 16B:
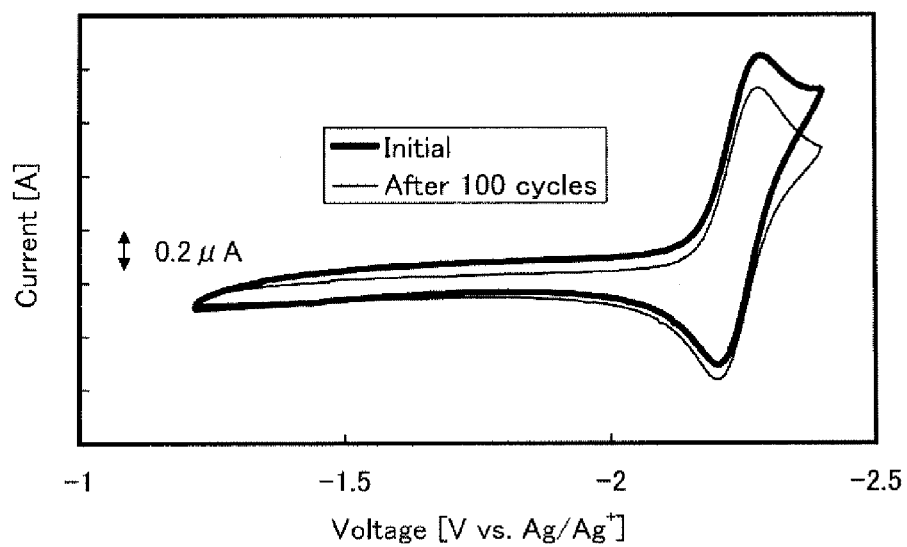

FIGS. 16A and 16B show CV measurement results of the oxidation characteristic and reduction characteristic of PCBNAP, respectively. In FIGS. 16A and 16B, the horizontal axis represents potential (V) of the working electrode with respect to the reference electrode, and the vertical axis represents the value of current (μA) which flows between the working electrode and the auxiliary electrode.

It can be understood from FIG. 16A that the current corresponding to the oxidation is observed around 0.50 V (vs. Ag/Ag+) and from FIG. 16B that the current corresponding to the reduction is observed around −2.24 V (vs. Ag/Ag+).

Although the scan was repeated as many as 100 cycles, PCBNAPA showed no significant change in the peak position and peak intensity of the CV curves in the oxidation and the reduction. The peak intensity remained 96% of the initial state on the oxidation side and 86% of the initial state on the reduction side. Thus, it is understood that PCBNAPA is relatively stable even when an oxidation from a neutral state to an oxidized state and a reduction from the oxidized state to the neutral state are repeated and when a reduction from the neutral state to a reduced state and an oxidation from the reduced state to the neutral state are repeated.

The results of the measurement of the thin film of PCBNAPA by photoelectron spectrometry (AC-2, product of Riken Keiki Co., Ltd.) under air indicate that the HOMO level of PCBNAPA is −5.47 eV. The absorption edge was obtained from Tauc plot, with an assumption of direct transition, using data on the absorption spectrum in FIG. 14, and the energy gap thereof was estimated to be 2.92 eV assuming that the absorption edge corresponds to the optical energy gap. The LUMO level was found to be −2.55 eV by calculation from the value of the energy gap and the HOMO level. As thus described, it is found that PCBNAPA has a large energy gap of 2.92 eV.

EXAMPLE 2

In this example, specific explanation is given for the synthetic method of 4-[4-(1-naphthyl)phenyl]-4'-(10-phenyl-9-anthryl)-4"-(9-phenyl-9H-carbazol-3-yl)triphenylamine (abbreviated to PCBNBAPA), which is a material for a light-emitting element according to one embodiment of the present invention.

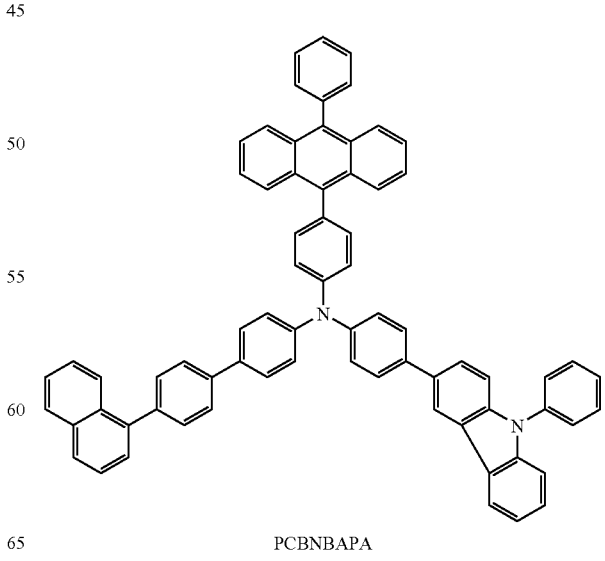

PCBNBAPA

Step 1: Synthesis of 4'-(1-naphthyl)biphenyl-4-amine

In a 50 mL three-neck flask were put 0.70 g (4 mmol) of 4-bromoaniline, 1.0 g (4 mmol) of 4-(1-naphthyl)phenylboronic acid, and 61.8 mg (0.2 mmol) of tris(o-tolyl)phosphine, and nitrogen substitution in the flask was carried out. To the mixture were added 14 mL of toluene, 6 mL of ethanol, and 4 mL of an aqueous solution of potassium carbonate (2 mol/L). The mixture was stirred to be degassed under a reduced pressure, and then the temperature of the mixture was raised to 60° C., which was followed by addition of 11.9 mg (0.05 mmol) of palladium(II) acetate. This mixture was stirred at 80° C. for 1.5 hours. After the reaction, toluene and water were added to the mixture, the organic layer and the aqueous layer were separated from each other, and the aqueous layer was extracted twice with toluene. The obtained extract and the organic layer were combined, washed with brine, and dried with magnesium sulfate. The mixture was subjected to gravity filtration to remove magnesium sulfate, and the filtrate was concentrated to obtain an oily product. The oily product was subjected to suction filtration through Florisil (produced by Wako Pure Chemical Industries, Ltd., Catalog No. 540-00135), Celite (produced by Wako Pure Chemical Industries, Ltd., Catalog No. 531-16855), and alumina, resulting in a filtrate. The filtrate obtained was concentrated to give 1.1 g of an oily product which was the desired substance in 95% yield. The synthetic scheme of 4'-(1-naphthyl)biphenyl-4-amine is shown in the following (B-1).

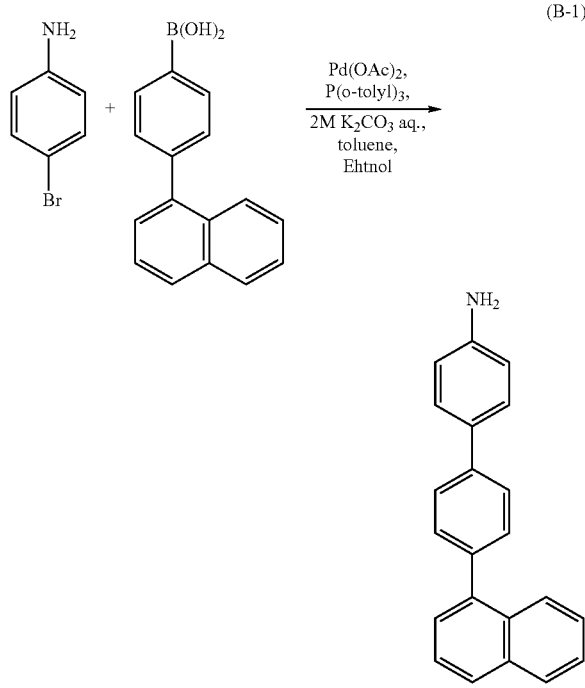

Step 2: Synthesis of 4-[4-(1-naphthyl)phenyl]-4'-(9-phenyl-9H-carbazol-3-yl)diphenylamine (abbreviated to PCBNBA)

In a 50 mL three-neck flask was added 1.1 g (11.4 mmol) of sodium tert-butoxide, and nitrogen substitution in the flask was carried out. After 1.1 g (3.8 mmol) of 4'-(1-naphthyl)biphenyl-4-amine dissolved in 12 mL of toluene and 1.5 g (3.8 mmol) of 3-(4-bromophenyl)-9-phenyl-9H-carbazole dissolved in 18 mL of toluene were put in the flask, 0.2 mL of tri(tert-butyl)phosphine (a 10 wt % of hexane solution) was added. After the mixture was stirred at 60° C., 35.5 mg (0.06 mmol) of bis(dibenzylideneacetone)palladium(0) was added. Then, this mixture was heated with stirring at 80° C. for 4.5 hours. After the reaction, the mixture was subjected to suction filtration through Florisil (produced by Wako Pure Chemical Industries, Ltd., Catalog No. 540-00135), Celite (produced by Wako Pure Chemical Industries, Ltd., Catalog No. 531-16855), and alumina, resulting in a filtrate. The filtrate was concentrated, and the resulting solid was purified by silica gel column chromatography (the developing solvent containing a 1:1 ratio of chloroform to hexane). The fractions obtained were concentrated to obtain 1.8 g of a brown solid which was the desired substance in 76% yield. The synthetic scheme of PCBNBA is shown in the following (B-2).

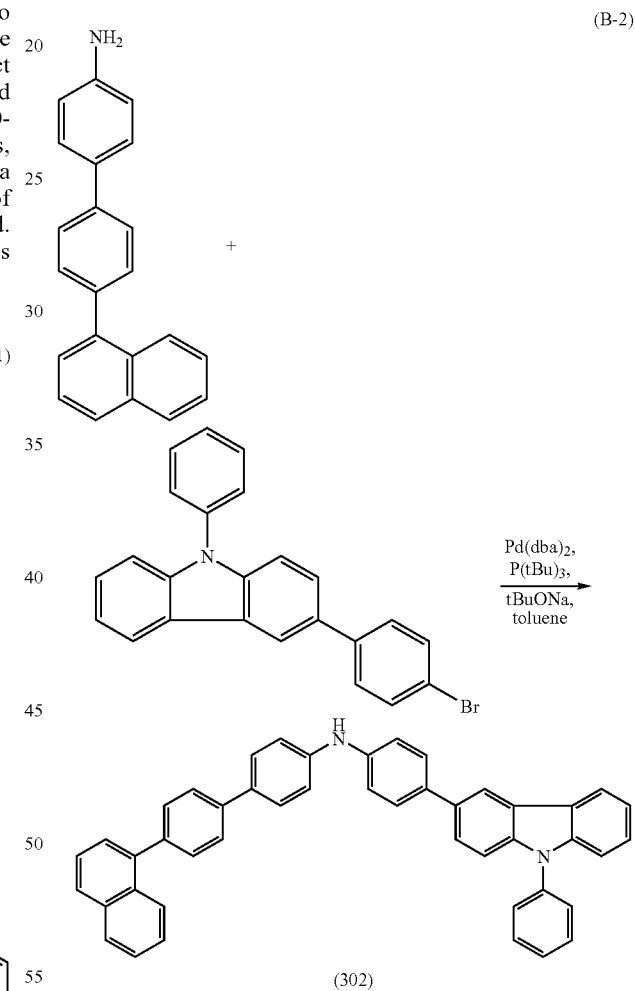

Figure 17A:
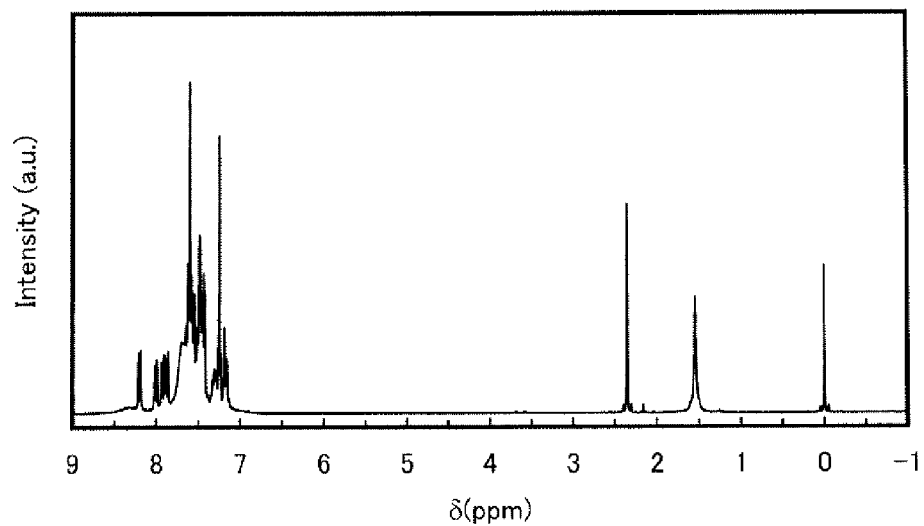
FIGS. 17A and 17B show $^1$H NMR charts of 4-[4-(1-naphthyl)phenyl]-4'-(9-phenyl-9H-carbazol-3-yl)diphenylamine (abbreviated to PCBNBA).
Figure 17B:
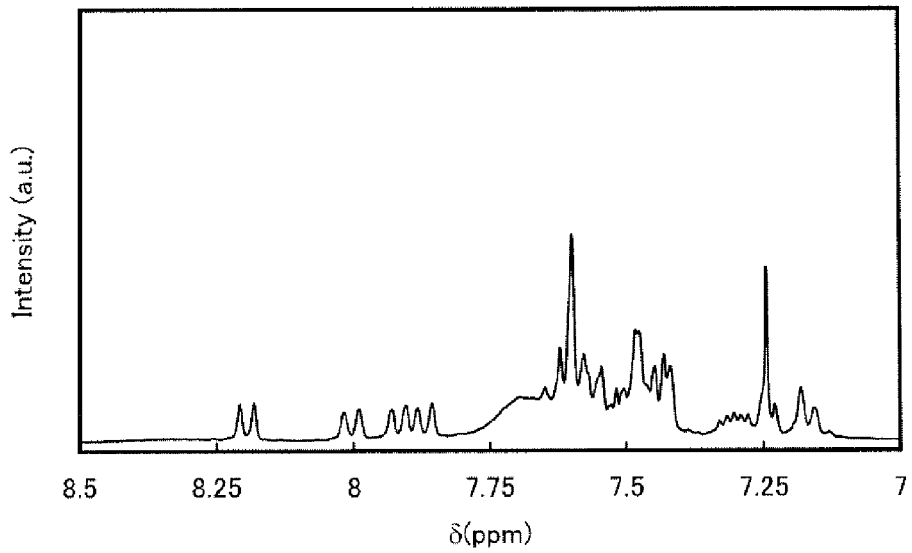

The solid obtained in the above Step 2 of Example 2 was analyzed by nuclear magnetic resonance spectroscopy (NMR). The $^1$H NMR chart is shown in FIGS. 17A and 17B. FIG. 17B is a chart in which the range of 7.0 ppm to 8.5 ppm in FIG. 17A is expanded. The measurement results reveal that PCBNBA which is a starting material of PCBNBAPA, the material for a light-emitting element according to one embodiment of the present invention, was obtained. The $^1$H NMR data are shown blow.

$^1$H NMR (CDCl$_3$, 300 MHz): δ=7.28-7.70 (m, 28H), 7.87 (d, J=7.8 Hz, 1H), 7.92 (d, J=7.8 Hz, 1H), 8.01 (d, J=7.8 Hz, 1H), 8.20 (d, 7.8 Hz, 1H).

Step 3: Synthesis of 4-[4-(1-naphthyl)phenyl]-4'-(10-phenyl-9-anthryl)-4''-(9-phenyl-9H-carbazol-3-yl) triphenylamine (abbreviated to PCBNBAPA)

In a 50 mL three-neck flask were put 0.60 g (1.5 mmol) of 9-(4-bromophenyl)-10-phenylanthracene, 0.40 g (4.4 mmol) of sodium tert-butoxide, and 0.90 g (1.5 mmol) of PCBNBA, and nitrogen substitution in the flask was carried out. To the mixture were added 10 mL of toluene and 0.10 mL of tri(tert-butyl)phosphine (a 10 wt % hexane solution). After the mixture was stirred at 60° C., 42 mg (7.3 mmol) of bis(dibenzylideneacetone)palladium(0) was added. This mixture was stirred at 80° C. for 6 hours. After stirring the mixture, 23 mg (0.04 mmol) of bis(dibenzylideneacetone)palladium(0) was further added thereto, and the stirring at 95° C. was further conducted for 1 hour. After the reaction, the mixture was subjected to suction filtration through Florisil (produced by Wako Pure Chemical Industries, Ltd., Catalog No. 540-00135), Celite (produced by Wako Pure Chemical industries, Ltd., Catalog No. 531-16855), and alumina, and the resulting filtrate was concentrated to give a solid. The solid was purified by silica gel column chromatography (the developing solvent containing a 3:7 ratio of hexane to toluene), giving a yellow solid which was the desired substance. The obtained solid was recrystallized with a mixed solvent of chloroform and hexane to give 0.70 g of a pale yellow powder which was the desired substance in 52% yield. The synthetic scheme of PCBNBAPA is shown in the following (B-3).

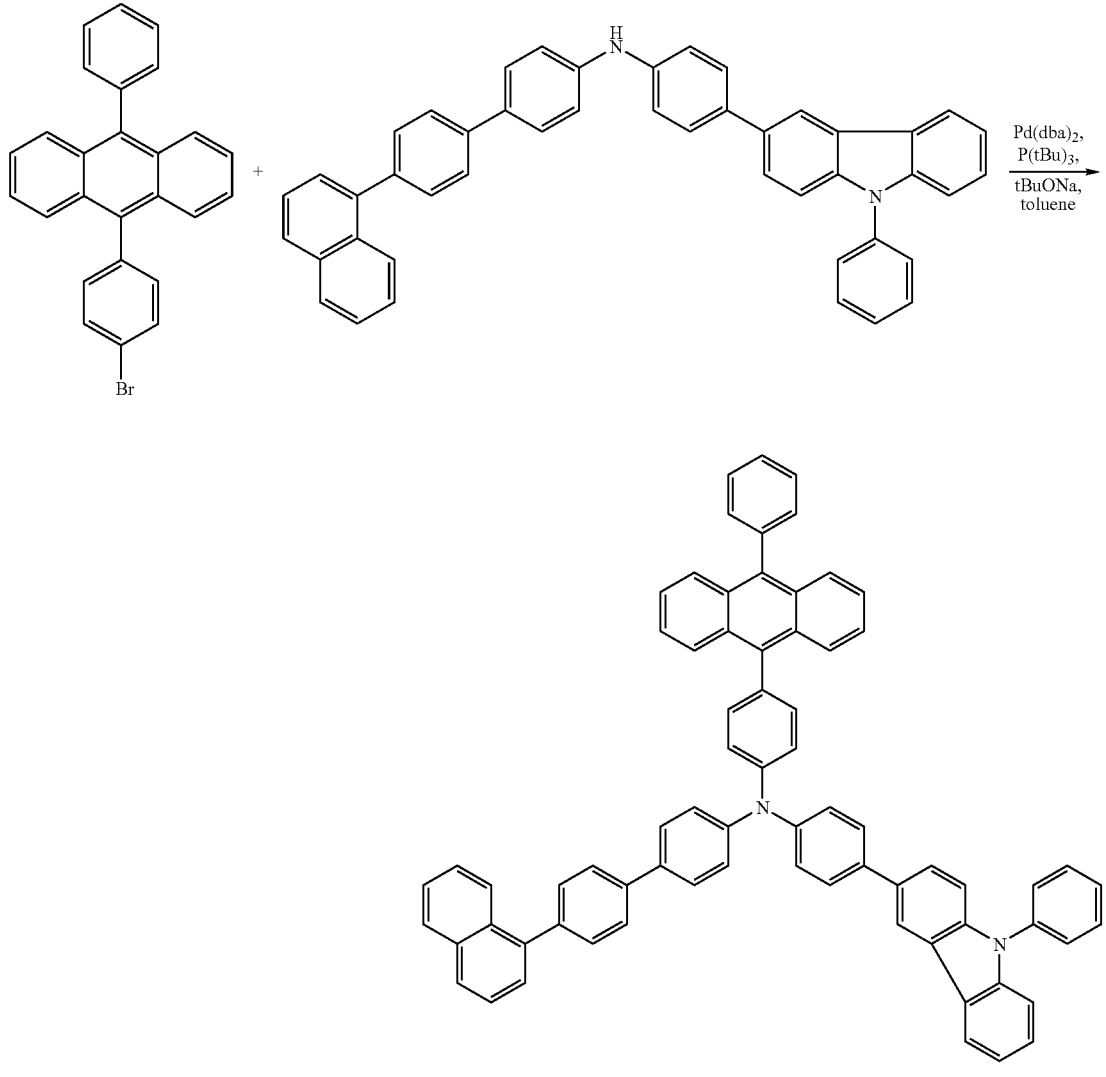

(B-3)

(103)

Then, 0.70 g of the obtained yellow solid was purified by a train sublimation method. Under the sublimation conditions of the pressure of 4.2 Pa and the argon gas flow rate of 10 mL/min, the pale yellow solid was heated at 430° C. After the sublimation purification, 0.50 g of a yellow prismatic crystal which was the desired substance was recovered in 68% yield.

Figure 18A:
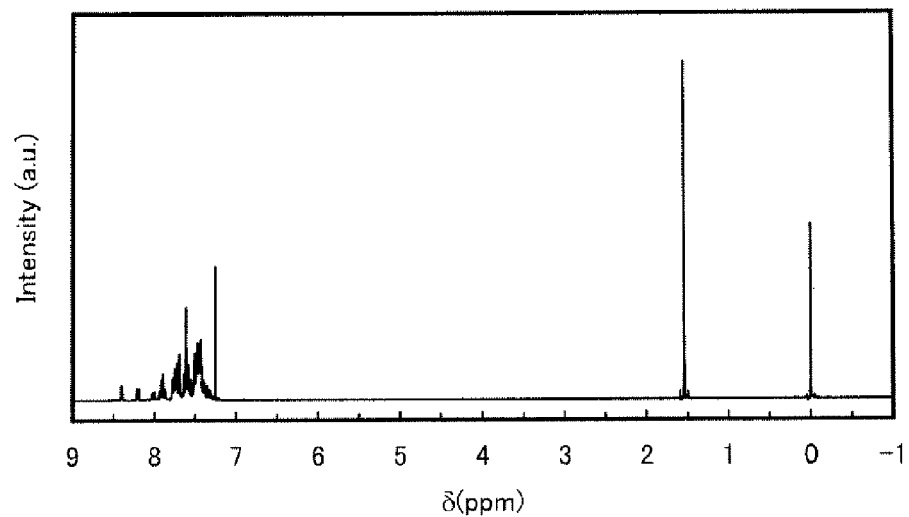
FIGS. 18A and 18B show $^1$H NMR charts of 4-[4-(1-naphthyl)phenyl]-4'-(10-phenyl-9-anthryl)-4"-(9-phenyl-9H-carbazol-3-yl)triphenylamine (abbreviated to PCBNBAPA).
Figure 18B:
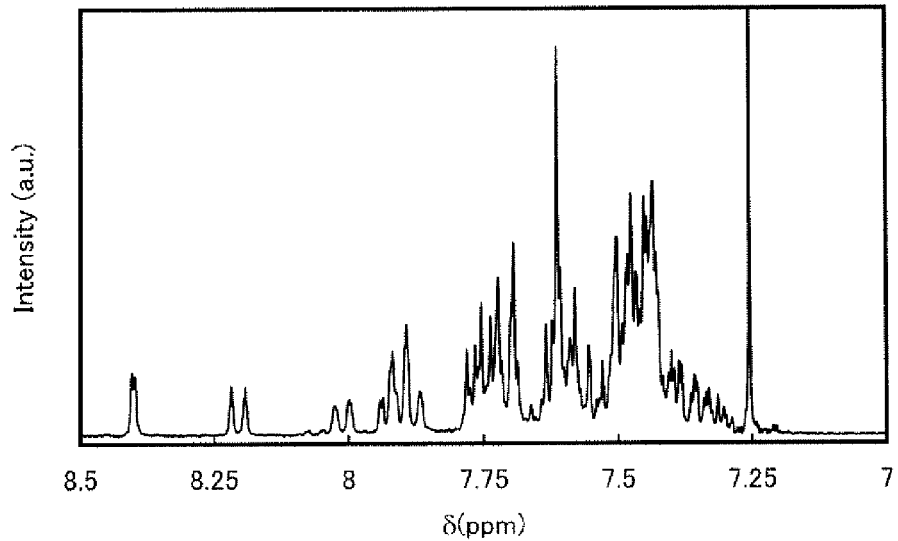

The solid obtained in the above Step 3 of Example 2 was analyzed by nuclear magnetic resonance spectroscopy (NMR). $^1$H-NMR chart is shown in FIGS. 18A and 18B. FIG. 18B is a chart in which the range of 7.0 ppm to 8.5 ppm in FIG. 18A is expanded. From the measurement results, it can be confirmed that the material for a light-emitting element PCBNBAPA which is one embodiment of the present invention and represented by the above structural formula (103) was obtained. The ¹H NMR data are shown blow.

¹H NMR (CDCl₃, 300 MHz): δ=7.31-7.78 (m, 41H), 7.87-7.94 (m, 4H), 8.01 (d, J=8.1 Hz, 1H), 8.21 (d, J=7.8 Hz, 1H), 8.42 (d, J=0.9 Hz, 1H).

The thermogravimetry-differential thermal analysis (TG-DTA) of the thus obtained PCBNBAPA was carried out. The measurement was conducted by using a high vacuum differential type differential thermal balance (manufactured by Balker AXS K.K., TG/DTA 2410SA). The measurement was carried under a nitrogen stream (flow rate: 200 mL/min) and a normal pressure at a temperature rising rate of 10° C./min. From the relationship between the weight change and the temperature (thermogravimetry), it is understood that a 5% weight loss temperature is higher than 500° C., which is indicative of high thermal stability.

Figure 19:
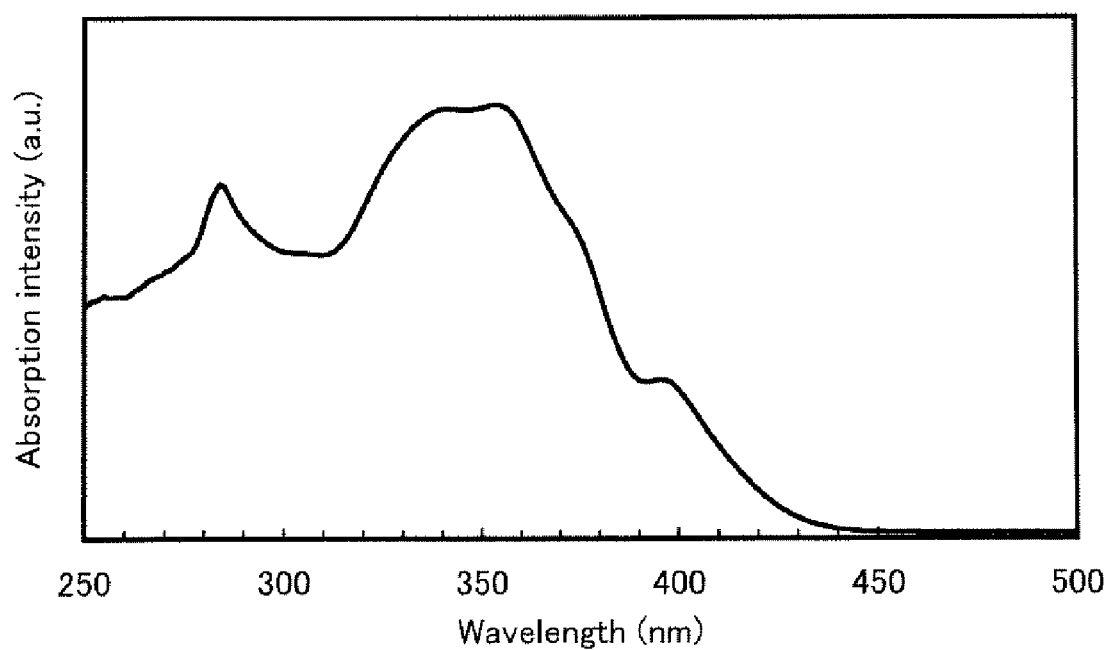
FIG. 19 shows an absorption spectrum of a toluene solution of 4-[4-(1-naphthyl)phenyl]-4'-(10-phenyl-9-anthryl)-4"-(9-phenyl-9H-carbazol-3-yl)triphenylamine (abbreviated to PCBNBAPA).
Figure 20:
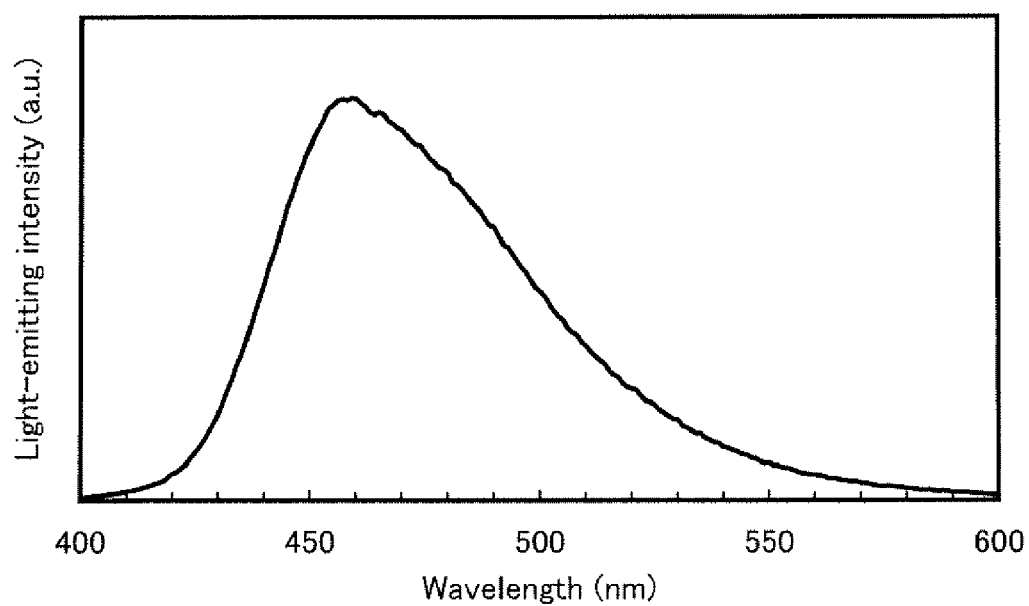
FIG. 20 shows an emission spectrum of a toluene solution of 4-[4-(1-naphthyl)phenyl]-4'-(10-phenyl-9-anthryl)-4"-(9-phenyl-9H-carbazol-3-yl)triphenylamine (abbreviated to PCBNBAPA).

The absorption spectrum and the emission spectrum of a toluene solution of PCBNBAPA are shown in FIG. 19 and FIG. 20, respectively. An ultraviolet-visible spectrophotometer (V-550, by JASCO Corporation) was used for the measurement of the absorption spectrum of the solution in a quartz cell in measurement. The absorption spectrum was obtained after subtracting an absorption spectrum of toluene in the quartz cell. In FIG. 19, the horizontal axis represents wavelength (nm) while the vertical axis represents absorption intensity (arbitrary unit). In FIG. 20, the horizontal axis represents wavelength (nm) and the vertical axis represents emission intensity (arbitrary unit). Absorption is observed around 353 nm and 395 nm for the toluene solution. The maximum emission wavelength of the solution was 459 nm (excitation wavelength: 370 nm).

Figure 21:
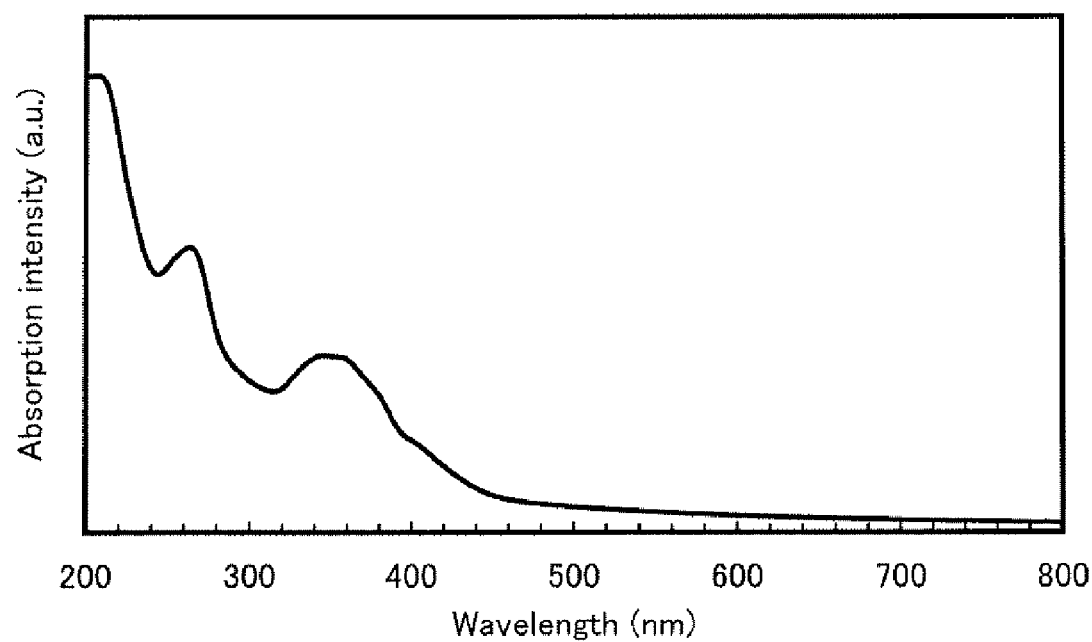
FIG. 21 shows an absorption spectrum of a thin film of 4-[4-(1-naphthyl)phenyl]-4'-(10-phenyl-9-anthryl)-4"-(9-phenyl-9H-carbazol-3-yl)triphenylamine (abbreviated to PCBNBAPA).
Figure 22:
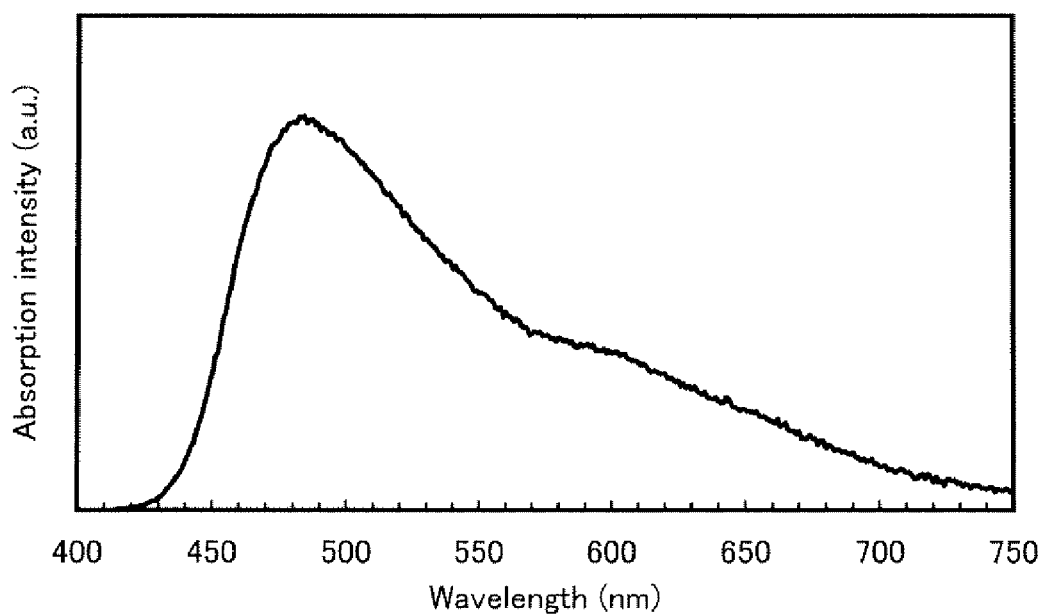
FIG. 22 shows an emission spectrum of a thin film of 4-[4-(1-naphthyl)phenyl]-4'-(10-phenyl-9-anthryl)-4"-(9-phenyl-9H-carbazol-3-yl)triphenylamine (abbreviated to PCBNBAPA).

The absorption spectrum and the emission spectrum of a thin film of PCBNBAPA are shown in FIG. 21 and FIG. 22, respectively. An ultraviolet-visible spectrophotometer (V-550, by JASCO Corporation) was used for the measurement of the absorption spectrum. The sample was prepared by evaporation on a quartz substrate for measurement. The absorption spectrum illustrated was obtained after subtracting an absorption spectrum of the quartz cell. In FIG. 21, the horizontal axis represents wavelength (nm) and the vertical axis represents absorption intensity (arbitrary unit). In FIG. 22, the horizontal axis represents wavelength (nm) and the vertical axis represents light emission intensity (arbitrary unit). In the case of the thin film, absorption was observed around 354 nm and 403 nm. The maximum emission wavelength was 483 nm (excitation wavelength: 400 nm) in the case of the thin film.

As discussed above, it is found that PCBNBAPA, the material for a light-emitting element which is represented by the structural formula (103) and is one embodiment of the present invention, exhibits blue light emission of a sufficiently short wavelength and with favorable chromaticity both in solution and in the thin film state.

The oxidation characteristic and reduction characteristic of PCBNBAPA were evaluated. The oxidation characteristic and reduction characteristic were evaluated by cyclic voltammetry (CV) measurement. An electrochemical analyzer (ALS model 600A, BAS Inc.) was used for the measurement.

The solution for the CV measurement was prepared by using dehydrated N,N-dimethylformamide (DMF) (produced by Sigma-Aldrich Corp., 99.8%, catalog number: 22705-6) as a solvent, dissolving a supporting electrolyte of tetra-n-butylammonium perchlorate (n-Bu₄NClO₄) (produced by Tokyo Chemical Industry Co., Ltd., catalog number: T0836) at a concentration of 100 mmol/L, and dissolving the sample at a concentration of 1 mmol/L. A platinum electrode (a PTE platinum electrode, BAS Inc.) was used as a work electrode, a platinum electrode (a VC-3 Pt counter electrode (5 cm). BAS Inc.) was used as an auxiliary electrode, and an Ag/Ag⁺ electrode (an RE5 non-aqueous solvent reference electrode, BAS Inc.) was used as a reference electrode.

The measurement was carried out at room temperature. The scan speed at this CV measurement was set to 0.1 V/s.

The reduction characteristics of PCBNBAPA were examined by 100 measurement cycles where the potential of the working electrode with respect to the reference electrode was scanned from −1.24 V to −2.35 V and then scanned from −2.35 V to −1.24 V in each of the cycles. Similarly, the oxidation characteristics were examined by 100 measurement cycles where the potential was scanned from 0.04 V to 0.58 V and then scanned from 0.58 V to 0.04 V in each of the cycles.

Figure 23A:
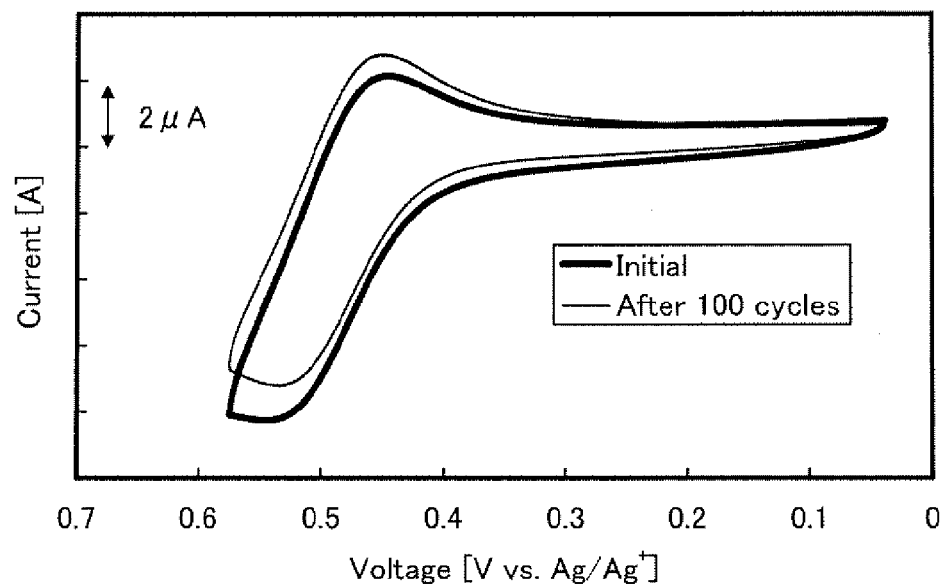
FIGS. 23A and 23B each show a CV chart of a DMF solution of 4-[4-(1-naphthyl)phenyl]-4'-(10-phenyl-9-anthryl)-4"-(9-phenyl-9H-carbazol-3-yl)triphenylamine (abbreviated to PCBNBAPA).
Figure 23B:
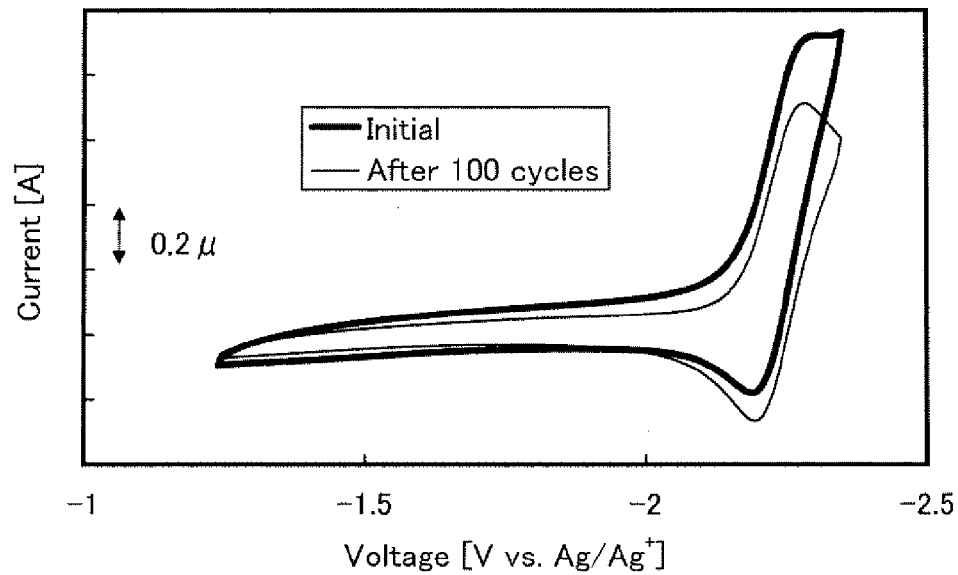

FIG. 23A shows CV measurement results of the oxidation characteristic of PCBNBAPA and FIG. 23B shows CV measurement results of the reduction characteristic of PCBNBAPA. In FIGS. 23A and 23B, the horizontal axis represents potential (V) of the working electrode with respect to the reference electrode, and the vertical axis represents the value of current (μA) which flows between the working electrode and the auxiliary electrode.

It can be understood from FIG. 23A that current corresponding to the oxidation is observed around 0.50 V (vs. Ag/Ag+) and from FIG. 23B that current corresponding to the reduction is observed around −2.24 V (vs. Ag/Ag+).

Although the scan was repeated as many as 100 cycles, FCBNBAPA showed no significant change in the peak position and peak intensity of the CV curves in the oxidation and the reduction. The peak intensity remained 87% of the initial state on the oxidation side and 78% of the initial state on the reduction side. Thus, it is understood that PCBNBAPA is relatively stable even when an oxidation from a neutral state to an oxidized state and a reduction from the oxidized state to the neutral state are repeated and when a reduction from the neutral state to a reduced state and an oxidation reaction from the reduced state to the neutral state are repeated.

The results of the measurement of the thin film of PCBNBAPA by photoelectron spectrometry (AC-2, product of Riken Keiki Co., Ltd.) under air indicate that the HOMO level of PCBNAPA is −5.43 eV. The absorption edge was obtained from Tauc plot, with an assumption of direct transition, using data on the absorption spectrum in FIG. 21, and the energy gap thereof was estimated to be 2.84 eV assuming that the absorption edge corresponds to the optical energy gap. The LUMO level was found to be −2.59 eV by calculation from the value of the energy gap and the HOMO level. As thus described, it is found that PCBNBAPA has a large energy gap of 2.84 eV.

EXAMPLE 3

Figure 9A:
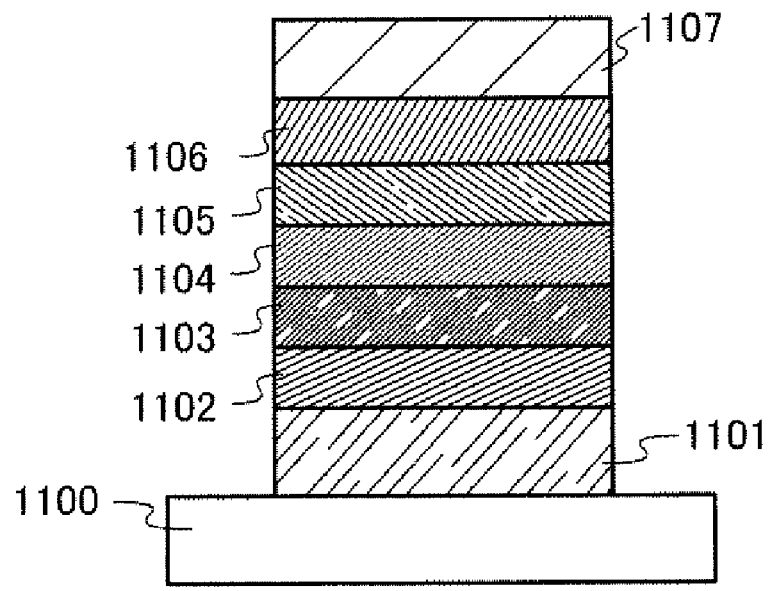
FIGS. 9A and 9B each illustrate a light-emitting element according to one embodiment of the present invention.
Figure 9B:
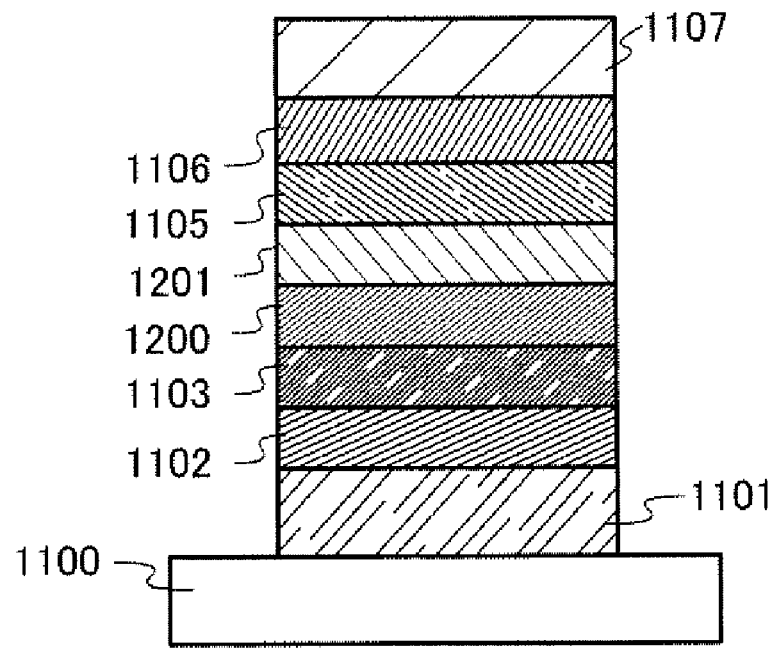

In the present example, an example of a light-emitting element of one embodiment of the present invention is described using FIGS. 9A and 9B. Chemical formulae of materials used in this example are shown below.

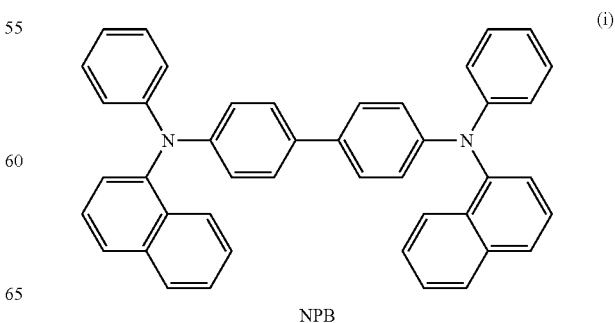

NPB (ii)

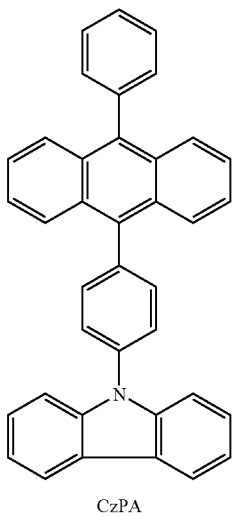

CzPA

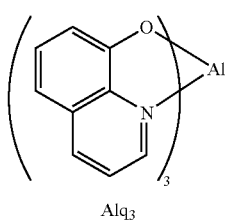

Alq₃

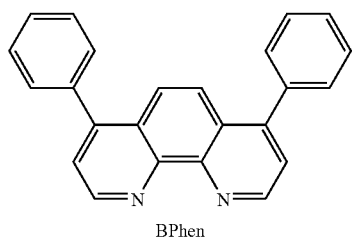

BPhen

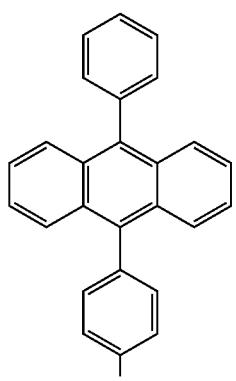

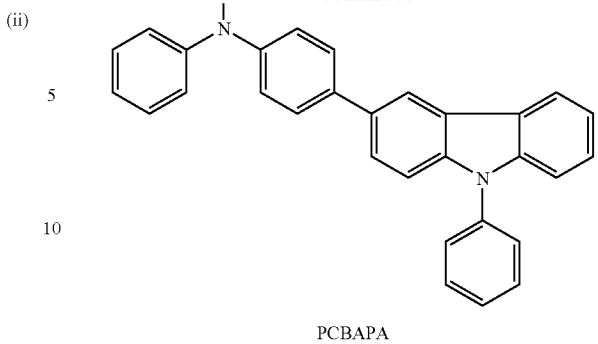

PCBAPA (Light-emitting Element 1)

The structure of the light-emitting element 1 is explained with reference to FIG. 9A. First, indium tin oxide including silicon oxide was deposited over a glass substrate 1100 by a sputtering method to form a first electrode 1101. The thickness and the area of the first electrode 1101 were set to be 110 nm and 2 mm×2 mm, respectively.

Next, the glass substrate 1100 was fixed to a substrate holder provided in a vacuum evaporation apparatus in such a way that a surface of the glass substrate 1100, over which the first electrode 1101 was formed, faced downward, and then the pressure was reduced to about $10^{-4}$ Pa. Then, 4,4′-bis[N-(1-naphthyl)-N-phenylamino]biphenyl (abbreviated to NPB) and molybdenum(VI) oxide were co-evaporated over the first electrode 1101, whereby a layer 1102 containing a composite material of an organic compound and an inorganic compound was formed. The film thickness of the layer 1102 was set to 50 nm, and the weight ratio between NPB and molybdenum oxide (=NPB:molybdenum oxide) was adjusted to be 4:1. Note that the co-evaporation method is an evaporation method in which evaporation of a plurality of materials is performed from a plurality of evaporation sources at the same time in one treatment chamber.

Next, NPB was deposited to a thickness of 10 nm over the layer 1102 containing the composite material by the evaporation method utilizing resistive heating, whereby a hole-transport layer 1103 was formed.

Further, by co-evaporation of 9-[4-(10-phenyl-9-anthryl) phenyl]-9H-carbazole (abbreviated to CzPA) and PCB-NAPA, a light-emitting layer 1104 was formed over the hole-transport layer 1103 to a thickness of 30 nm. The weight ratio of CzPA and PCBNAPA was adjusted so as to be 1:0.10 (=CzPA:PCBNAPA).

Then, tris(8-quinolinolato)aluminum (abbreviated to Alq) was deposited over the light-emitting layer 1104 to a thickness of 10 nm, and bathophenanthroline (abbreviated to BPhen) was deposited over the Alq layer to a thickness of 20 nm by the evaporation method utilizing resistive heating to form an electron-transport layer 1105 comprising Alq and BPhen.

Furthermore, lithium fluoride was deposited over the electron-transport layer 1105 to a thickness of 1 nm, whereby an electron-inject layer 1106 was formed.

Lastly, aluminum was deposited to a thickness of 200 nm over the electron-inject layer 1106 by the evaporation method utilizing resistive heating to form a second electrode 1107. Accordingly, the light-emitting element 1 was fabricated.

(Comparative Light-Emitting Element 1)

Next, a comparative light-emitting element 1 was prepared for comparison with the light-emitting element 1. The structure of the comparative light-emitting element 1 is explained with reference to FIG. 9A. The comparative light-emitting element 1 was prepared using 4-(10-phenyl-9-anthryl)-4'-(9-phenyl-9H-carbazolyl-3-yl)triphenylamine (abbreviated to PCBAPA) instead of PCBNAPA, which was one embodiment of the present invention, to form the light-emitting layer 1104 The weight ratio of CzPA and PCBAPA was adjusted so as to be 1:0.10 (=CzPA:PCBAPA). The structure of the comparative light-emitting element 1 is the same as the light-emitting element 1 with the exception of the light-emitting layer 1104.

Figure 24:
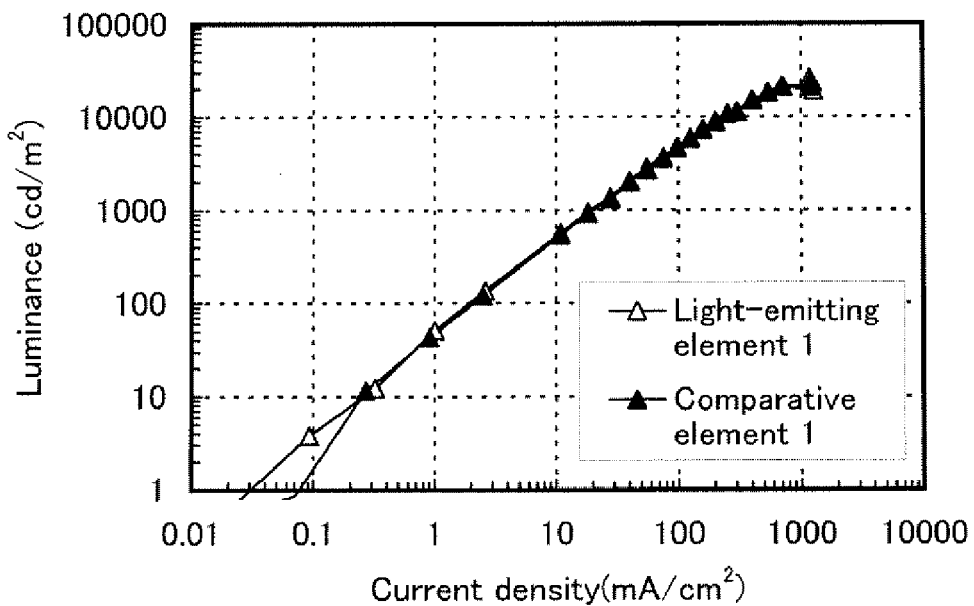
FIG. 24 shows current density-luminance characteristic of the light-emitting elements manufactured in Example 3.
Figure 25:
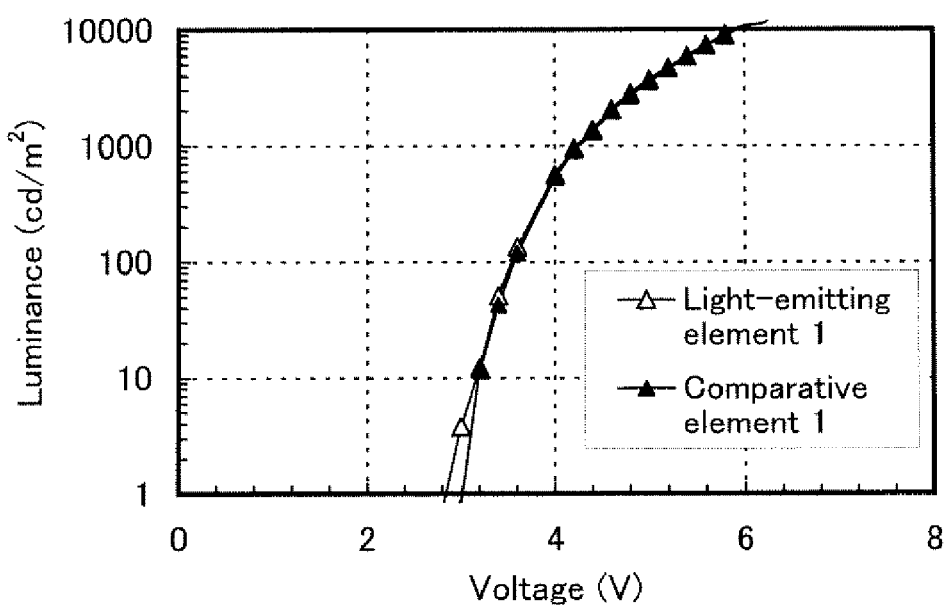
FIG. 25 shows voltage-luminance characteristics of the light-emitting elements manufactured in Example 3.
Figure 26:
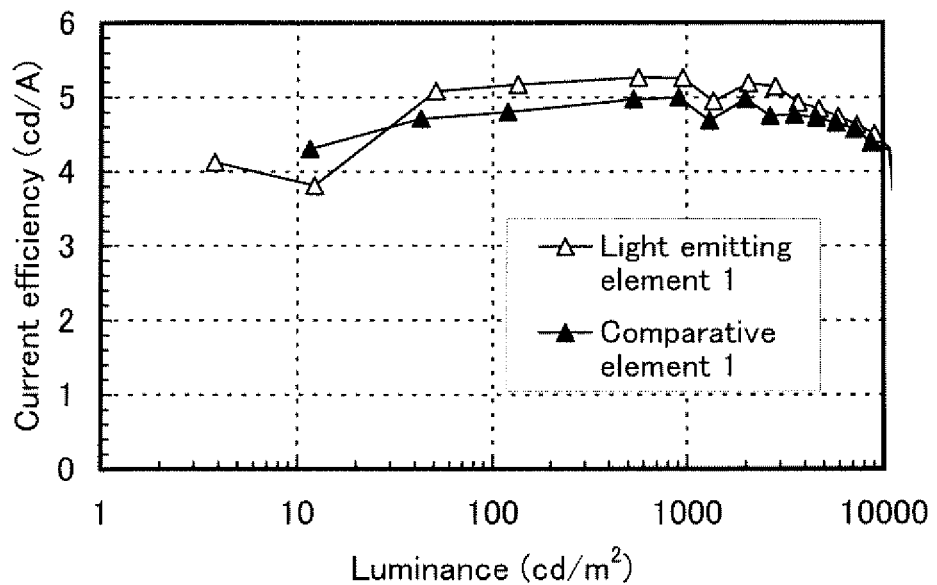
FIG. 26 shows luminance-current efficiency characteristics of the light-emitting elements manufactured in Example 3.
Figure 27:
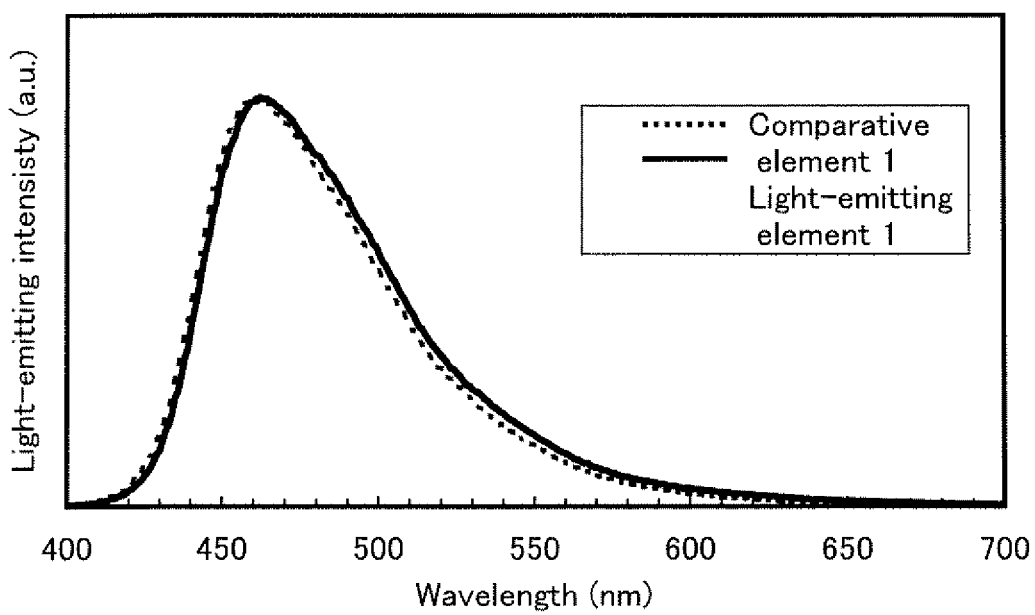
FIG. 27 shows emission spectra of the light-emitting elements manufactured in Example 3.

FIG. 24 shows current density-luminance characteristics, FIG. 25 shows voltage-luminance characteristics, FIG. 26 shows luminance-current efficiency characteristics, and FIG. 27 shows the emission spectra measured at a current of 1 mA of the light-emitting element 1 and the comparative light-emitting element 1. From FIG. 27, it is understood that the light emission of the light-emitting element 1 originates from PCBNAPA, while the light emission of the comparative light-emitting element 1 originates from PCBAPA. The CIE chromaticity coordinates of the light-emitting element 1 at a luminance of 960 cd/m$^2$ are (x, y)=(0.16, 0.20), which is indicative of blue emission with high color purity. FIG. 26 reveals that current efficiency of the light-emitting element 1 at a luminance of 960 cd/m$^2$ is 5.3 cd/A, which means that the light-emitting element 1 exhibits high current efficiency. FIG. 25 shows that the driving voltage at 960 cd/m$^2$ is 4.2 V, and power efficiency is 3.9 lm/W. From these results, it is found that a voltage required to obtain a certain luminance is low and power consumption is also low in the case of the light-emitting element L The CIE chromaticity coordinates of the comparative light-emitting element 1 at a luminance of 910 cd/m$^2$ are (x, y)=(0.15, 0.18), indicating that blue emission with high color purity is obtained. FIG. 26 reveals that current efficiency of the comparative light-emitting element 1 at a luminance of 910 cd/m$^2$ is 5.0 cd/A, which means that the comparative light-emitting element 1 exhibits relatively high current efficiency. FIG. 25 shows that the driving voltage at 910 cd/m$^2$ is 4.2 V, and power efficiency is 3.7 lm/W. From these results, it is found that a voltage required to obtain a certain luminance is low and power consumption is also low in the case of the comparative light-emitting element 1.

Comparison of the light-emitting element 1 with the comparative light-emitting element 1 shows that the light-emitting element 1 exhibits higher current efficiency than the comparative light-emitting element 1. The difference in structure of the emission material in the light-emitting layer between the light-emitting element 1 and the comparative light-emitting element 1 is whether an 1-naphthyl group is provided or not at the terminal of the amine skeleton which is included in the material for a light-emitting element as an emission material. Whether the 1-naphthyl group is provided or not results in the difference in emission efficiency between the light-emitting element 1 and the comparative light-emitting element 1. Accordingly, these results reveal that the 1-naphthyl group at the terminal of the amine skeleton of the material for a light-emitting element, which is one embodiment of the present invention, is effective in realizing high emission efficiency. Further, it is found that the use of the material for a light-emitting element, which is one embodiment of the present invention, in a light-emitting element enables the production of a light-emitting element which can be driven at a low voltage. Moreover, it is confirmed that a light-emitting element which has high efficiency and low power consumption and is able to be driven at a low voltage can be provided.

Figure 28:
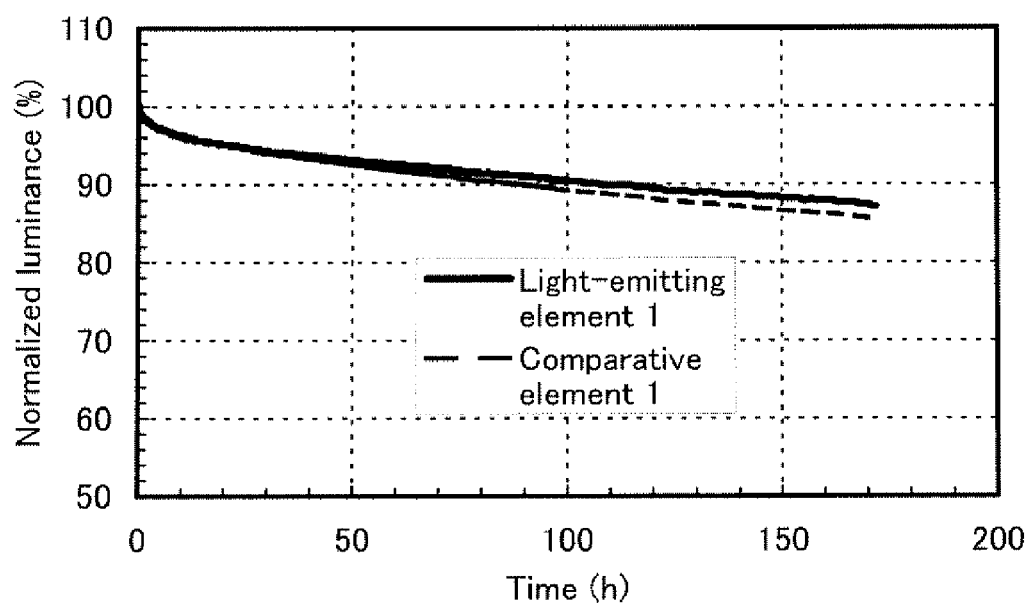
FIG. 28 shows the driving results of the light-emitting elements manufactured in Example 3.

Next, reliability tests of the light-emitting element 1 and the comparative light-emitting element 1 were carried out. Results of the reliability tests are shown in FIG. 28. In FIG. 28, the vertical axis represents normalized luminance (%) on the assumption that an initial luminance is 100%, and the horizontal axis represents driving time (h) of the light-emitting elements. The reliability tests were carried out by driving the light-emitting element 1 and the comparative light-emitting element 1 of this example at a constant current density under the conditions that an initial luminance is set at 1000 cd/m$^2$. FIG. 28 shows that the light-emitting element 1 keeps 88% of the initial luminance after the driving for approximately 150 hours. On the other hand, the comparative light-emitting element 1 keeps 86% of the initial luminance after the driving for approximately 150 hours. Therefore, it is confirmed that although both of the light-emitting element 1 and the comparative light-emitting element 1 exhibit high reliability, the light-emitting element 1 shows higher reliability than the comparative light-emitting element 1. Thus, it is found that the use of the material for a light-emitting element, which is one embodiment of the present invention, enables the production of a light-emitting element with long lifetime. Furthermore, the results of the reliability tests show that the 1-naphthyl group at a terminal of the amine skeleton of the material for a light-emitting element, which is one embodiment of the present invention, is effective in realizing a light-emitting element with long lifetime.

Since 4-(10-phenyl-9-anthryl)-4'-(9-phenyl-9H-carbazol-3-yl)triphenylamine (abbreviated to PCBAPA) which was used in the present example and is represented by the structural formula (v) is a novel material, the synthetic method thereof is explained.

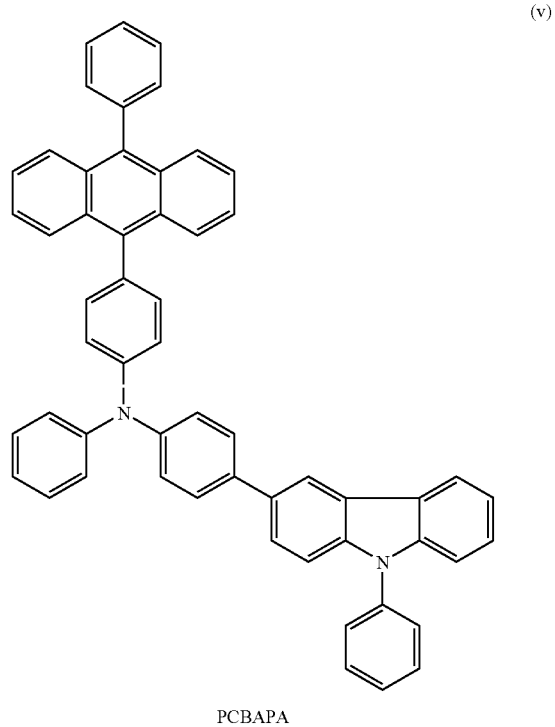

(v)

PCBAPA

Step 1: Synthesis of 3-bromo-9-phenyl-9H-carbazole

In a 1000 mL Erlenmeyer flask, 24 g (100 mmol) of 9-phenyl-9H-carbazole, 18 g (100 mmol) of N-bromosuccinimide, 450 mL of toluene, and 200 mL of ethylacetate were added, and the mixture was stirred at room temperature for 45 hours. After the reaction, the resulting mixture was washed with water, and the organic layer is dried with magnesium sulfate. The mixture was filtered, and the resulting filtrate was concentrated to give 32 g of the desired substance 3-bromo-9-phenyl-9H-carbazole in 99% yield. The synthetic scheme of 3-bromo-9-phenyl-9H-carbazole is shown in the scheme (C-1).

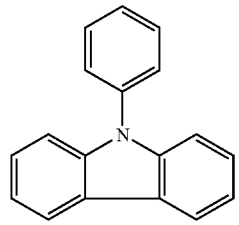

(C-1)

NBS
Ethyl acetate
Toluene

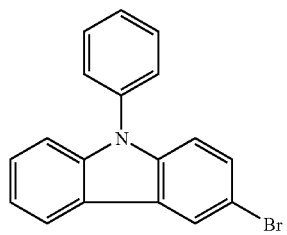

Step 2: Synthesis of
9-phenyl-9H-carbazole-3-boronic acid

In a 500 mL three-neck flask was put 10 g (31 mmol) of 3-bromo-9-phenyl-9H-carbazole, and the atmosphere in the flask was replaced with nitrogen. 150 mL of tetrahydrofuran (THF) was added into the flask to dissolve 3-bromo-9-phenyl-9H-carbazole. This solution was cooled to −80° C. Into this solution was added dropwise 20 mL (32 mmol) of n-butyllithium (a 1.58 mol/L hexane solution) with the use of a syringe. After dropping, the solution was stirred at the same temperature for 1 hour. After stirring the solution, 3.8 mL (34 mmol) of trimethyl borate was added thereto, and the solution was stirred for about 15 hours while the temperature of the solution was being brought back to room temperature. After that, ca. 150 mL (1.0 mol/L) of diluted hydrochloric acid was added to the solution, and then the solution was stirred for 1 hour. After stirring, the organic layer was separated from the aqueous layer, the aqueous layer was extracted with ethylacetate, and the extract and the organic layer were combined and washed with a saturated aqueous solution of sodium hydrogen carbonate. The organic layer was dried with magnesium sulfate, and subjected to gravity filtration. The filtrate obtained was concentrated to give an oily light brown substance. The obtained oily product was dried under reduced pressure to give 7.5 g of a light brown solid, which was the desired substance, in a yield of 86%. The synthetic scheme of 9-phenyl-9H-carbazole-3-boronic acid is shown in the scheme (C-2).

(C-2)

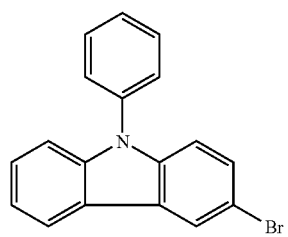

1) n-BuLi/THF
2) B(OMe)₃
3) HCl

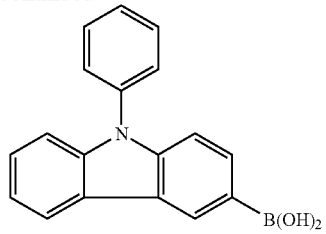

Step 3: Synthesis of 4-bromodiphenylamine

In a 1 L of Erlenmeyer flask was put 51 g (0.3 mol) of diphenylamine, which was then dissolved in 700 mL of ethylacetate. To the solution was added 54 g (0.3 mol) of N-bromosuccinimide (abbreviated to NBS), and stirring was conducted for ca. 30 hours. After the reaction, the mixture was washed with water, and the organic layer was dried with magnesium sulfate. The mixture was filtered, and the filtrate was concentrated to give 70 g of a brown oily product which was the desired substance in 94% yield. The synthetic scheme of 4-bromodiphenylamine is shown in the scheme (C-3).

(C-3)

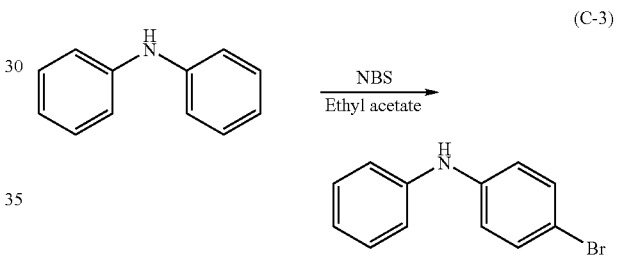

NBS
Ethyl acetate

Step 4: Synthesis of
4-(9-phenyl-9H-carbazol-3-yl)diphenylamine
(abbreviated to PCBA)

In a 500-mL three-neck flask, 6.5 g (26 mmol) of 4-bromodiphenylamine, 7.5 g (26 mmol) of 9-phenyl-9H-carbazol-3-boronic acid, and 400 mg (1.3 mmol) of tri(o-tolyl)phosphine were added, and the atmosphere in the flask was substituted by nitrogen. Then, 100 mL of toluene, 50 mL of ethanol, and 14 mL of aqueous solution of potassium carbonate (2.0 mol/L) were added to this mixture. The mixture was degassed while stirring under reduced pressure, which is followed by the addition of 67 mg (0.3 mmol) of palladium(II) acetate. This mixture was refluxed at 100° C. for 10 hours. After the reflux, the organic layer was separated from the aqueous layer, the aqueous layer was extracted with toluene, and the extract and the organic layer were combined and washed with brine. The organic layer was dried with magnesium sulfate, subjected to gravity filtration. The resulting filtrate was concentrated to give a pale brown oily product. The oily product was purified by silica gel column chromatography (the developing solvent containing a 4:6 ratio of hexane to toluene), and a white solid obtained after the purification was recrystallized with a mixed solvent of dichloromethane and hexane to give a white solid which was the desired substance. The yield was 4.9 g and 45%. The synthetic scheme of PCBA is shown in the scheme (C-4).

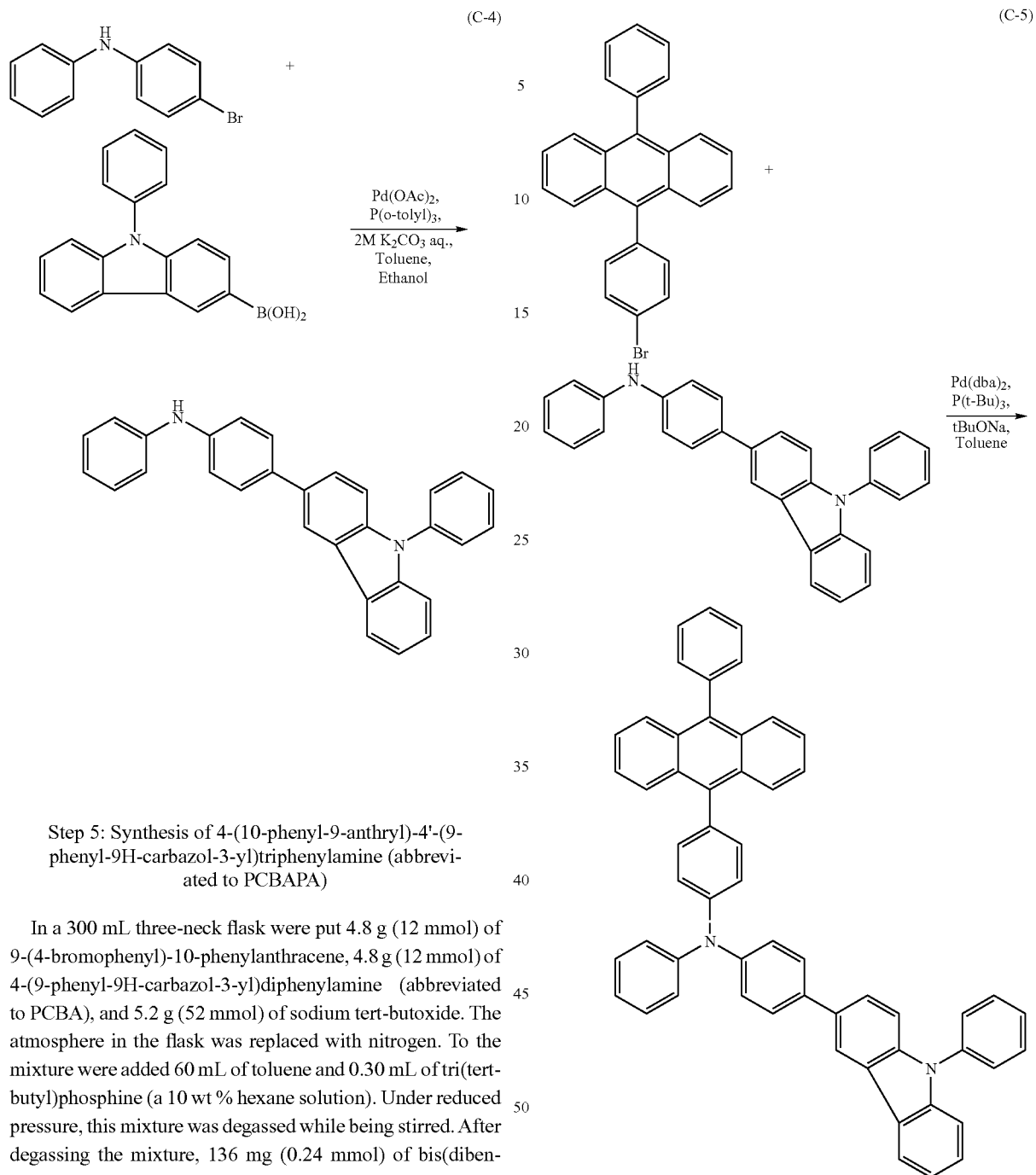

Step 5: Synthesis of 4-(10-phenyl-9-anthryl)-4'-(9-phenyl-9H-carbazol-3-yl)triphenylamine (abbreviated to PCBAPA)

In a 300 mL three-neck flask were put 4.8 g (12 mmol) of 9-(4-bromophenyl)-10-phenylanthracene, 4.8 g (12 mmol) of 4-(9-phenyl-9H-carbazol-3-yl)diphenylamine (abbreviated to PCBA), and 5.2 g (52 mmol) of sodium tert-butoxide. The atmosphere in the flask was replaced with nitrogen. To the mixture were added 60 mL of toluene and 0.30 mL of tri(tert-butyl)phosphine (a 10 wt % hexane solution). Under reduced pressure, this mixture was degassed while being stirred. After degassing the mixture, 136 mg (0.24 mmol) of bis(dibenzylideneacetone)palladium(0) were added thereto. Then, the mixture was stirred at 100° C. for 3 hours. After stirring the mixture, ca. 50 mL of toluene was added thereto, and the mixture was subjected to suction filtration through Celite (produced by Wako Pure Chemical Industries, Ltd., Catalog No. 531-16855), alumina, and Florisil (produced by Wako Pure Chemical Industries, Ltd., Catalog No. 540-00135). The filtrate obtained was concentrated to give a yellow solid. The solid was recrystallized with a mixed solvent of toluene and hexane to give 6.6 g of a light yellow solid of PCBAPA which was the desired substance in a yield of 75%. The synthetic scheme of PCBAPA is shown in the scheme (C-5).

Then, 3.0 g of the obtained pale yellow powder was purified by a train sublimation method. The conditions for sublimation purification were as follows: the pressure was 8.7 Pa, the argon gas flow rate was 3.0 mL/min, and the heating temperature of PCBACPA was 350° C. After the sublimation purification, 2.7 g of a light yellow solid PCBAPA was recovered in a yield of 90%.

Figure 29A:
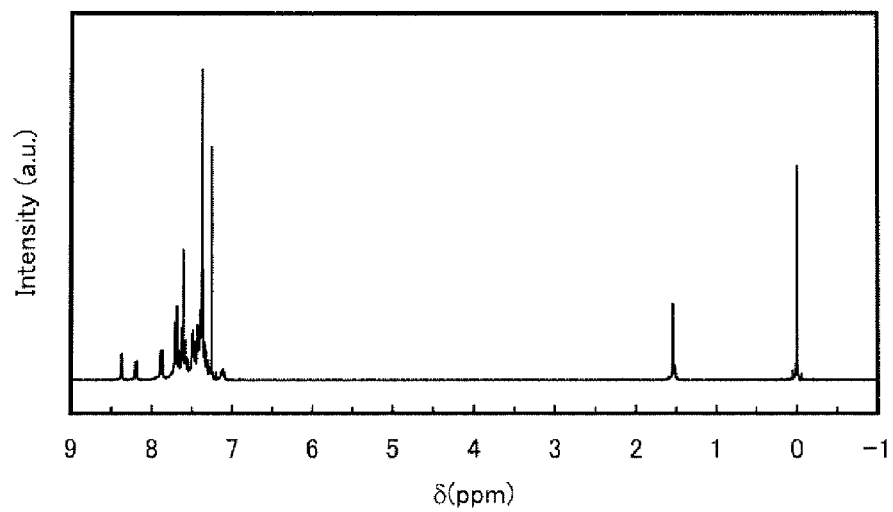
FIGS. 29A and 29B show NMR charts of $^1$H NMR charts of 4-(10-phenyl-9-anthryl)-4'-(9-phenyl-9H-carbazol-3-yl)triphenylamine (abbreviated to PCBAPA).
Figure 29B:
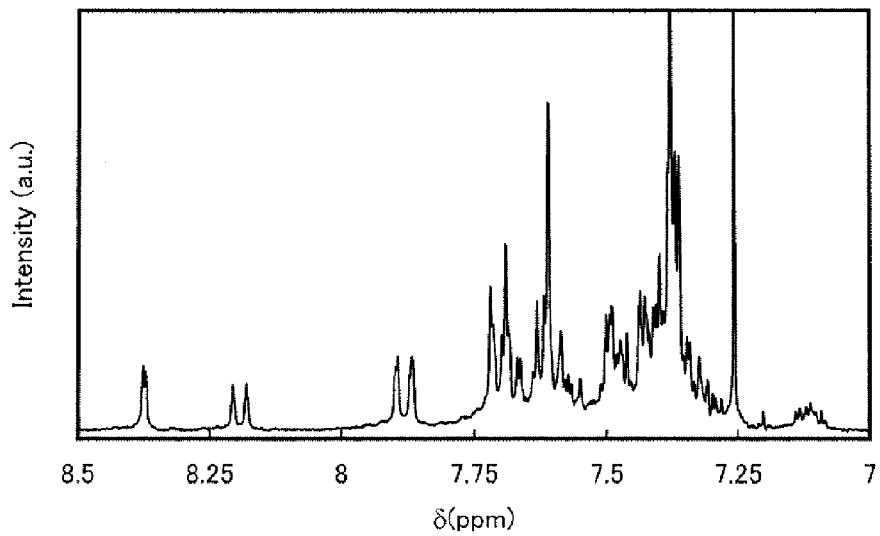

The obtained solid was analyzed by $^1$H NMR. FIGS. 29A and 29B show $^1$H NMR charts. Note that FIG. 29B is a chart in which the range of 7.0 ppm to 8.5 ppm in FIG. 29A is enlarged. From the measurement results, it can be confirmed that the material for a light-emitting element PCBAPA represented by the above structural formula (v) was obtained. The measurement data are shown below.

$^1$H NMR (CDCl$_3$, 300 MHz): δ=7.09-7.14 (m, 1H), 7.28-7.72 (m, 33H), 7.88 (d, J=8.4 Hz, 2H), 8.19 (d, J=7.2 Hz, 1H), 8.37 (d, J=1.5 Hz, 1H).

EXAMPLE 4

In this example, an example of a light-emitting element of one embodiment of the present invention will be described with reference to FIG. 9B. Materials used in the present example are the same as those used in Example 3.
(Light-Emitting Element 2)
First, indium tin oxide including silicon oxide was deposited over a glass substrate 1100 by a sputtering method to form a first electrode 1101. The thickness and the area of the first electrode 1101 were set to be 110 nm and 2 mm×2 mm, respectively.

Next, the glass substrate 1100 was fixed to a substrate holder provided in a vacuum evaporation apparatus in such a way that a surface of the glass substrate 1100, over which the first electrode 1101 was formed, faced downward, and then the pressure was reduced to about $10^{-4}$ Pa. Then, NPB and molybdenum(VI) oxide were co-evaporated over the first electrode 1101, whereby a layer 1102 containing a composite material of an organic compound and an inorganic compound was formed. The film thickness of the layer 1102 was set to 50 nm, and the weight ratio between NPB and molybdenum oxide (=NPB:molybdenum oxide) was adjusted to be 4:1.

Next, NPB was deposited to a thickness of 10 nm over the layer 1102 containing the composite material by the evaporation method utilizing resistive heating, whereby a hole-transport layer 1103 was formed.

Next, the material for a light-emitting element FCBNAPA which is one embodiment of the present invention was evaporated over the hole-transport layer 1103 to a thickness of 20 nm to form a first light-emitting layer 1200.

Further, by co-evaporation of CzPA and PCBNAPA, a second light-emitting layer 1201 with a thickness of 30 nm was formed over the first light-emitting layer 1200. Here, the weight ratio of CzPA to PCBNAPA was adjusted to 1:0.05 (=CzPA:PCBNAPA).

Then, Alq was deposited over the second light-emitting Layer 1201 to a thickness of 30 nm by the evaporation method utilizing resistive heating to form an electron-transport layer 1105.

Furthermore, lithium fluoride was deposited over the electron-transport layer 1105 to a thickness of 1 nm, whereby an electron-inject layer 1106 was formed.

Lastly, aluminum was deposited to a thickness of 200 nm over the electron-inject layer 1106 by the evaporation method utilizing resistive heating to form a second electrode 1107. Accordingly, the light-emitting element 2 was fabricated.
(Comparative Light-emitting Element 2)
Next, a comparative light-emitting element 2 was prepared. The structure of the comparative light-emitting element 2 is explained with reference to FIG. 9B. The comparative light-emitting element 2 was prepared using PCBAPA represented by the structural formula (v) instead of PCB-NAPA, which was one embodiment of the present invention, to form the first light-emitting layer 1200 and the second light-emitting layer 1201. Here, PCBAPA was used in the first light-emitting layer 1200, and the weight ratio of CzPA and PCBAPA in the second light-emitting layer 1201 was adjusted so as to be 1:0.05 (=CzPA:PCBAPA). The structure of the comparative light-emitting element 2 is the same as the light-emitting element 2 with the exception of the first light-emitting layer 1200 and the second light-emitting layer 1201.

Figure 30:
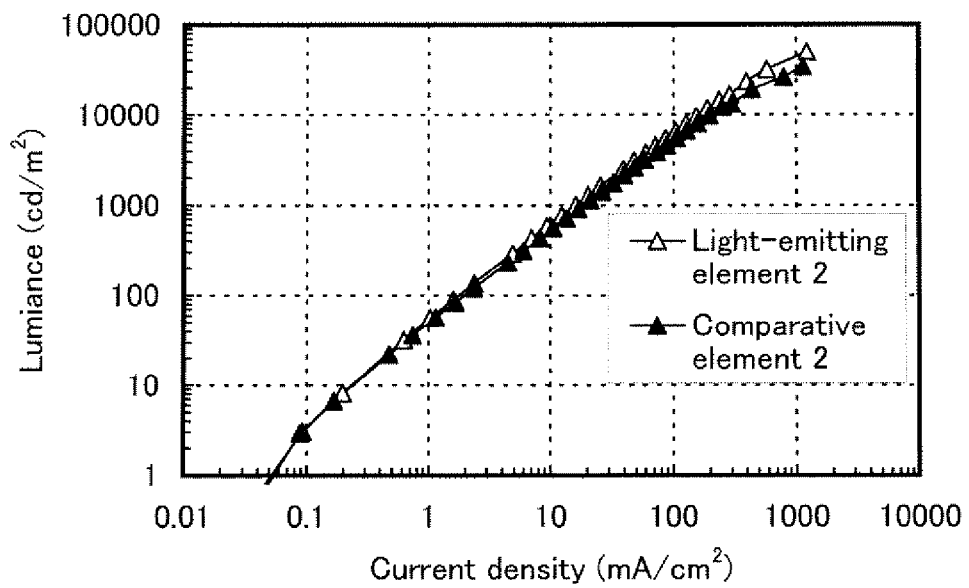
FIG. 30 shows current density-luminance characteristic of the light-emitting elements manufactured in Example 4.
Figure 31:
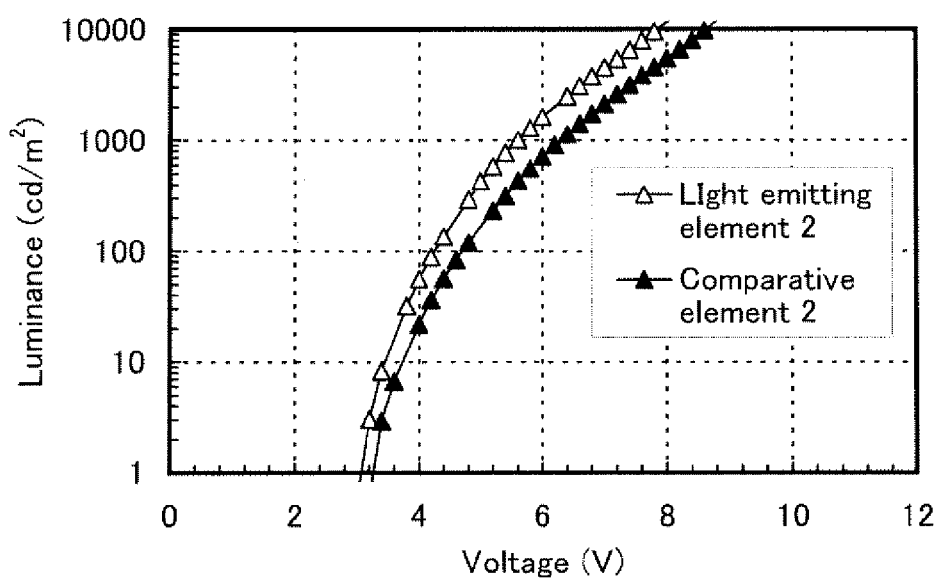
FIG. 31 shows voltage-luminance characteristics of the light-emitting elements manufactured in Example 4.
Figure 32:
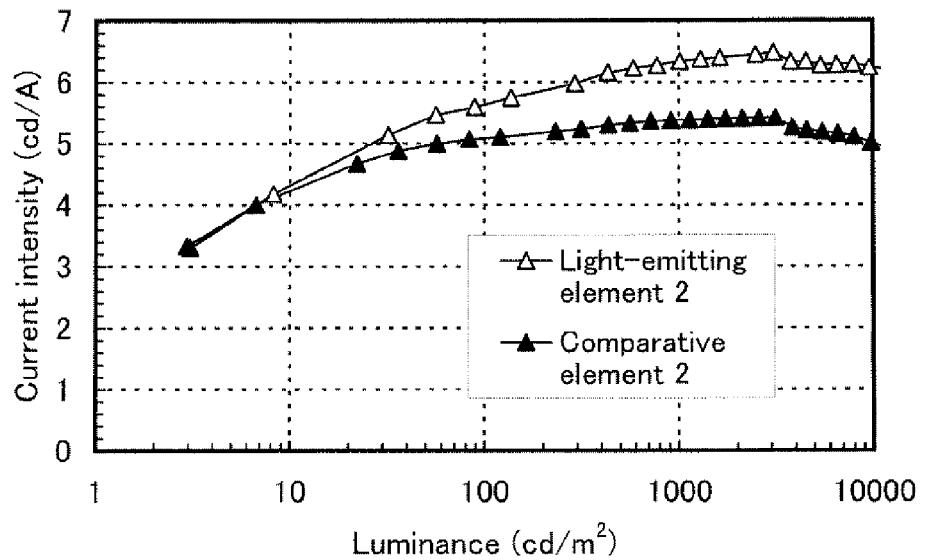
FIG. 32 shows luminance-current efficiency characteristics of the light-emitting elements manufactured in Example 4.
Figure 33:
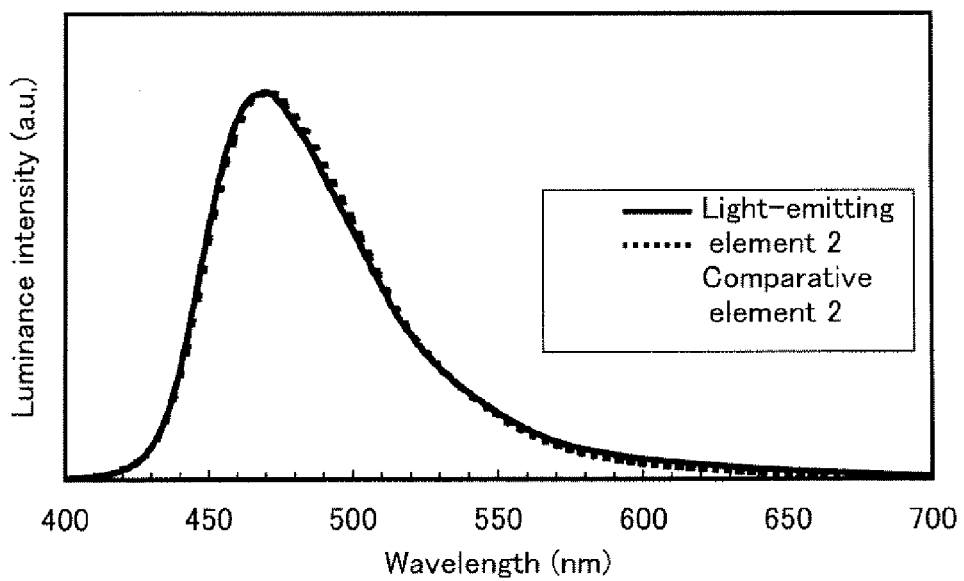
FIG. 33 shows emission spectra of the light-emitting elements manufactured in Example 4.

FIG. 30 shows current density-luminance characteristics, FIG. 31 shows voltage-luminance characteristics, FIG. 32 shows luminance-current efficiency characteristics, and FIG. 33 shows the emission spectra measured at a current of 1 mA of the light-emitting element 2 and the comparative light-emitting element 2. From FIG. 33, it is found that the light emission of the light-emitting element 2 results from PCB-NAPA, while the light emission of the comparative light-emitting element 2 is originates from PCBAPA. The CIE chromaticity coordinates of the light-emitting element 2 at a luminance of 1010 cd/m$^2$ are (x, y)=(0.16, 0.22), which means that blue emission was obtained. FIG. 32 reveals that current efficiency of the light-emitting element 2 at a luminance of 1010 cd/m$^2$ is 6.3 cd/A, which means that the light-emitting element 2 exhibits high current efficiency. FIG. 31 shows that the driving voltage at 1010 cd/m$^2$ is 5.6 V, and power efficiency is 3.9 lm/W. From these results, it is found that a voltage required to obtain a certain luminance is low and power consumption is also low in the case of the light-emitting element 2. The CIE chromaticity coordinates of the comparative light-emitting element 2 at a luminance of 910 cd/m$^2$ are (x, y)=(0.16, 0.22), which means that t blue emission is obtained. FIG. 32 reveals that current efficiency of the comparative light-emitting element 2 at a luminance of 910 cd/m$^2$ is 5.4 cd/A, which means that the comparative light-emitting element 2 exhibits relatively high current efficiency. FIG. 31 shows that the driving voltage at 910 cd/m$^2$ is 6.2 V, and power efficiency is 3.7 lm/W From these results, it is found that a voltage required to obtain a certain luminance is low and power consumption is also low in the case of the comparative light-emitting element 2.

Comparison of the light-emitting element 2 with the comparative light-emitting element 2 shows that the light-emitting element 2 exhibits higher current efficiency than the comparative light-emitting element 2. The difference in structure of the emission material in the light-emitting layer between the light-emitting element 2 and the comparative light-emitting element 2 is whether or not an 1-naphthyl group is provided at the terminal of the amine skeleton which is included in the material for a light-emitting element as an emission material. Whether or not the 1-naphthyl group is provided results in the difference in emission efficiency between the light-emitting element 2 and the comparative light-emitting element 2. Thus, it is also demonstrated from Example 4 that the 1-naphthyl group at a terminal of the amine skeleton of the material for a light-emitting element which is one embodiment of the present invention is effective in realizing high emission efficiency. Further, it is found that the use of the material for a light-emitting element, which is one embodiment of the present invention, in a light-emitting element enables the production of a light-emitting element which can be driven at a low voltage. Moreover, it is confirmed that a light-emitting element which has high efficiency and low power consumption and is able to be driven at a low voltage can be provided.

Figure 34:
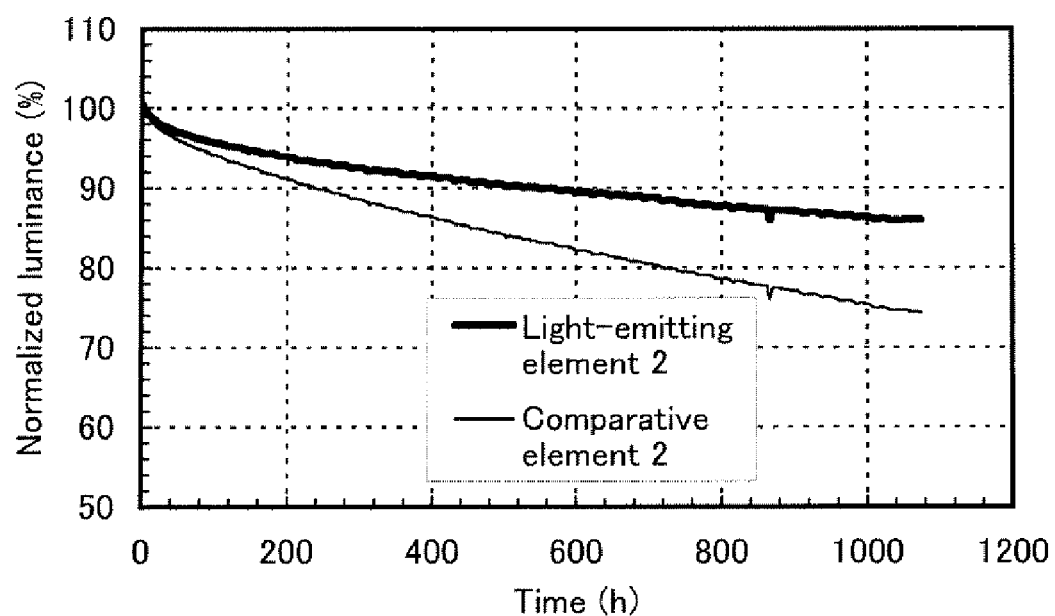
FIG. 34 shows the driving results of the light-emitting elements manufactured in Example 4.

Next, reliability tests of the light-emitting element 2 and the comparative light-emitting element 2 were carried out. Results of the reliability tests are shown in FIG. 34, In FIG. 34, the vertical axis represents normalized luminance (%) on the assumption that an initial luminance is 100%, and the horizontal axis represents driving time (h) of the light-emitting elements. The reliability tests were carried out by driving the light-emitting element 2 and the comparative light-emitting element 2 of this example at a constant current density under the conditions that an initial luminance is set at 1000 cd/m$^2$. FIG. 34 shows that the light-emitting element 2 keeps 86% of the initial luminance after the driving for approximately 1000 hours. On the other hand, the comparative light-emitting element 2 keeps 75% of the initial luminance after the driving for approximately 1000 hours. Therefore, it is confirmed that although both of the light-emitting element 2 and the comparative light-emitting element 2 exhibit high reliability, the light-emitting element 2 shows higher reliability than the comparative light-emitting element 2. Thus, it is found that the use of the material for a light-emitting element, which is one embodiment of the present invention, enables the production of a light-emitting element with long lifetime. Furthermore, the results of the reliability tests show that the 1-naphthyl group at a terminal of the amine skeleton of the material for a light-emitting element, which is one embodiment of the present invention, is effective in realizing a light-emitting element with long lifetime.

EXAMPLE 5

In this example, specific explanation is given for the synthetic method of 4-(6,9-diphenyl-9H-carbazol-3-yl)-4'-(1-naphthyl)-4''-(10-phenyl-9-anthryl)triphenylamine (abbreviated to PPCBNAPA), which is a material for a light-emitting element according to one embodiment of the present invention.

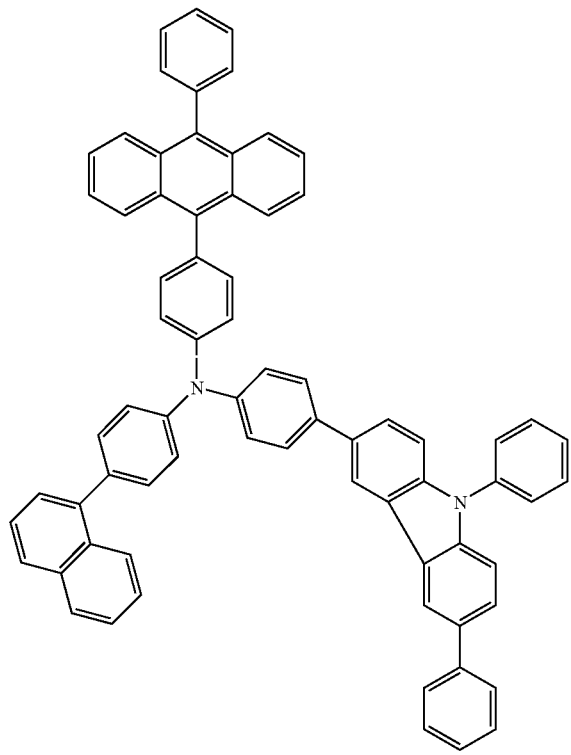

PPCBNAPA

Step 1: Synthesis of 3-bromo-9-phenyl-9H-carbazole

In a 1000 mL Meyer flask was put 20.0 g (0.08 mol) of 9-phenyl-9H-carbazole, and 200 mL of ethylacetate was added and dissolved therein. To this solution was added 14.6 g (0.18 mol) of N-bromosuccinimide (NBS), and 300 mL of ethylacetate was further added thereto, followed by stirring at room temperature for 12 days. After the reaction, water was added to this mixture, and the organic layer was separated from the aqueous layer. The organic layer obtained was washed with water three times and then washed with brine. After that, the resulting organic layer was dried with magnesium sulfate. This mixture was gravity filtered, and the filtrate obtained was concentrated to give 21.2 g of the desired substance in a yield of 77%. The synthetic scheme of 3-bromo-9-phenyl-9H-carbazole is shown in the following (D-1).

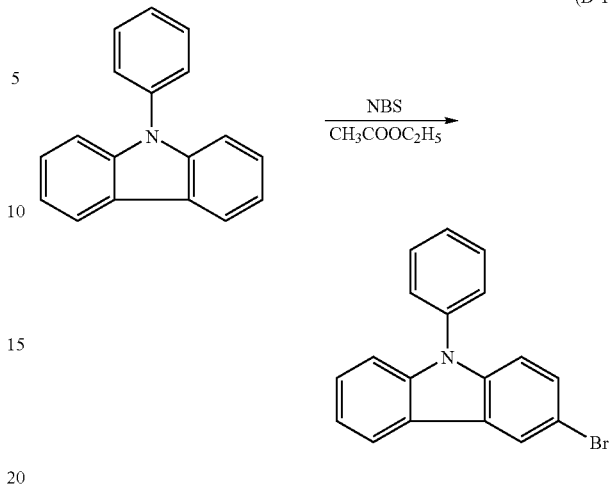

(D-1)

Step 2: Synthesis of 3,9-diphenyl-9H-carbazole

In a 1000 mL three-neck flask were put 15.1 g (0.1 mol) of phenylboronic acid and 1.3 g (4.1 mol) of tris(2-methylphenyl)phosphine, and nitrogen substitution in the flask was carried out. To this mixture were added 21.2 g (63.9 mmol) of 3-iodo-9-phenyl-9H-carbazole dissolved in 100 mL of toluene, 210 mL of toluene, 103 mL of ethanol, and 82 mL of an aqueous solution of potassium carbonate (2 mol/L), and the mixture was degassed while the pressure was reduced. After degassing the mixture, the temperature thereof was raised to 80° C., and 0.23 mg (1.0 mmol) of palladium(II) acetate was added thereto. The mixture was refluxed at 80° C. for 2.0 hours. After the reaction, toluene and water were added to the mixture, and the organic layer was separated from the aqueous layer, followed by extraction of the aqueous layer three times with toluene. The extract and the organic layer were combined and washed with brine, and the resulting mixture was dried with magnesium sulfate. The resulting mixture was gravity filtered, and the filtrate obtained was concentrated to give a brown solid, which was subjected to recrystallization with chloroform/methanol, giving 14.0 g of a white solid in 53% yield, which was the desired substance. The synthetic scheme of 3,9-diphenyl-9H-carbazole in Step 2 is shown in the following (D-2).

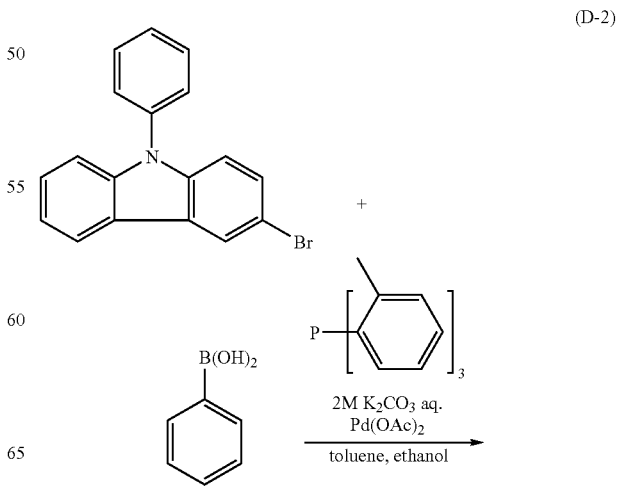

(D-2)

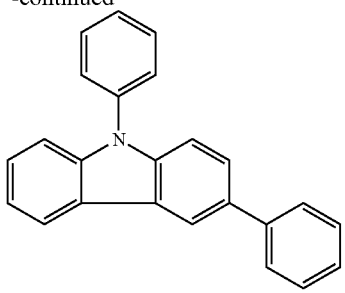

Step 3: Synthesis of 3-iodo-6,9-diphenyl-9H-carbazole

In a 1000 mL Meyer flask was put 7.0 g (22.0 mol) of 3,9-diphenyl-9H-carbazole. In the flask was put 140 mL of acetic acid, and the temperature of the mixture was raised to 60° C. so that the 3,9-diphenyl-9H-carbazole was dissolved. To this solution was added 4.9 g (22.0 mmol) of N-iodosuccinimide (NIS). The resulting solution was stirred at room temperature for 4 days. After the reaction, 200 mL of chloroform and 100 mL of water were added to the solution, and the organic layer was separated from the aqueous layer. The organic layer obtained was washed with water three times and then washed with brine. After that, the resulting organic layer was dried with magnesium sulfate. This mixture was gravity filtered, and the filtrate obtained was concentrated to give a solid. The solid was recrystallized with toluene/hexane to give 7.9 g of the desired substance in a yield of 81%, The synthetic scheme of 3-iodo-6,9-diphenyl-9H-carbazole is shown in the following (D-3).

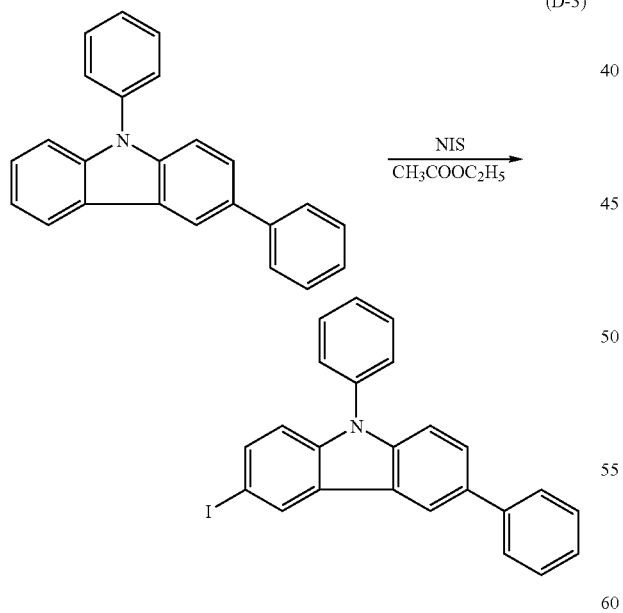

(D-3)

Step 4: Synthesis of 3-(4-bromophenyl)-6,9-diphenyl-9H-carbazole

In a 300 mL three-neck flask were put 5.0 g (11.2 mmol) of 3-iodo-6,9-diphenyl-9H-carbazole, 3.2 g (16.1 mmol) of 4-phenylboronic acid, and 0.2 g (0.6 mmol) of tris(2-methylphenyl)phosphine, and the atmosphere in the flask was replaced with nitrogen. To this mixture were added 84.0 mL of toluene, 28.0 mL of ethanol, and 11.6 mL of an aqueous solution of potassium carbonate (2 mol/L), and the mixture in the flask was degassed while the pressure was reduced. After degassing the mixture, the temperature thereof was raised to 60° C., 62.3 mg (0.3 mmol) of palladium(II) acetate was added thereto. This mixture was heated at 80° C. for 6 hours, and 52.6 mg (0.2 mmol) of palladium(II) acetate was added thereto, followed by stirring for 1.5 hours. Then, to this mixture was added 50.3 mg (0.2 mmol) of palladium(II) acetate, and the resulting mixture was stirred for 1 hour. After the reaction, toluene was added to this mixture, followed by suction filtration through Celite. Water and ethylacetate were added to the resulting filtrate, and the organic layer was separated from the aqueous layer, which was then extracted with ethylacetate three times. This extract and the organic layer were combined and washed with brine, and the resulting mixture was dried with magnesium sulfate. The mixture obtained was gravity filtered to remove the magnesium sulfate, and the filtrate was concentrated to obtain an oily product. The solid obtained by the concentration of the resulting filtrate was purified by silica gel column chromatography (the developing solvent containing a 6:1 ratio of hexane to chloroform). The fractions obtained were concentrated, followed by recrystallization with chloroform/hexane to give 2.4 g of a white solid in a yield of 40%, which was the desired substance. The synthetic scheme of 3-(4-bromophenyl)-6,9-diphenyl-9H-carbazole is shown in the following (D-4).

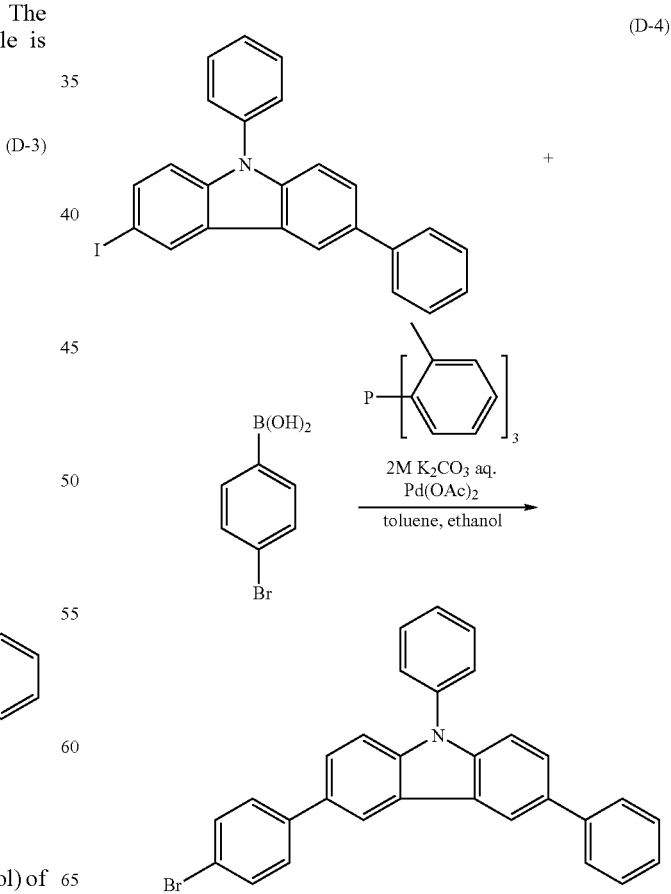

(D-4)

Step 5; Synthesis of 4-(6,9-diphenyl-9H-carbazol-3-yl)-4'-(1-naphthyl)diphenylamine (abbreviated to PPCBNA)

In a 50 mL three-neck flask were put 1.0 g (2.1 mmol) of 3-(4-bromophenyl)-9-phenyl-9H-carbazole and 0.6 g (6.3 mmol) of sodium tert-butoxide. The atmosphere in the flask was replaced with nitrogen. To this mixture was added 0.5 g (2.1 mmol) of 4-(1-naphthyl)aniline dissolved in 3 mL of toluene, and then 10.5 mL of toluene and 0.3 mL of tri(tert-butyl)phosphine (a 10 wt % hexane solution) were added to the mixture. The temperature of the mixture was raised to 60° C., and then 31.2 mg (0.05 mmol) of bis(dibenzylideneacetone)palladium(0) was added. The mixture was stirred at 80° C. for 2 hours. After the reaction, toluene was added to the mixture, and a suction filtration through Celite and alumina was carried out, resulting in a filtrate. The filtrate was concentrated to give a solid, which was purified by silica gel column chromatography (the developing solvent containing a 2:3 ratio of hexane to toluene). The fractions obtained were concentrated to obtain 0.7 g of a white solid in 52% yield, which was the desired substance. The synthetic scheme of 4-(6,9-diphenyl-9H-carbazol-3-yl)-4'-(1-naphthyl)diphenylamine is shown in the following (D-5).

Step 6: Synthesis of 4-(6,9-diphenyl-9H-carbazol-3-yl)-4'-(1-naphthyl)-4''-(10-phenyl-9-anthryl)triphenylamine (abbreviated to PPCBNAPA)

In a 50 mL three-neck flask were put 0.7 g (1.6 mmol) of 9-(4-bromophenyl)-10-phenylanthracene, 0.5 g (4.9 mmol) of sodium tert-butoxide, and 1.0 g (1.6 mmol) of 4-(1-naphthyl)-4'-(6,9-diphenyl-9H-carbazol-3-yl)diphenylamine. The atmosphere in the flask was replaced with nitrogen. To this mixture were added 12.2 mL of toluene and 0.3 mL of tri(tert-butyl)phosphine (a 10 wt % hexane solution). The temperature of the mixture was raised to 60° C., and then 32.5 mg (5.6 mmol) of bis(dibenzylideneacetone)palladium(0) was added thereto. The mixture was stirred at 80° C. for 2 hours. After the reaction, 20 mL of toluene was added to the mixture, and a suction filtration through Florisil, Celite, and alumina was carried out, resulting in a filtrate. The filtrate was concentrated to give a solid, which was purified by silica gel column chromatography (the developing solvent containing a 3:7 ratio of hexane to toluene). The fractions obtained were concentrated to obtain a solid, which was recrystallized with toluene/hexane to give 1.1 g of a yellow solid in 72% yield, which was the desired substance. Then 1.1 g of the obtained yellow solid was purified by a train sublimation method. The conditions for sublimation purification were as follows: the pressure was 2.7 Pa, the argon gas flow rate was 5.5 mL/min, and the heating temperature of the yellow solid was 390° C. After the sublimation purification, 0.9 g of a yellow prismatic crystal which was the desired substance was recovered in 87% yield. The synthetic scheme of 4-(6,9-diphenyl-9H-carbazol-3-yl)-4'-(1-naphthyl)-4''-(10-phenyl-9-anthryl)triphenylamine is shown in the following (D-6).

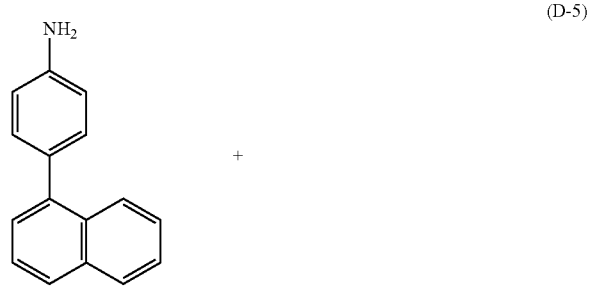

(D-5)

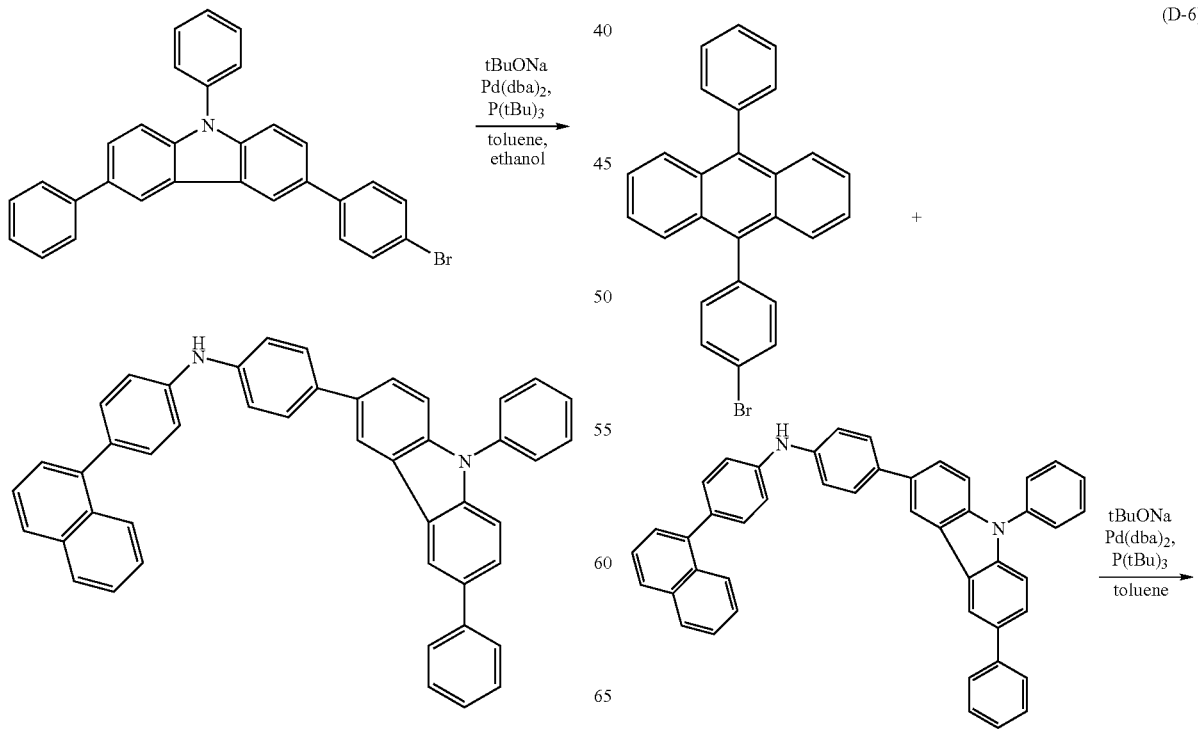

(D-6)

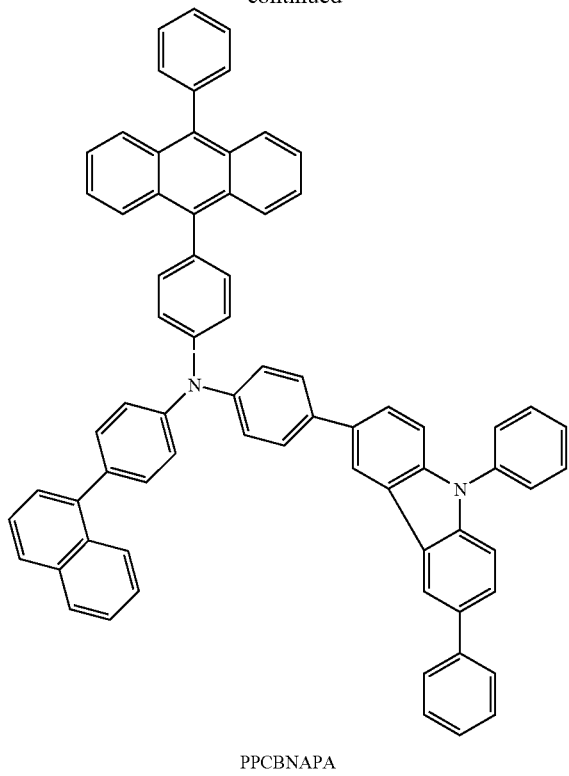

PPCBNAPA

Figure 35A:
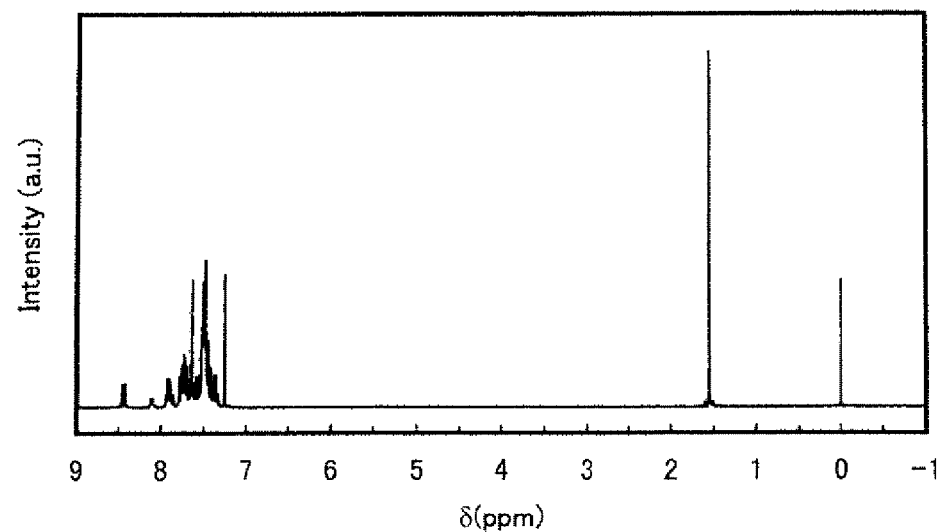
FIGS. 35A and 35B show $^1$H NMR charts of 4-(6,9-diphenyl-9H-carbazol-3-yl)-4'-(1-naphthyl)-4"-(10-phenyl-9-anthryl)triphenylamine (abbreviated to PPCBNAPA).
Figure 35B:
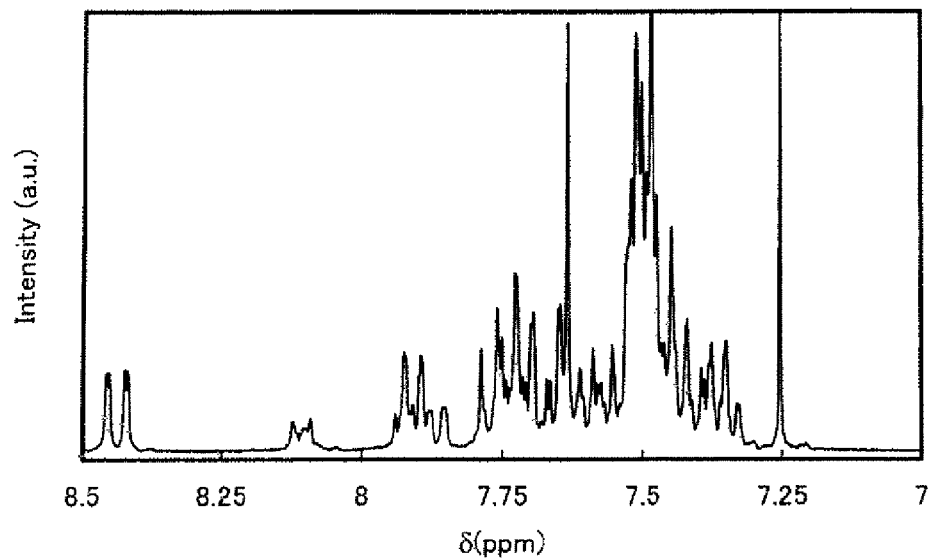

The solid obtained in the above Step 6 was analyzed by $^1$H NMR. The $^1$H NMR chart is shown in FIGS. 35A and 35B, FIG. 35B is a chart in which the range of 7.0 ppm to 8.5 ppm in FIG. 35A is expanded. From the measurement results, it is confirmed that PPCBNAPA, the material for a light-emitting element which is one embodiment of the present invention, is obtained. The measurement data are shown below.

$^1$H NMR (CDCl$_3$, 300 MHz): δ=7.30-7.79 (m, 41H), 7.85-7.94 (m, 4H), 8.09-8.12 (m, 1H), 8.43 (d, J=1.2 Hz, 1H), 8.45 (d, J=1.5 Hz, 1H).

The thermogravimetry-differential thermal analysis (TG-DTA) of the obtained PPCBNAPA was carried out. The measurement was conducted by using a high vacuum differential type differential thermal balance (manufactured by Bruker AXS K.K., TG/DTA 2410SA). The measurement was carried under a nitrogen stream (flow rate: 200 mL/min) and a normal pressure at a temperature rising rate of 10° C./min. From the relationship between the weight change and the temperature (thermogravimetry), it is understood that a 5% weight loss temperature is higher than 500° C., which is indicative of high thermal stability.

Figure 36:
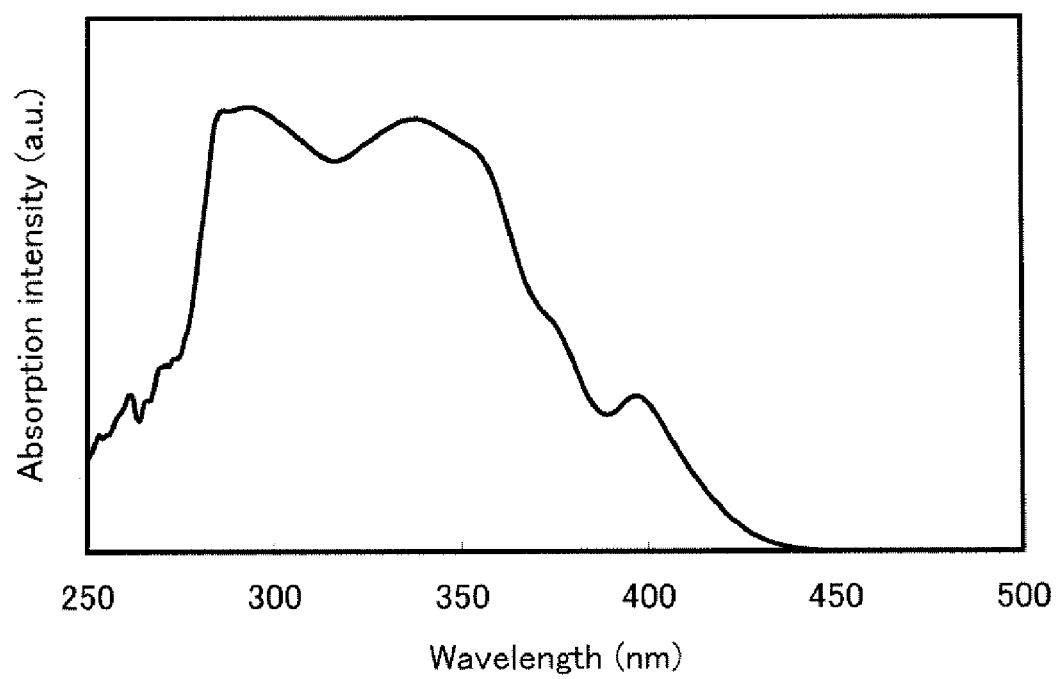
FIG. 36 shows an absorption spectrum of a toluene solution of 4-(6,9-diphenyl-9H-carbazol-3-yl)-4'-(1-naphthyl)-4"-(10-phenyl-9-anthryl)triphenylamine (abbreviated to PPCBNAPA).
Figure 37:
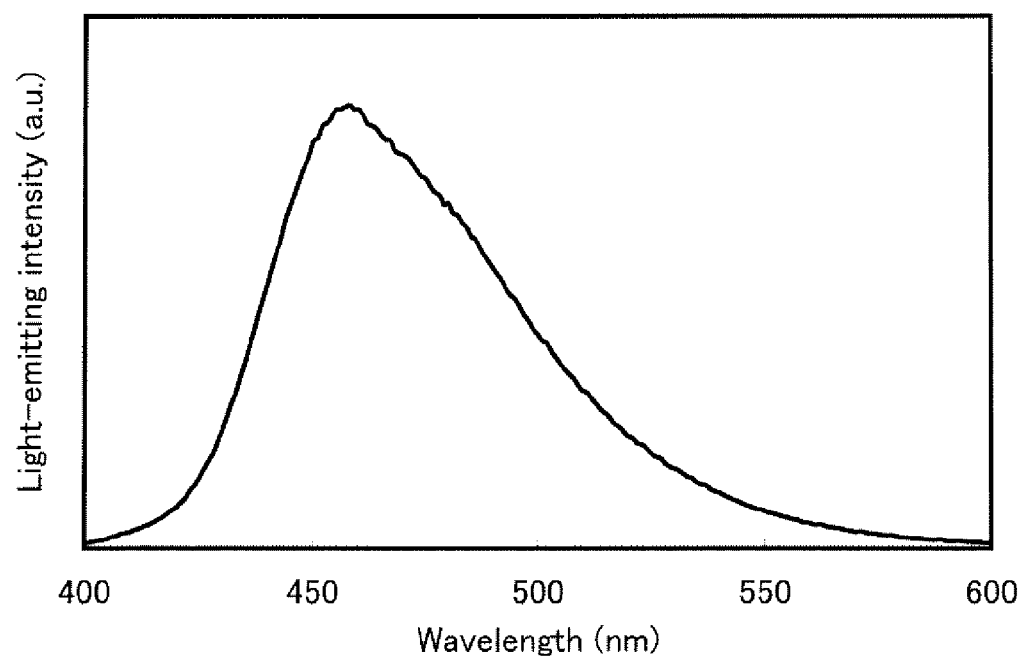
FIG. 37 shows an emission spectrum of a toluene solution of 4-(6,9-diphenyl-9H-carbazol-3-yl)-4'-(1-naphthyl)-4"-(10-phenyl-9-anthryl)triphenylamine (abbreviated to PPCBNAPA).

The absorption spectrum and the emission spectrum of a toluene solution of PPCBNAPA are shown in FIG. 36 and FIG. 37, respectively. An ultraviolet-visible spectrophotometer (V-550, by JASCO Corporation) was used for the measurement of the absorption spectrum of the toluene solution in a quartz cell. The absorption spectrum was obtained after subtracting an absorption spectrum of toluene in the quartz cell. In FIG. 36, the horizontal axis represents wavelength (nm) and the vertical axis represents absorption intensity (arbitrary unit). In FIG. 37, the horizontal axis represents wavelength (nm) and the vertical axis represents light emission intensity (arbitrary unit). Absorption is observed around 293 nm, 338 nm, and 397 nm for the toluene solution. The maximum emission wavelength of the solution was 458 nm (excitation wavelength: 370 nm)

Figure 38:
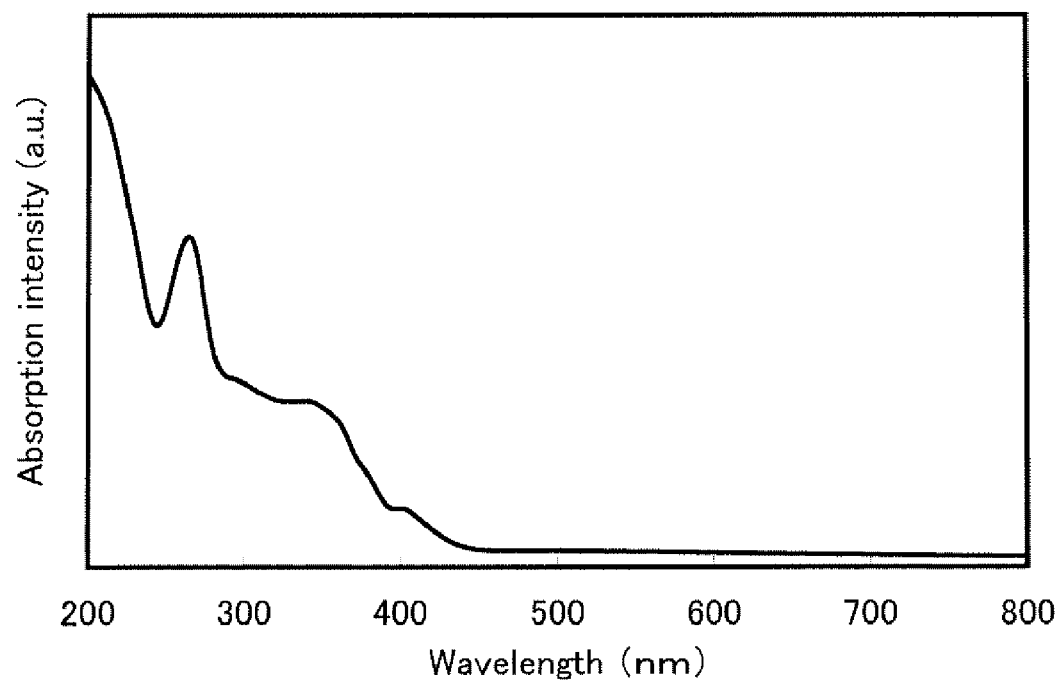
FIG. 38 shows an absorption spectrum of a thin film of 4-(6,9-diphenyl-9H-carbazol-3-yl)-4'-(1-naphthyl)-4"-(10-phenyl-9-anthryl)triphenylamine (abbreviated to PPCBNAPA).
Figure 39:
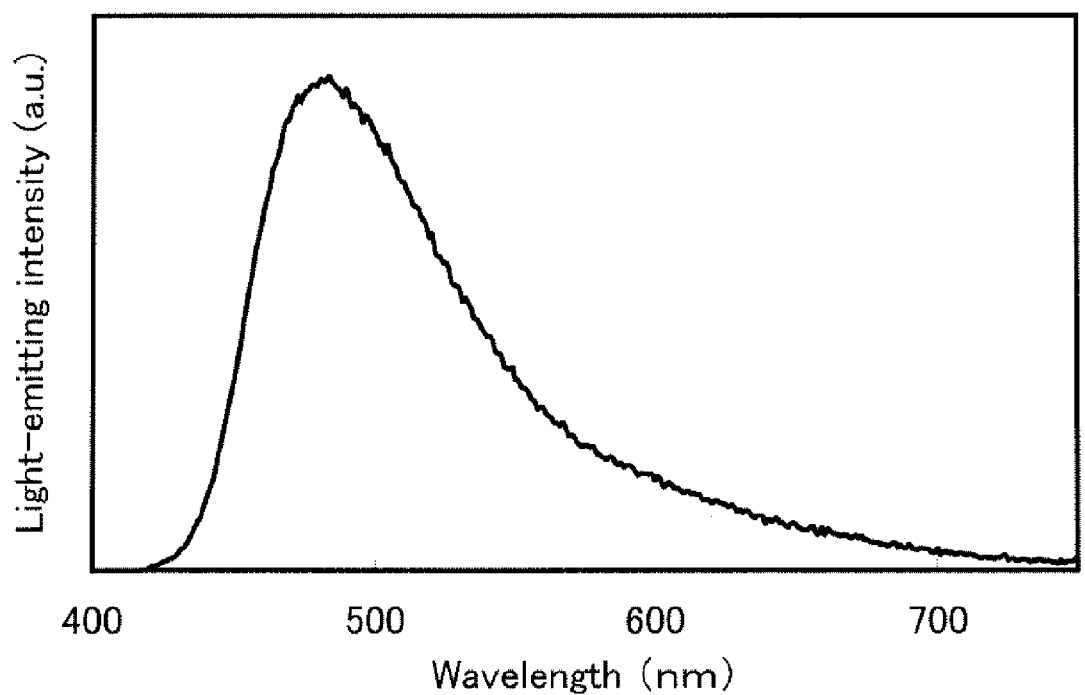
FIG. 39 shows an emission spectrum of a thin film of 4-(6,9-diphenyl-9H-carbazol-3-yl)-4'-(1-naphthyl)-4"-(10-phenyl-9-anthryl)triphenylamine (abbreviated to PPCBNAPA).

The absorption spectrum and the emission spectrum of a thin film of PPCBNAPA are illustrated in FIG. 38 and FIG. 39, respectively. An ultraviolet-visible spectrophotometer (V-550, by JASCO Corporation) was used for the measurement of the absorption spectrum. The sample was prepared by evaporation on a quartz substrate for measurement. The absorption spectrum was obtained after subtracting an absorption spectrum of the quartz cell. In FIG. 38, the horizontal axis represents wavelength (nm) and the vertical axis represents absorption intensity (arbitrary unit). In FIG. 39, the horizontal axis represents wavelength (nm) and the vertical axis represents light emission intensity (arbitrary unit). In the case of the thin film, absorption was observed around 264 nm, 296 nm, 341 nm, 356 nm and 402 nm. The maximum emission wavelength was 483 nm (excitation wavelength: 399 nm) in the case of the thin film.

As discussed above, the measurements reveal that PPCBNAPA, the material for a light-emitting element which is one embodiment of the present invention, exhibits blue light emission of a sufficiently short wavelength and with favorable chromaticity both in solution and in the thin film state.

The oxidation characteristic and reduction characteristic of PPCBNAPA were evaluated. The oxidation characteristic and reduction characteristic were evaluated by cyclic voltammetry (CV) measurement. An electrochemical analyzer (ALS model 600A, BAS Inc.) was used for the measurement.

The solution for the CV measurement was prepared by using dehydrated N,N-dimethylformamide (DMF) (produced by Sigma-Aldrich Corp., 99.8%, catalog number: 22705-6) as a solvent, dissolving a supporting electrolyte of tetra-n-butylammonium perchlorate (n-Bu$_4$NClO$_4$) (produced by Tokyo Chemical Industry Co., Ltd., catalog number: T0836) at a concentration of 100 mmol/L, and dissolving the sample at a concentration of 1 mmol/L. A platinum electrode (a PTE platinum electrode, BAS Inc.) was used as a work electrode, a platinum electrode (a VC-3 Pt counter electrode (5 cm), BAS Inc.) was used as an auxiliary electrode, and an Ag/Ag$^+$ electrode (an RE5 non-aqueous solvent reference electrode, BAS Inc.) was used as a reference electrode. The measurement was carried out at room temperature. The scan speed at this CV measurement was set to 0.1 V/s.

The reduction characteristics of PPCBNAPA were evaluated by 100 measurement cycles where the potential of the working electrode with respect to the reference electrode was scanned from −1.22 V to −2.40 V and then scanned from −2.40 V to −1.22 V in each of the cycles. Similarly, the oxidation characteristics were evaluated by 100 measurement cycles where the potential was scanned from 0.28 V to 0.60 V and then scanned from 0,60 V to 0.28 V in each of the cycles.

Figure 40A:
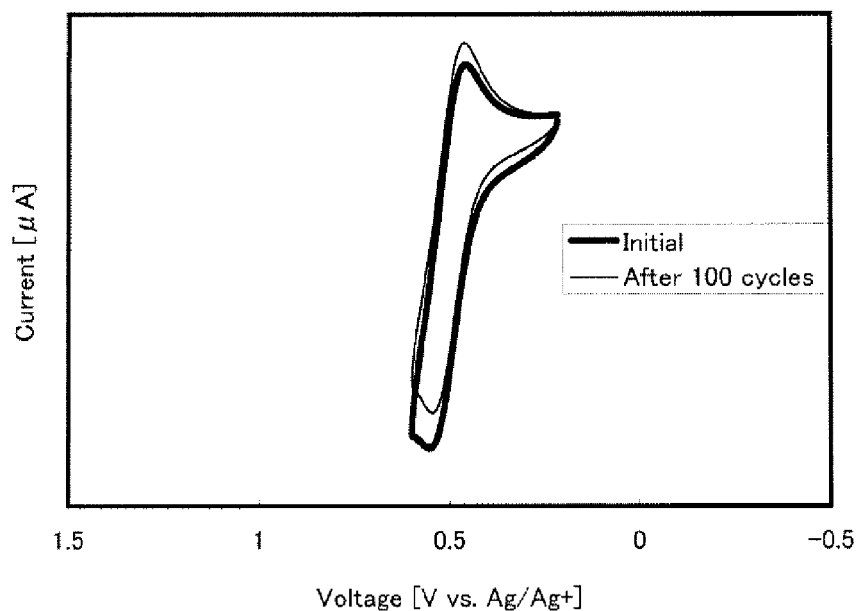
FIGS. 40A and 40B each show a CV chart of a DMF solution of 4-(6,9-diphenyl-9H-carbazol-3-yl)-4'-(1-naphthyl)-4"-(10-phenyl-9-anthryl)triphenylamine (abbreviated to PPCBNAPA).
Figure 40B:
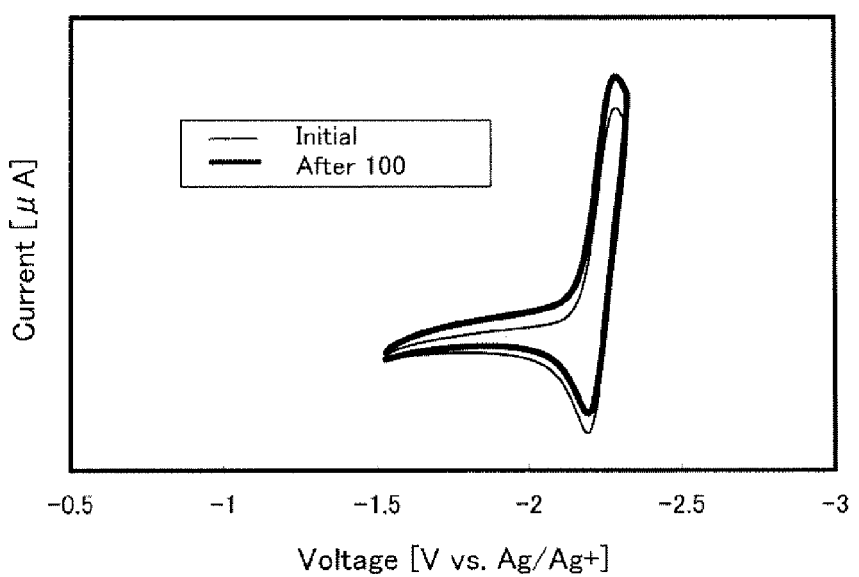

FIGS. 40A and 40B show CV measurement results of the oxidation characteristic and reduction characteristic of PPCBNAPA, respectively. In FIGS. 40A and 40B, the horizontal axis represents potential (V) of the working electrode with respect to the reference electrode, and the vertical axis represents the value of current (μA) which flows between the working electrode and the auxiliary electrode.

It can be understood from FIG. 40A that the current corresponding to the oxidation is observed around 0.50 V (vs. Ag/Ag+) and from FIG. 40B that the current corresponding to the reduction is observed around −2.24 V (vs. Ag/Ag+).

Although the scan was repeated as many as 100 cycles, PPCBNAPA showed no significant change in the peak position and peak intensity of the CV curves in the oxidation and the reduction. The peak intensity remained 88% of the initial state on the oxidation side and 88% of the initial state on the reduction side, Thus, it is understood that PPCBNAPA is relatively stable even when an oxidation from a neutral state to an oxidized state and a reduction from the oxidized state to the neutral state are repeated and when a reduction from the neutral state to a reduced state and an oxidation from the reduced state to the neutral state are repeated.

The results of the measurement of the thin film of PPCB-NAPA by photoelectron spectrometry (AC-2, product of Riken Keiki Co., Ltd.) under air indicate that the HOMO level of PPCBNAPA is −5.45 eV. The absorption edge was obtained from Tauc plot, with an assumption of direct transition, using data on the absorption spectrum in FIGS. 40A and 40B, and the energy gap thereof was estimated to be 2.75 eV assuming that the absorption edge corresponds to the optical energy gap. The LUMO level was found to be −2.70 eV by calculation from the value of the energy gap and the HOMO level. As thus described, it is found that PPCBNAPA has a large energy gap of 2.75 eV.

EXAMPLE 6

In this example, an example of a light-emitting element according to one embodiment of the present invention will be described with reference to FIG. 9A. Chemical formulae of materials used in this example are shown below.

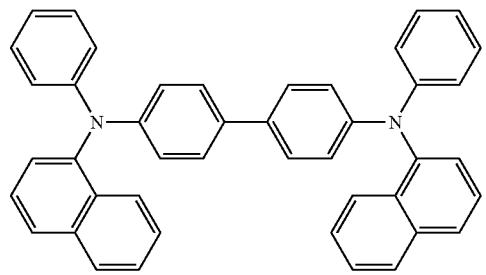

NPB (i)

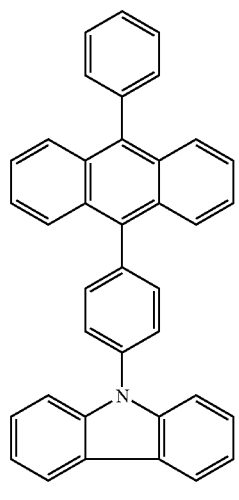

CzPA (ii)

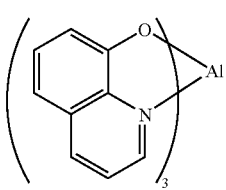

$Alq_3$ (iii)

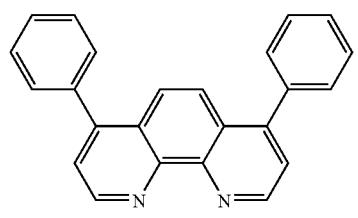

BPhen (iv)

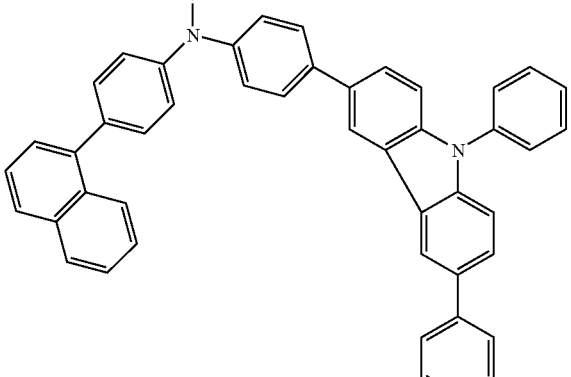

PPCBNAPA (v)

(Light-Emitting Element 3)

First, indium tin oxide including silicon oxide was deposited over a glass substrate 1100 by a sputtering method to form a first electrode 1101. The thickness and the area of the first electrode 1101 were set to be 110 nm and 2 mm×2 mm, respectively.

Next, the glass substrate 1100 was fixed to a substrate holder provided in a vacuum evaporation apparatus in such a way that a surface of the glass substrate 1100, over which the first electrode 1101 was formed, faced downward, and then the pressure was reduced to about $10^{-4}$ Pa. Then, NPB and molybdenum(VI) oxide were co-evaporated over the first electrode 1101, whereby a layer 1102 containing a composite material of an organic compound and an inorganic compound was formed. The film thickness of the layer 1102 was set to 50 nm, and the weight ratio between NPB and molybdenum oxide (=NPB:molybdenum oxide) was adjusted to be 4:1.

Next, NPB was deposited to a thickness of 10 nm over the layer 1102 containing the composite material by the evaporation method utilizing resistive heating, whereby a hole-transport layer 1103 was formed.

Further, by co-evaporation of CzPA and PPCBNAPA, a light-emitting layer 1104 with a thickness of 30 nm was formed over the hole-transport layer 1103. Here, CzPA to PPCBNAPA was adjusted so as to be 1:0.10 (=CzPA:PPCBNAPA).

Then, tris(8-quinolinolato)aluminum (abbreviated to Alq) was deposited over the light-emitting layer 1104 to a thickness of 10 nm, and bathophenanthroline (abbreviated to BPhen) was deposited over the Alq layer to a thickness of 15 nm by the evaporation method utilizing resistive heating to form an electron-transport layer 1105 comprising Alq and BPhen.

Furthermore, lithium fluoride was deposited over the electron-transport layer 1105 to a thickness of 1 nm, whereby an electron-inject layer 1106 was formed.

Lastly, aluminum was deposited to a thickness of 200 nm over the electron-inject layer 1106 by the evaporation method utilizing resistive heating to form a second electrode 1107. Accordingly, the light-emitting element 3 was fabricated.

Figure 41:
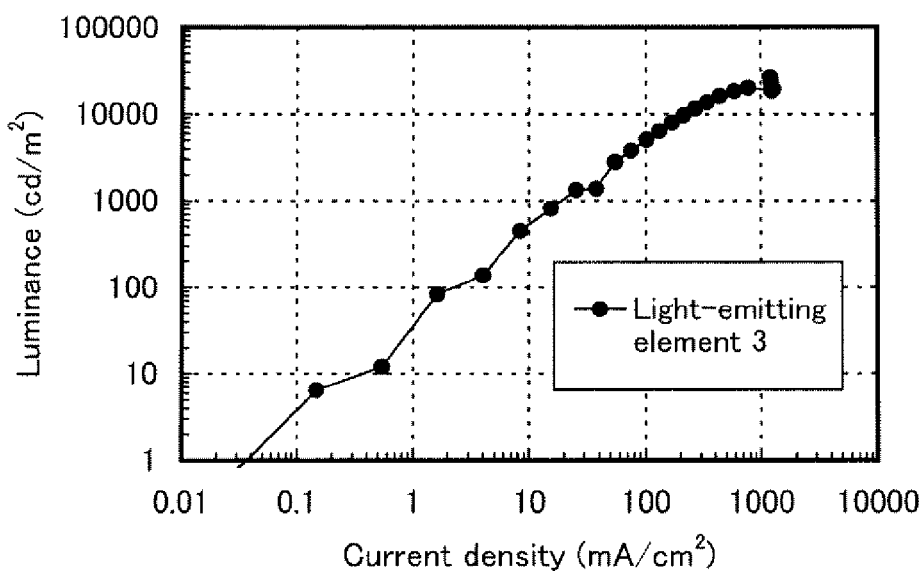
FIG. 41 shows current density-luminance characteristic of the light-emitting element manufactured in Example 6.
Figure 42:
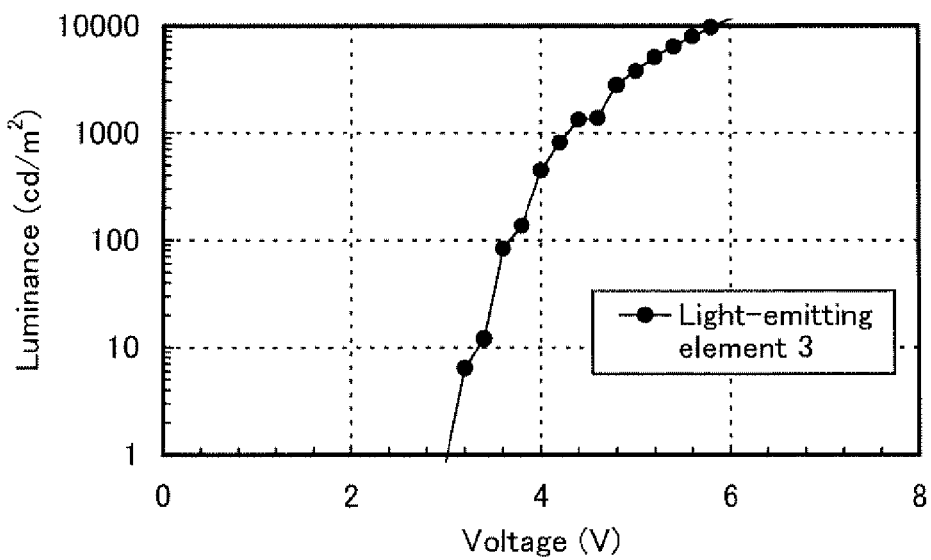
FIG. 42 shows voltage-luminance characteristics of the light-emitting element manufactured in Example 6.
Figure 43:
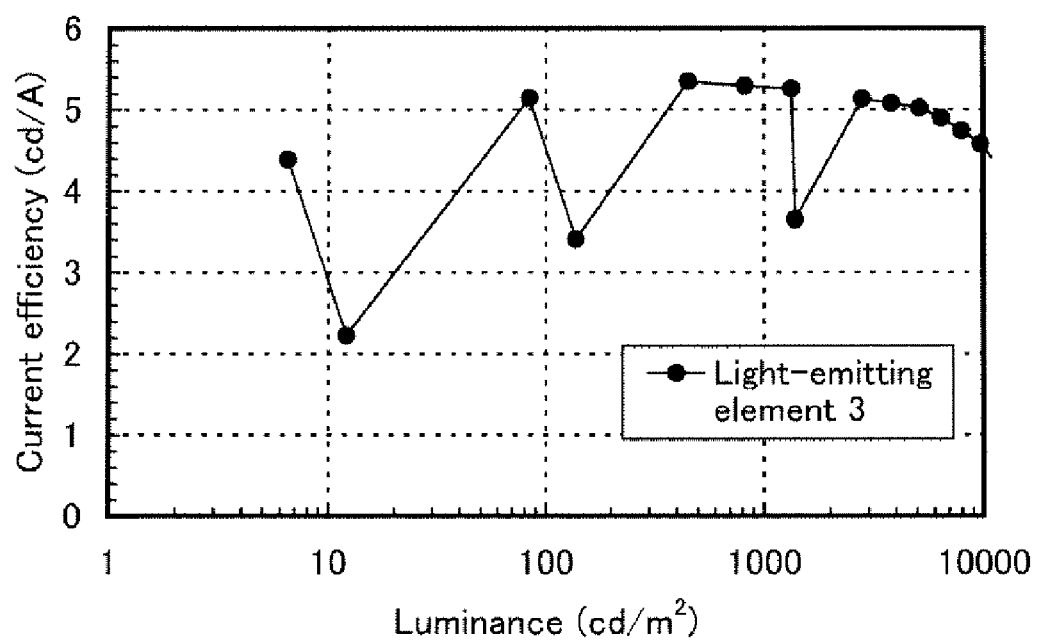
FIG. 43 shows luminance-current efficiency characteristics of the light-emitting element manufactured in Example 6.
Figure 44:
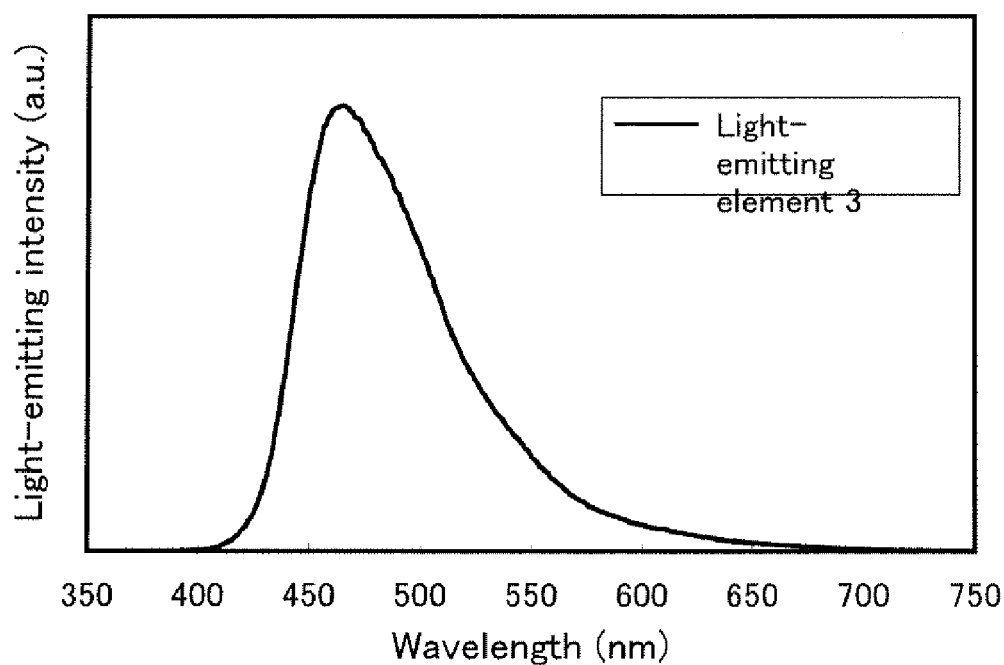
FIG. 44 shows emission spectra of the light-emitting element manufactured in Example 6.

FIG. 41 shows current density-luminance characteristics, FIG. 42 shows voltage-luminance characteristics, FIG. 43 shows luminance-current efficiency characteristics, and FIG. 44 shows the emission spectra measured at a current of 1 mA of the light-emitting element 3. From FIG. 44, it is found that the light emission of the light-emitting element 3 results from PPCBNAPA. The CIE chromaticity coordinates of the light-emitting element 3 at a luminance of 814.7 cd/m² are (x, y)=(0.17, 0.21), which means that blue emission was obtained. FIG. 43 reveals that current efficiency of the light-emitting element 3 at a luminance of 814.7 cd/m² is 4.3 cd/A, which means that the light-emitting element 3 exhibits high current efficiency. FIG. 42 shows that the driving voltage at 814.7 cd/m² is 4.2 V, and power efficiency is 3.96 lm/W. From these results, it is found that a voltage required to obtain a certain luminance is low and power consumption is also low in the case of the light-emitting element 3.

The above results demonstrate that the use of the material for a light-emitting element, which is one embodiment of the present invention, in a light-emitting element enables the production of a light-emitting element which can be driven at a low voltage. Moreover, it is confirmed that a light-emitting element which has high efficiency and low power consumption and is able to be driven at a low voltage can be provided.

Figure 45:
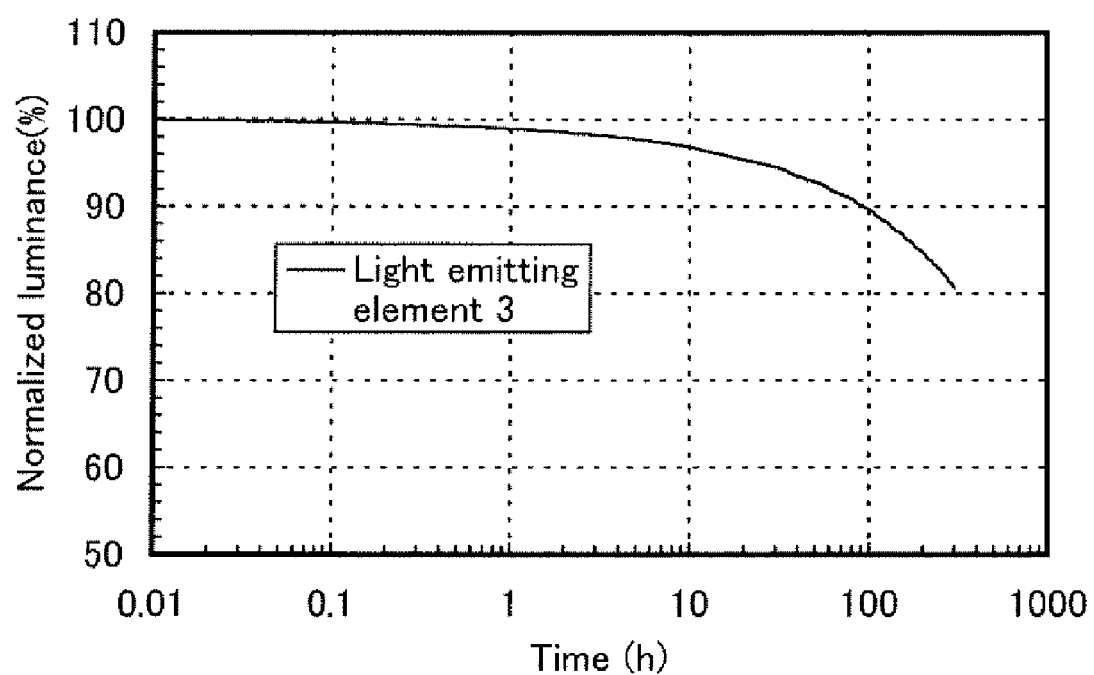
FIG. 45 shows the driving results of the light-emitting element manufactured in Example 6.

Next, a reliability test of the light-emitting element 3 was carried out. Results of the reliability test are shown in FIG. 45. In FIG. 45, the vertical axis represents normalized luminance (%) on the assumption that an initial luminance is 100%, and the horizontal axis represents driving time (h) of the light-emitting element. The reliability test was carried out by driving the light-emitting element 3 of this example at a constant current density under the conditions that an initial luminance is set at 1000 cd/m². FIG. 45 shows that the light-emitting element 3 keeps 81% of the initial luminance after the driving for approximately 300 hours. Thus, it is found that the use of the material for a light-emitting element, which is one embodiment of the present invention, enables the production of a light-emitting element with long lifetime. Furthermore, the results of the reliability test show that the 1-naphthyl group at a terminal of the amine skeleton of the material for a light-emitting element, which is one embodiment of the present invention, is effective in realizing a light-emitting element with long lifetime.

This application is based on Japanese Patent Application serial no. 2008-269057 filed with Japan Patent Office on Oct. 17, 2008, the entire contents of which are hereby incorporated by reference.

What is claimed is:

1. A light-emitting device comprising:
a first electrode;
a first light-emitting unit over the first electrode;
a charge generation layer over the first light-emitting unit;
a second light-emitting unit over the charge generation layer; and
a second electrode over the second light-emitting unit,
wherein the first light-emitting unit comprises a material represented by a general formula (G1), and

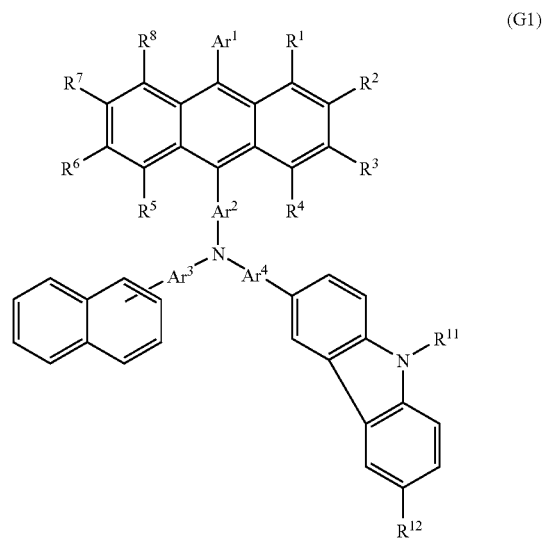

wherein:
Ar¹ represents a substituted or unsubstituted aryl group having 6 to 13 carbon atoms;
Ar², Ar³, and Ar⁴ each independently represent a substituted or unsubstituted arylene group having 6 to 13 carbon atoms;
R¹ to R⁸ independently represent hydrogen or an alkyl group having 1 to 4 carbon atoms;
R¹¹ represents an alkyl group having 1 to 4 carbon atoms or a substituted or unsubstituted aryl group having 6 to 13 carbon atoms; and
R¹² represents an alkyl group having 1 to 4 carbon atoms or a substituted or unsubstituted aryl group having 6 to 13 carbon atoms.

2. A light-emitting device comprising:
a first electrode;
a first light-emitting unit over the first electrode;
a charge generation layer over the first light-emitting unit;
a second light-emitting unit over the charge generation layer; and
a second electrode over the second light-emitting unit,
wherein the first light-emitting unit comprises a material represented by a general formula represented by a general formula (G1-1), and (G1-1)

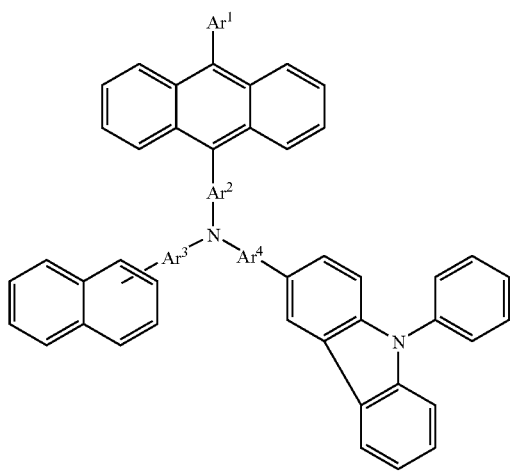

wherein Ar¹ represents a substituted or unsubstituted aryl group having 6 to 13 carbon atoms, and Ar², Ar³, and Ar⁴ each independently represent a para-phenylene group or a biphenyl-4,4'-diyl group.

3. The light-emitting device according to claim 1 further comprising:
a control circuit configured to control light emission from the light-emitting device.

4. The light-emitting device according to claim 2 further comprising:
a control circuit configured to control light emission from the light-emitting device.

5. The light-emitting device according to claim 1,
wherein the light-emitting device is a display portion incorporated in an electronic device, and
wherein the electronic device further comprises a control circuit configured to control light emission from the light-emitting device.

6. The light-emitting device according to claim 2,
wherein the light-emitting device is a display portion incorporated in an electronic device, and
wherein the electronic device further comprises a control circuit configured to control light emission from the light-emitting device.

7. The light-emitting device according to claim 1, wherein the light-emitting device is a lighting device.

8. The light-emitting device according to claim 2, wherein the light-emitting device is a lighting device.

* * * * *

UNITED STATES PATENT AND TRADEMARK OFFICE
CERTIFICATE OF CORRECTION

Page 1 of 2

PATENT NO. : 8,283,055 B2
APPLICATION NO. : 12/576031
DATED : October 9, 2012
INVENTOR(S) : Satoshi Seo et al.

It is certified that error appears in the above-identified patent and that said Letters Patent is hereby corrected as shown below:

In the Drawings:

FIG. 27: Change the placement of solid line in the legend box. Solid line is moved next to the text "Light-emitting."

FIG. 33: Change the placement of dashed line in the legend box. Dashed line is moved next to the text "Comparative."

FIG. 44, text "Light-emitting element 3" is wrapped to fit in the legend box.

In the Specification:

Column 1, line 24, "tight-emitting" should read "light-emitting"

Column 5, line 60, "show NMR charts of $^1$H NMR charts" should read "show $^1$H NMR charts"

Column 6, line 39, "clement" should read "element"

Column 7, line 28, "form a Spiro ring" should read "form a spiro ring"

Column 22, line 51, "CuPe" should read "CuPc"

Column 23, line 60, "(2-naphthyl)" should read "(1-naphthyl)"

Column 30, line 29, "clement" should read "element"

Column 30, line 39, "10-diylidi-4" should read "10-diyldi-4"

Signed and Sealed this
Nineteenth Day of February, 2013

Teresa Stanek Rea
*Acting Director of the United States Patent and Trademark Office*

CERTIFICATE OF CORRECTION (continued)
U.S. Pat. No. 8,283,055 B2

Column 44, line 1, "Cate" should read "Celite"

Column 49, line 59, "an Ag/Ag$^-$ electrode" should read "an Ag/Ag$^+$ electrode"

Column 55, line 10, "Balker" should read "Bruker"

Column 56, line 24, "FCBNBAPA" should read "PCBNBAPA"

Column 59, line 28, "element L" should read "element 1."

Column 65, line 32, "FCBNBAPA" should read "PCBNBAPA"

Column 65, line 41, "Layer 1201" should read "layer 1201"

Column 66, line 50, "shown in FIG. 34," should read "shown in FIG. 34."

Column 69, line 33, "yield of 81%," should read "yield of 81%."

Column 73, lines 34, "FIGS. 35A and 35B," should read "FIGS. 35A and 35B."

Column 74, line 2, "wavelength: 370 nm)" should read "wavelength: 370 nm)."

Column 74, line 51, "scanned from 0,60 V" should read "scanned from 0.60V"